(12) United States Patent
Tamura et al.

(10) Patent No.: US 10,523,219 B2
(45) Date of Patent: Dec. 31, 2019

(54) PHASE LOCKED LOOP AND CONTROL METHOD THEREFOR

(71) Applicant: SONY CORPORATION, Tokyo (JP)

(72) Inventors: Masahisa Tamura, Kanagawa (JP);
Shunsuke Sakazume, Kanagawa (JP);
Takeshi Matsubara, Kanagawa (JP);
Ken Yamamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/079,771

(22) PCT Filed: Feb. 20, 2017

(86) PCT No.: PCT/JP2017/006078
§ 371 (c)(1),
(2) Date: Aug. 24, 2018

(87) PCT Pub. No.: WO2017/150241
PCT Pub. Date: Sep. 8, 2017

(65) Prior Publication Data
US 2019/0068205 A1 Feb. 28, 2019

(30) Foreign Application Priority Data

Mar. 4, 2016 (JP) .................................. 2016-041698
Jul. 6, 2016 (JP) .................................. 2016-133963

(51) Int. Cl.
*H03L 7/00* (2006.01)
*H03L 7/093* (2006.01)
(Continued)

(52) U.S. Cl.
CPC .............. *H03L 7/093* (2013.01); *H03L 7/081* (2013.01); *H03L 7/0802* (2013.01); *H03L 7/085* (2013.01);
(Continued)

(58) Field of Classification Search
CPC . H03L 7/09; H03L 7/08; H03L 7/0802; H03L 7/081; H03L 7/0992; H03L 7/16;
(Continued)

(56) References Cited

U.S. PATENT DOCUMENTS

2007/0085570 A1 4/2007 Matsuta
2008/0042698 A1* 2/2008 Kim ...................... H03L 7/0812
                                                          327/116
(Continued)

FOREIGN PATENT DOCUMENTS

JP 2002-076886 A 3/2002
JP 2007-110370 A 4/2007
(Continued)

OTHER PUBLICATIONS

International Search Report and Written Opinion of PCT Application No. PCT/JP2017/006078, dated May 16, 2017, 09 pages of ISRWO.

*Primary Examiner* — Long Nguyen
(74) *Attorney, Agent, or Firm* — Chip Law Group

(57) ABSTRACT

The present technology relates to a phase locked loop and a control method therefor, which are capable of achieving low power consumption and good phase noise while suppressing the growth of circuit area. The phase locked loop includes: a digitally controlled oscillation unit that controls an oscillation frequency by a control signal in a digital format; a multiphase clock generation unit that generates clock signals with multiple phases synchronized with the digitally controlled oscillation unit; a clock selection unit that selects a selected clock signal out of the clock signals with multiple phases; a time-to-digital conversion unit that detects a time difference between the selected clock signal and a reference clock signal; a counter unit driven by any one clock signal out of the clock signals with multiple phases; a reference phase generation unit that generates a reference phase; a
(Continued)

phase comparison unit that compares feedback phase information obtained from an output value of the counter unit and an output value of the time-to-digital conversion unit with the reference phase; and a digital loop filter unit that smooths output of the phase comparison unit and generates the control signal for the digitally controlled oscillation unit.

13 Claims, 35 Drawing Sheets

(51) Int. Cl.
    *H03L 7/081*     (2006.01)
    *H03L 7/08*     (2006.01)
    *H03L 7/099*     (2006.01)
    *H03L 7/085*     (2006.01)

(52) U.S. Cl.
    CPC .......... *H03L 7/0992* (2013.01); *H03L 7/0995* (2013.01); *H03L 2207/50* (2013.01)

(58) Field of Classification Search
    CPC . H03L 7/183; H03L 5/08; H03L 5/132; H03L 5/135; H03L 7/0331; H03L 7/0891; H03L 7/18; H03L 7/0814; H03L 7/0817; G06F 1/04; G06F 1/10; H01H 9/56
    See application file for complete search history.

(56) References Cited

U.S. PATENT DOCUMENTS

| | | |
|---|---|---|
| 2008/0211589 A1 | 9/2008 | Sano |
| 2012/0063556 A1* | 3/2012 | Hoang .................... H03L 7/087 375/371 |
| 2012/0081339 A1 | 4/2012 | Mouri et al. |
| 2013/0335148 A1 | 12/2013 | Kousai et al. |

FOREIGN PATENT DOCUMENTS

| | | |
|---|---|---|
| JP | 2008-205730 A | 9/2008 |
| JP | 2012-049660 A | 3/2012 |
| JP | 2014-017804 A | 1/2014 |
| JP | 2015-154411 A | 8/2015 |
| JP | 2015-154444 A | 8/2015 |
| WO | 2010/143241 A1 | 12/2010 |

* cited by examiner

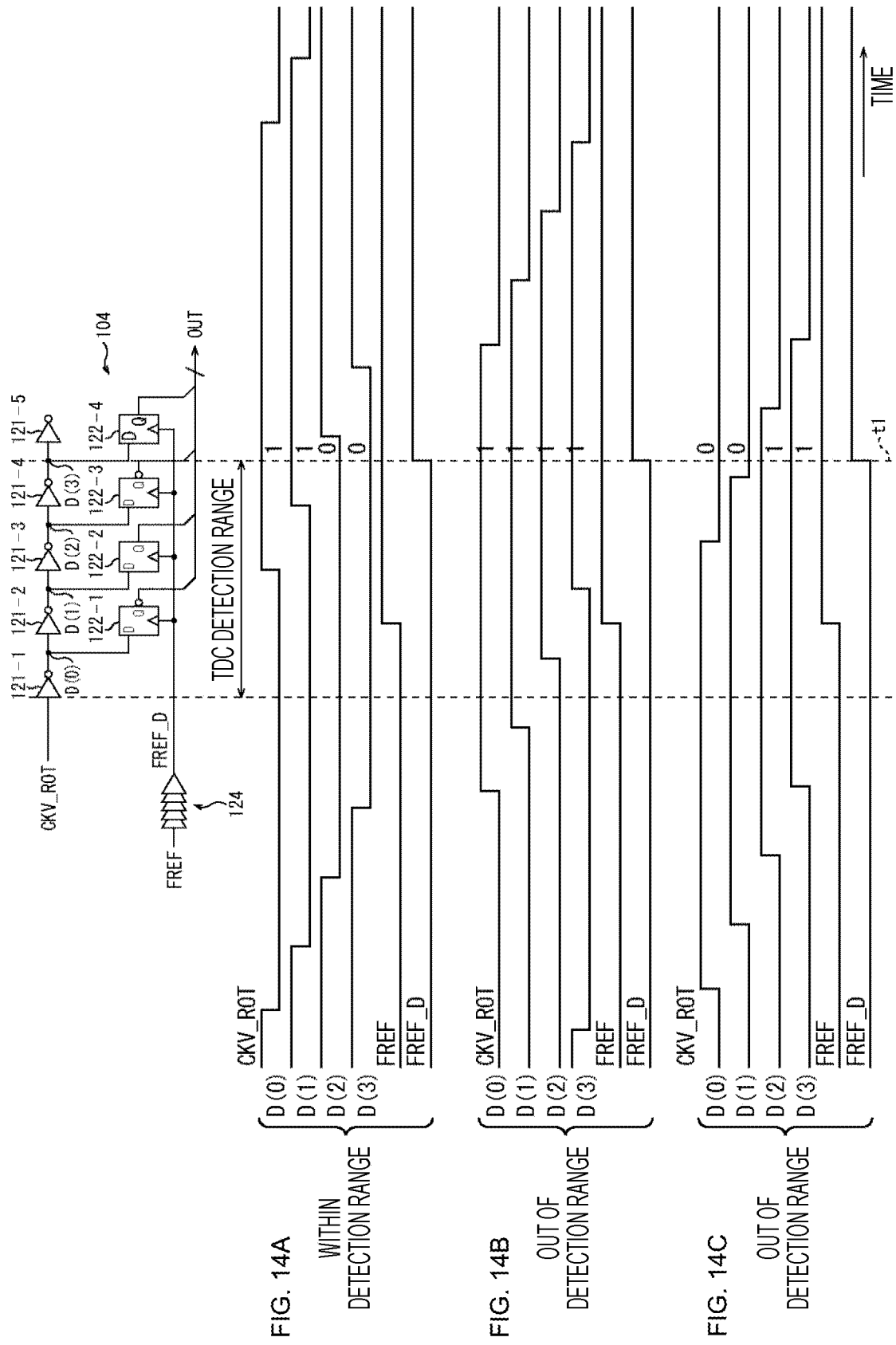

FIG. 19A Phase Error
FIG. 19B TDC output
FIG. 19C OFST
FIG. 19D TDC overflow
FIG. 19E TDC underflow

PHASE LOCKED LOOP AND CONTROL METHOD THEREFOR

CROSS REFERENCE TO RELATED APPLICATIONS

This application is a U.S. National Phase of International Patent Application No. PCT/JP2017/006078 filed on Feb. 20, 2017, which claims priority benefit of Japanese Patent Application No. JP 2016-041698 filed in the Japan Patent Office on Mar. 4, 2016 and also claims priority benefit of Japanese Patent Application No. JP 2016-133963 filed in the Japan Patent Office on Jul. 6, 2016. Each of the above-referenced applications is hereby incorporated herein by reference in its entirety.

TECHNICAL FIELD

The present technology relates to a phase locked loop and a control method therefor and more particularly to a phase locked loop and a control method therefor, which are capable of achieving low power consumption and good phase noise while suppressing the growth of circuit area.

BACKGROUND ART

In recent years, an all digital phase locked loop (ADPLL) circuit has been widely used for purposes such as clock generation in various types of large scale integration (LSI) and a local oscillator of a radio frequency (RF) system. Many of components of the ADPLL circuit are constituted by digital circuits and, as compared with an analog phase locked loop (PLL) using a conventional charge pump and a voltage controlled oscillator (VCO), the ADPLL circuit can attain high performance with a compact area and low power and is characterized by easy application to a minute process.

As a technology related to the ADPLL circuit, for example, Patent Document 1 and Patent Document 2 are disclosed. Both of these Patent Documents 1 and 2 use a configuration in which integer information (integer phase) of a feedback phase is obtained by a counter driven by a feedback clock signal and fractional information (fractional phase) finer than a feedback clock period is obtained by a time-to-digital converter (TDC) constituted by a delay line and a flip-flop (refer to FIGS. 1 and 5 of Patent Document 1 and FIG. 1 of Patent Document 2).

CITATION LIST

Patent Document

Patent Document 1: Japanese Patent Application Laid-Open No. 2002-76886 (U.S. Pat. No. 5,021,871)
Patent Document 2: Japanese Patent Application Laid-Open No. 2012-49660

SUMMARY OF THE INVENTION

Problems to be Solved by the Invention

Meanwhile, the time-to-digital converter (TDC) used in the ADPLL circuit needs to be prepared with a detection range that can cover one period of the feedback clock signal. If the detection range of the time-to-digital converter (TDC) is narrower than one period of the feedback clock signal, precise phase information cannot be detected and a large phase error occurs, which may lead to severe phase noise degradation.

However, in order to cover one period of the feedback clock signal, a delay line constituted by a large number of delay elements and a large number of flip-flops corresponding to the delay elements need to be prepared and it is difficult to reduce the circuit area and power consumption of the time-to-digital converter (TDC). In addition, a circuit configuration in which multistage delay elements are linked leads to deterioration of nonlinearity of the time-to-digital converter (TDC), especially integral nonlinearity (INL) of a property to be integrated. The deterioration of the INL of the time-to-digital converter (TDC) causes a fractional spurious (fractional-spur) occurring near an output frequency of the time-to-digital converter (TDC).

Furthermore, since the resolution of the time-to-digital converter (TDC) of above-mentioned Patent Documents 1 and 2 is defined by a propagation delay of the delay element, a quantization noise (TDC quantization noise) unfavorably becomes large. This TDC quantization noise has a uniform characteristic with respect to the frequency and the transfer function of the phase locked loop (PLL) for the TDC quantization noise has a low pass type characteristic, such that it is necessary to design a loop band to be narrow in order to diminish the contribution of the TDC quantization noise.

On the other hand, the transfer function of the phase locked loop (PLL) for a phase noise (DCO phase noise) of a digitally controlled oscillator (DCO) has a high pass type characteristic. Accordingly, if the loop band is designed to be narrow so as to lower the contribution of the TDC quantization noise, it is impossible to apply sufficient feedback to the DCO phase noise and thus it is necessary to design the DCO phase noise well. Therefore, there also is a disadvantage that it is difficult to reduce the power consumption of the digitally controlled oscillator (DCO).

Moreover, in order to lower the TDC quantization noise, it is necessary to enhance the resolution of the time-to-digital converter (TDC), but for that purpose, new disadvantages of increased circuit area and power consumption are involved.

The present technology has been made in view of such a situation and is intended to make it possible to achieve low power consumption and good phase noise while suppressing the growth of circuit area.

Solutions to Problems

A phase locked loop according to one aspect of the present technology is a phase locked loop including: a digitally controlled oscillation unit that controls an oscillation frequency by a control signal in a digital format; a multiphase clock generation unit that generates clock signals with multiple phases synchronized with the digitally controlled oscillation unit; a clock selection unit that selects any one clock signal out of the clock signals with multiple phases as a selected clock signal; a time-to-digital conversion unit that detects a time difference between the selected clock signal and a reference clock signal which is a clock signal serving as a reference; a counter unit driven by any one clock signal out of the clock signals with multiple phases; a reference phase generation unit that generates a reference phase; a phase comparison unit that compares feedback phase information obtained from an output value of the counter unit and an output value of the time-to-digital conversion unit with the reference phase; and a digital loop filter unit that smooths output of the phase comparison unit and generates the control signal for the digitally controlled oscillation unit.

Note that the phase locked loop according to one aspect of the present technology may be an independent device or an internal block constituting one device. In addition, a control method according to one aspect of the present technology is a control method corresponding to the above-described phase locked loop according to one aspect of the present technology.

In the phase locked loop and the control method therefor according to aspects of the present technology, the digitally controlled oscillation unit, the multiphase clock generation unit, the clock selection unit, the time-to-digital conversion unit, the counter unit, the reference phase generation unit, the phase comparison unit, and the digital loop filter unit are included. Then, the oscillation frequency of the digitally controlled oscillation unit is controlled by the control signal in a digital format, clock signals with multiple phases synchronized with the digitally controlled oscillation unit is generated, any one clock signal is selected out of the clock signals with multiple phases as the selected clock signal, a time difference between the selected clock signal and the reference clock signal which is a clock signal serving as a reference is detected, and the counter unit is driven by any one clock signal out of the clock signals with multiple phases. Furthermore, the feedback phase information obtained from the output value of the counter unit and the output value of the time-to-digital conversion unit is compared by the phase comparison unit with the reference phase generated by the reference phase generation unit; additionally, the output of the phase comparison unit is smoothed and the control signal for the digitally controlled oscillation unit is generated.

Effects of the Invention

According to one aspect of the present technology, low power consumption and good phase noise can be achieved while the growth of circuit area is suppressed.

Note that the effects described herein are not necessarily limited and any effects described in the present disclosure may be applied.

BRIEF DESCRIPTION OF DRAWINGS

FIGS. 14A, 14B, and 14C are timing charts illustrating the operation of the time-to-digital converter in FIG. 13.

FIGS. 19A, 19B, 19C, 19D, and 19E are diagrams illustrating a transient unlocked state at the time of updating an offset value.

MODE FOR CARRYING OUT THE INVENTION

Hereinafter, embodiments of the present technology will be described with reference to the drawings. Note that the description will be given in the following order.

1. First Embodiment: Basic Configuration
2. Second Embodiment: Configuration in case where Digitally Controlled Oscillator also Serves for Generation of Multiphase Clock Signal
3. Third Embodiment: Configuration in case of Correcting Output of Phase Comparator with Offset Value
4. Fourth Embodiment: Configuration in case of Correcting Reference Phase with Offset Value at time of Generation of Control Signal for Multiplexer
5. Fifth Embodiment: Configuration for Measuring Period using Lowering Edge of Reference Clock Signal
6. Sixth Embodiment: Configuration for Measuring Period utilizing Delay of Reference Clock Signal
7. Seventh Embodiment: Configuration for Measuring Period using Dedicated Time-to-Digital Converter
8. Eighth Embodiment: Configuration for Measuring Period utilizing Enable Signal
9. Modifications <1. First Embodiment>

(Configuration of Phase Locked Loop)

Figure 1:
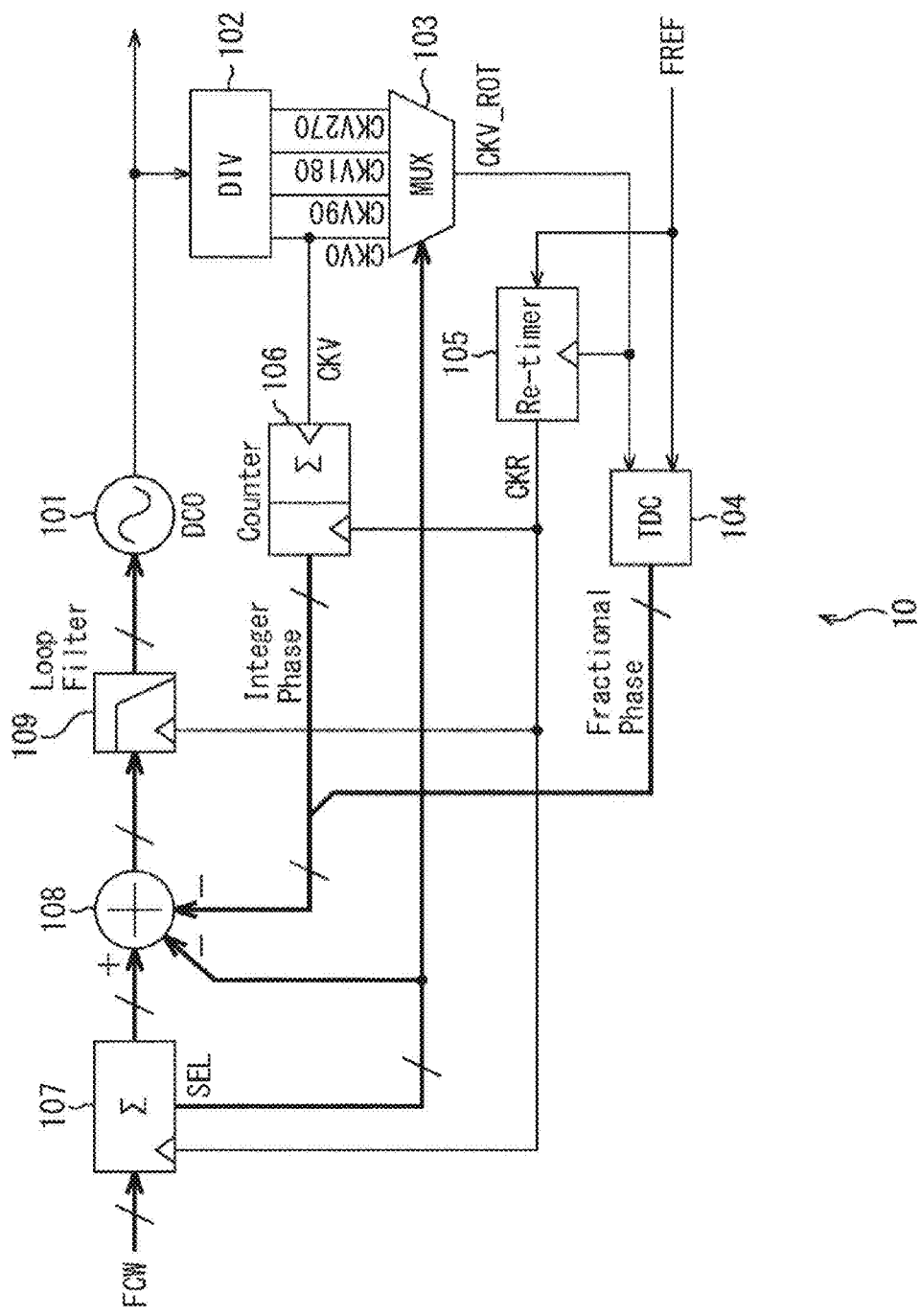
FIG. 1 is a diagram illustrating the configuration of a phase locked loop according to a first embodiment.

FIG. 1 is a diagram illustrating the configuration of a phase locked loop to which the present technology is applied according to an embodiment (first embodiment).

The phase locked loop 10 is an all digital phase locked loop (ADPLL) circuit and is used for a purpose such as clock generation in various types of LSI, a local oscillator of an RF system, and the like.

In FIG. 1, the phase locked loop 10 is constituted by a digitally controlled oscillator 101, a frequency divider 102, a multiplexer 103, a time-to-digital converter 104, a retiming circuit 105, a counter 106, a reference phase generation unit 107, a phase comparator 108, and a digital loop filter 109.

The digitally controlled oscillator (DCO) 101 outputs a clock signal with an oscillation frequency according to a control signal (control signal in a digital format) input from the digital loop filter 109. The clock signal output from the digitally controlled oscillator 101 is input to the frequency divider 102.

The frequency divider 102 divides the frequency of the clock signal output from the digitally controlled oscillator 101 and generates four-phase clock signals (CKV0, CKV90, CKV180, and CKV270) synchronized with the digitally controlled oscillator 101. The four-phase clock signals generated by the frequency divider 102 are input to the multiplexer 103. In addition, any one clock signal out of the four-phase clock signals generated by the frequency divider 102 is output to the counter 106.

In accordance with a control signal SEL input from the reference phase generation unit 107, the multiplexer 103 selects any one clock signal out of the four-phase clock signals (CKV0, CKV90, CKV180, and CKV270) input from the frequency divider 102. A selected clock signal CKV_ROT selected by the multiplexer 103 is output to the time-to-digital converter 104.

The selected clock signal CKV_ROT from the multiplexer 103 and a reference clock signal FREF which is a clock signal serving as a reference are input to the time-to-digital converter (TDC) 104. The time-to-digital converter 104 detects a time difference between the selected clock signal CKV_ROT and the reference clock signal FREF and outputs a fractional phase obtained from the detection to the phase comparator 108.

The selected clock signal CKV_ROT from the multiplexer 103 and the reference clock signal FREF are input to the retiming circuit 105. The retiming circuit 105 synchronizes the reference clock signal FREF with the selected clock signal CKV_ROT and outputs a synchronous clock signal CKR obtained by the synchronization to the counter 106, the reference phase generation unit 107, and the digital loop filter 109.

The counter 106 is driven by one clock signal CKV to be measured out of the four-phase clock signals (CKV0, CKV90, CKV180, and CKV270) generated by the frequency divider 102 and samples the value with the period of the synchronous clock signal CKR output from the retiming circuit 105 to output an integer phase obtained by the sampling to the phase comparator 108.

In accordance with the synchronous clock signal CKR output from the retiming circuit 105, the reference phase generation unit 107 accumulates the frequency division ratio frequency command word (FCW) input thereto to generate the reference phase and outputs the reference phase to the phase comparator 108. The reference phase generation unit 107 also generates the control signal SEL according to a fractional part of the reference phase to output to the multiplexer 103 and the phase comparator 108.

The fractional phase from the time-to-digital converter 104, the integer phase from the counter 106, and the reference phase from the reference phase generation unit 107 are input to the phase comparator 108. The phase comparator 108 compares fixed-point feedback phase information made up of the integer phase and the fractional phase with the reference phase and outputs a comparison result (phase error) obtained by the comparison to the digital loop filter 109. The control signal SEL from the reference phase generation unit 107 is also input to the phase comparator 108 such that a phase shift due to switching of the selected clock signal CKV_ROT by the multiplexer 103 is compensated.

The digital loop filter 109 smooths the output from the phase comparator 108 in accordance with the synchronous clock signal CKR output from the retiming circuit 105 and outputs a control signal (control signal in a digital format) obtained by the smoothing to the digitally controlled oscillator 101. The oscillation frequency of the digitally controlled oscillator 101 is controlled by this control signal.

The phase locked loop 10 is configured as described above.

(Configuration of Time-to-Digital Converter (TDC))

Figure 2:
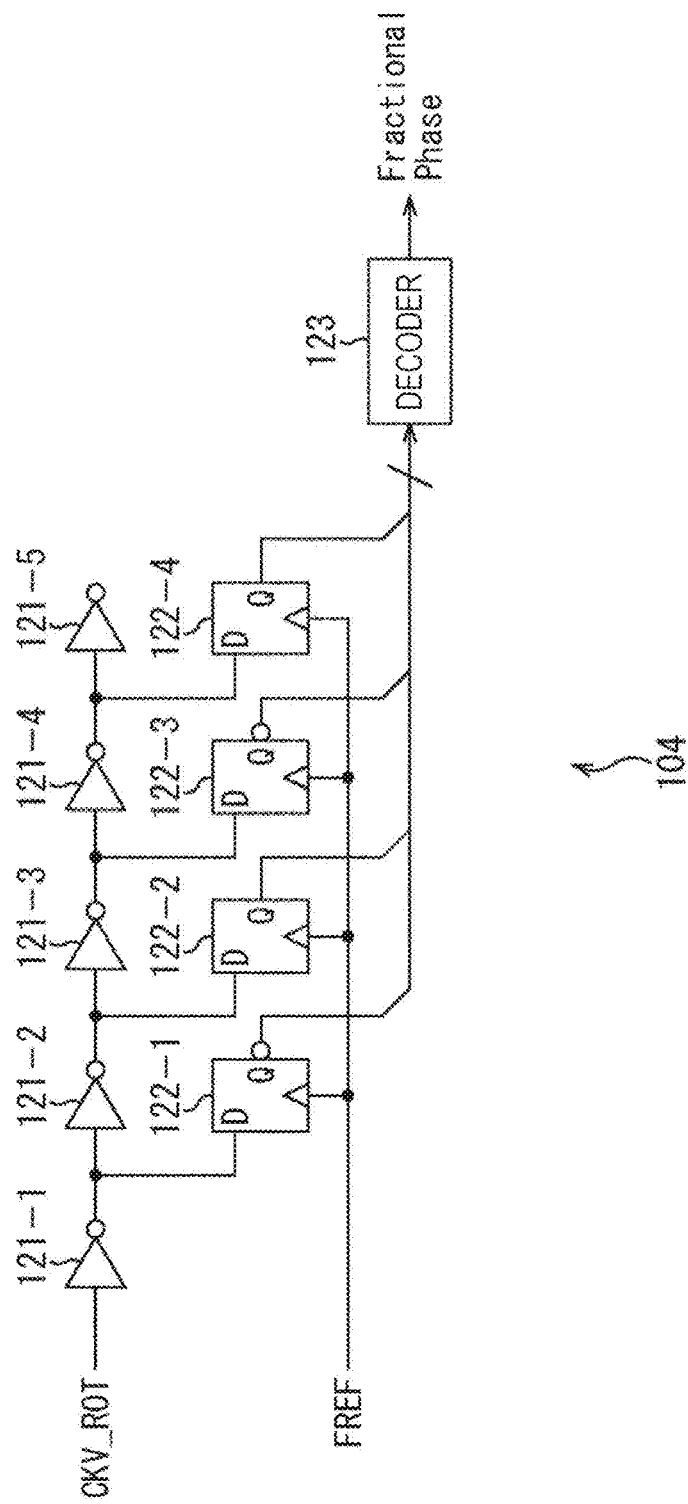
FIG. 2 is a diagram illustrating a configuration example of a time-to-digital converter in FIG. 1.

FIG. 2 is a diagram illustrating a configuration example of the time-to-digital converter 104 in FIG. 1.

In FIG. 2, the time-to-digital converter 104 is constituted by a delay line constituted by delay elements 121-1 to 121-5, flip-flops 122-1 to 122-4 that take in the state of the output of each stage of this delay line, and a decoder 123 that converts outputs of the flip-flops 122-1 to 122-4.

More specifically, the delay elements 121-1 to 121-5 constituting the delay line are constituted by inverters or the like and gradually delay the selected clock signal CKV_ROT input from the multiplexer 103. The selected clock signal CKV_ROT delayed by the delay elements 121-1 to 121-5 is input to the flip-flops 122-1 to 122-4.

The flip-flops 122-1 to 122-4 simultaneously sample the selected clock signal CKV_ROT gradually delayed by the delay elements 121-1 to 121-5 at the rising edge (or the falling edge) of the reference clock signal FREF input thereto. The flip-flops 122-1 to 122-4 output a phase difference (a difference between phases) between the selected clock signal CKV_ROT and the reference clock signal FREF obtained by the simultaneous sampling to the decoder 123.

The decoder 123 converts the output from the flip-flops 122-1 to 122-4 into an expression suitable for a process in the subsequent stage, such as a binary code. Then, the signal (output code) converted by the decoder 123 is output to the phase comparator 108 as a fractional phase.

Here, in FIG. 2, the delay of the delay elements 121-1 to 121-5 constituting the delay line depends on a semiconductor process to be manufactured, but in the case of the current state-of-the-art complementary metal oxide semiconductor (CMOS) process, usually is on the order of tens of picoseconds (ps). The detection range (of time) of the time-to-digital converter 104 that uses the delay line is restricted by the length of the delay line and, in the case of the time-to-digital converter 104 illustrated in FIG. 2, a time difference equivalent up to four stages of delay elements can be detected. For example, assuming that the delay per one stage of delay element is 30 ps, the detection range of the time-to-digital converter 104 illustrated in FIG. 2 is 120 ps at the maximum.

In general, in the phase locked loop (PLL) using the time-to-digital converter (TDC), since a phase (fractional phase) finer than the integer phase measured by a counter is measured by the time-to-digital converter (TDC), it is necessary for the time-to-digital converter (TDC) to have a length enough to measure one period of the clock signal CKV to be measured. For this reason, it has been difficult to achieve low power consumption and area saving in the time-to-digital converter (TDC). On the other hand, in the time-to-digital converter 104 in FIG. 2, the length is designed to be capable of measuring one quarter of one period of the clock signal CKV to be measured.

(Operation of Time-to-Digital Converter)

Figure 3:
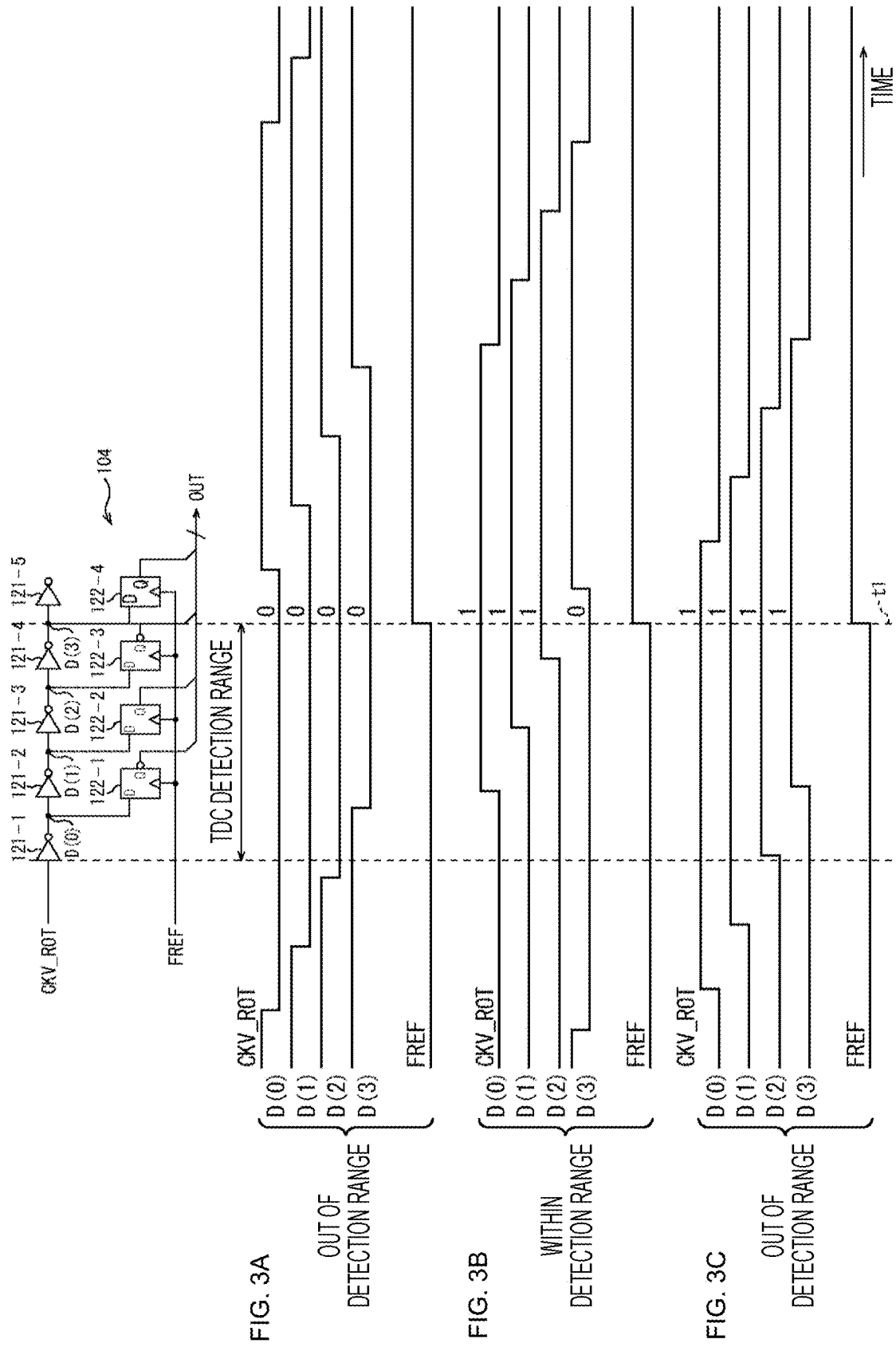
FIGS. 3A, 3B, and 3C are timing charts illustrating the operation of the time-to-digital converter in FIG. 1.

FIGS. 3A, 3B, and 3C are timing charts illustrating the operation of the time-to-digital converter 104 (FIG. 2) designed to have a length capable of measuring one quarter of one period of the clock signal CKV to be measured.

In FIGS. 3A, 3B, and 3C, in order to make the explanation easier to understand, in addition to a case where the phase difference between the selected clock signal CKV_ROT and the reference clock signal FREF falls within the detection range of the time-to-digital converter 104 (FIG. 2), a case where the phase difference falls outside the detection range is also depicted. However, in FIGS. 3A, 3B, and 3C, the detection range (of time) of the time-to-digital converter 104 (FIG. 2) is specified as a length equivalent to four stages of delay elements tracing back from the rising edge of the reference clock signal FREF ("TDC detection range" indicated by dotted lines in FIGS. 3A, 3B, and 3C).

(FIG. 3A) A case where the phase difference between CKV_ROT and FREF falls outside the detection range.

FIG. 3A illustrates a timing chart in a case where the phase difference between the selected clock signal CKV_ROT and the reference clock signal FREF falls outside the detection range of the time-to-digital converter 104 and cannot be detected.

In the time-to-digital converter 104, signals D(0) to D(3) obtained by gradually delaying the selected clock signal CKV_ROT input from the multiplexer 103 in the delay elements 121-1 to 121-5 are sampled by the flip-flops 122-1 to 122-4 at the same time at the rising edge of the reference clock signal FREF at time t1.

At this time, in FIG. 3A, since the rising edge of the selected clock signal CKV_ROT (signals D(0), D(1), D(2), and D(3)) is input later than the rising edge of the reference clock signal FREF, the outputs of the flip-flops 122-1 to 122-4 all become 0 ("0000") and the phase difference between the selected clock signal CKV_ROT and the reference clock signal FREF cannot be precisely detected.

(FIG. 3B) A case where the phase difference between CKV_ROT and FREF falls within the detection range FIG. 3B illustrates a timing chart in a case where the phase difference between the selected clock signal CKV_ROT and the reference clock signal FREF falls within the detection range of the time-to-digital converter 104 and can be detected.

In FIG. 3B, the rising edge of the selected clock signal CKV_ROT (signals D (0), D(1), and D(2)) is present within the TDC detection range of the time-to-digital converter 104 and a code of "1110" is output to the flip-flops 122-1 to 122-4 at the rising edge of the reference clock signal FREF at the time t1. Therefore, it is possible to detect a phase relationship between the selected clock signal CKV_ROT and the reference clock signal FREF by a change point of the output code from 1 to 0.

(FIG. 3C) A case where the phase difference between CKV_ROT and FREF falls outside the detection range FIG. 3C illustrates a timing chart in a case where the phase difference between the selected clock signal CKV_ROT and the reference clock signal FREF falls outside the detection range of the time-to-digital converter 104 and cannot be detected.

In FIG. 3C, since the rising edge of the selected clock signal CKV_ROT (signals D(0), D(1), D(2), and D(3)) is input earlier than the rising edge of the reference clock signal FREF, the outputs of the flip-flops 122-1 to 122-4 all become 1 ("1111") and the phase difference between the selected clock signal CKV_ROT and the reference clock signal FREF cannot be precisely detected.

As described above, since the time-to-digital converter 104 (FIG. 2) is designed to have a length capable of measuring one quarter of one period of the clock signal CKV to be measured, the detection range thereof (TDC detection range) is narrower than the detection range of a general time-to-digital converter (TDC). Therefore, it is necessary to control such that the phase relationship between the selected clock signal CKV_ROT and the reference clock signal FREF can be detected within the detection range (TDC detection range) of the time-to-digital converter 104 (FIG. 2) as illustrated in FIG. 3B.

Here, in the phase locked loop 10 illustrated in FIG. 1, the multiplexer 103 is controlled by the control signal SEL output from the reference phase generation unit 107. According to the present technology, in the multiplexer 103, the control signal SEL from the reference phase generation unit 107 is employed such that, among the four-phase clock signals (CKV0, CKV90, CKV180, and CKV270) generated by the frequency divider 102, a clock signal close to the reference clock signal FREF and located within the detection range (TDC detection range) of the time-to-digital converter 104 is selected as the selected clock signal CKV_ROT.

By performing such control, the phase relationship between the selected clock signal CKV_ROT and the reference clock signal FREF can be detected within the detection range (TDC detection range) of the time-to-digital converter 104.

Hereinafter, the control of the multiplexer 103 to select the selected clock signal CKV_ROT from the four-phase clock signals (CKV0, CKV90, CKV180, and CKV270) and the control of the time-to-digital converter 104 to detect the phase relationship between the selected clock signal CKV_ROT and the reference clock signal FREF will be described with reference to FIGS. 4A, 4B, 4C, 4D, and 4E. Note that the control signal SEL from the reference phase generation unit 107 is also input to the phase comparator 108 and used by the phase comparator 108 to compensate for a phase shift due to switching by the multiplexer 103.

(Phase Selection by Multiplexer)

FIGS. 4A, 4B, 4C, 4D, and 4E are timing charts illustrating an operation of phase selection by the multiplexer 103 in FIG. 1.

(FIG. 4A) A case where the fractional part of the reference phase is between 0 and 0.25

Figure 4:
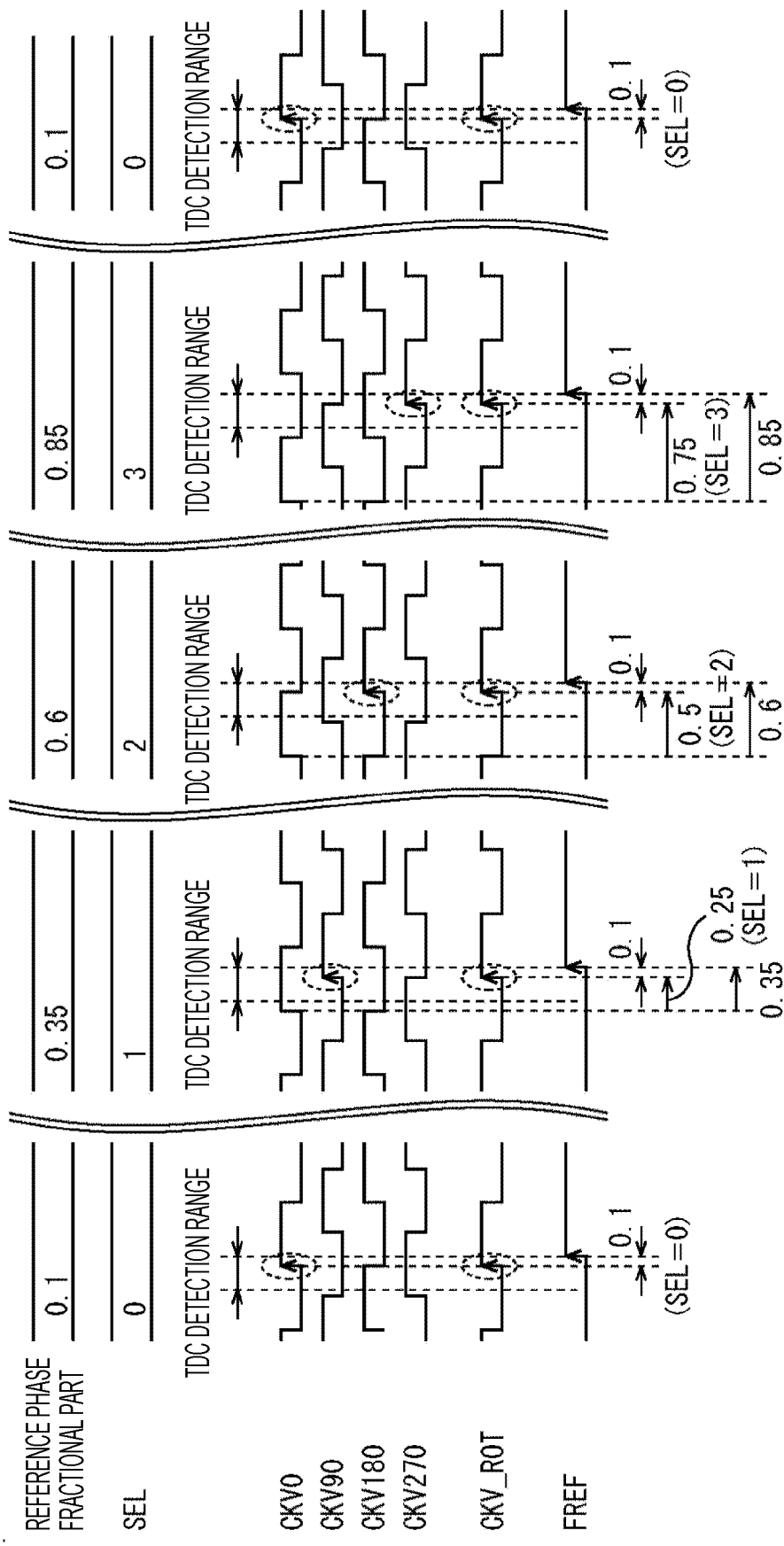
FIGS. 4A, 4B, 4C, 4D, and 4E are timing charts illustrating an operation of phase selection by a multiplexer in FIG. 1.

As an example of a case where the fractional part of the reference phase generated by the reference phase generation unit 107 is between 0 and 0.25, FIG. 4A illustrates a timing chart when the fractional part of the reference phase becomes 0.1.

In FIG. 4A, the control signal SEL to be input from the reference phase generation unit 107 to the multiplexer 103 is set to 0. Therefore, in the multiplexer 103, a 0-degree phase output CKV0 is selected out of the four-phase clock signals (CKV0, CKV90, CKV180, and CKV270) generated by the frequency divider 102 and output as the selected clock signal CKV_ROT.

At this time, the time-to-digital converter 104 detects the phase relationship between the selected clock signal CKV_ROT (0-degree phase output CKV0) and the reference clock signal FREF within the TDC detection range indicated by a range of dotted lines in FIGS. 4A, 4B, 4C, 4D, and 4E. Then, the time-to-digital converter 104 outputs 0.1, which is a detected difference between the fractional phases, to the phase comparator 108.

(FIG. 4B) A case where the fractional part of the reference phase is between 0.25 and 0.5

As an example of a case where the fractional part of the reference phase generated by the reference phase generation unit 107 is between 0.25 and 0.5, FIG. 4B illustrates a timing chart when the fractional part of the reference phase becomes 0.35.

In FIG. 4B, since the control signal SEL is set to 1 by the reference phase generation unit 107, in the multiplexer 103, a 90-degree phase output CKV90 is selected out of the four-phase clock signals (CKV0, CKV90, CKV180, and CKV270) and output as the selected clock signal CKV_ROT.

At this time, the time-to-digital converter 104 detects the phase relationship between the selected clock signal CKV_ROT (90-degree phase output CKV90) and the reference clock signal FREF within the TDC detection range, thereby outputting 0.1, which is a difference between the fractional phases, to the phase comparator 108.

Meanwhile, the control signal SEL (=1) set by the reference phase generation unit 107 is also input to the phase comparator 108 and the phase comparator 108 adds a correction amount obtained by multiplying the control signal SEL of 1 by 0.25 to the fractional phase difference (=0.1) from the time-to-digital converter 104. Then, the phase comparator 108 finds 0.35, which is a value obtained by correcting the fractional phase difference, as a final fractional phase.

(FIG. 4C) A case where the fractional part of the reference phase is between 0.5 and 0.75

As an example of a case where the fractional part of the reference phase generated by the reference phase generation unit 107 is between 0.5 and 0.75, FIG. 4C illustrates a timing chart when the fractional part of the reference phase becomes 0.6.

In FIG. 4C, since the control signal SEL is set to 2 by the reference phase generation unit 107, in the multiplexer 103, a 180-degree phase output CKV180 is selected out of the four-phase clock signals (CKV0, CKV90, CKV180, and CKV270) and output as the selected clock signal CKV_ROT.

At this time, the time-to-digital converter 104 detects the phase relationship between the selected clock signal CKV_ROT (180-degree phase output CKV180) and the reference clock signal FREF within the TDC detection range, thereby outputting 0.1, which is a difference between the fractional phases, to the phase comparator 108.

Meanwhile, the phase comparator 108 adds a correction amount (=0.5) obtained by multiplying the control signal SEL (=2) set by the reference phase generation unit 107 by 0.25 to the fractional phase difference (=0.1) from the time-to-digital converter 104. Then, the phase comparator 108 finds 0.6, which is a value obtained by correcting the fractional phase difference, as a final fractional phase.

(FIG. 4D) A case where the fractional part of the reference phase is between 0.75 and 1.0.

As an example of a case where the fractional part of the reference phase generated by the reference phase generation unit 107 is between 0.75 and 1.0, FIG. 4D illustrates a timing chart when the fractional part of the reference phase becomes 0.85.

In FIG. 4D, since the control signal SEL is set to 3 by the reference phase generation unit 107, in the multiplexer 103, a 270-degree phase output CKV270 is selected out of the four-phase clock signals (CKV0, CKV90, CKV180, and CKV270) and output as the selected clock signal CKV_ROT.

At this time, the time-to-digital converter 104 detects the phase relationship between the selected clock signal CKV_ROT (270-degree phase output CKV270) and the reference clock signal FREF within the TDC detection range, thereby outputting 0.1, which is a difference between the fractional phases, to the phase comparator 108.

Meanwhile, the phase comparator 108 adds a correction amount (=0.75) obtained by multiplying the control signal SEL (=3) set by the reference phase generation unit 107 by 0.25 to the fractional phase difference (=0.1) from the time-to-digital converter 104. Then, the phase comparator 108 finds 0.85, which is a value obtained by correcting the fractional phase difference, as a final fractional phase.

(FIG. 4E) A case where the fractional part of the reference phase is between 0 and 0.25

As an example of a case where the fractional part of the reference phase generated by the reference phase generation unit 107 is between 0 and 0.25, FIG. 4E illustrates a timing chart when the fractional part of the reference phase becomes 0.1, as FIG. 4A.

That is, as described above, in the operation of phase selection by the multiplexer 103, different control signals SEL (0, 1, 2, and 3) are set for respective ranges (0 to 0.25, 0.25 to 0.5, 0.5 to 0.75, and 0.75 to 1.0) obtained by dividing the range (0 to 1.0) of the fractional part of the reference phase into four ranges by 0.25 and one clock signal (CKV_ROT) is selected out of the four-phase clock signals (CKV0, CKV90, CKV180, and CKV270) according to one of these control signals SEL. In this configuration, this range of the fractional part made up of the four-divided ranges is regarded as one period and a similar operation of phase selection is repeated thereafter.

As described thus far, in the phase locked loop 10 (FIG. 1), the multiplexer 103 selects a phase close to the reference clock signal FREF out of the four-phase clock signals (CKV0, CKV90, CKV180, and CKV270) generated by the frequency divider 102, whereby it is possible to configure a phase locked loop (ADPLL circuit) using the time-to-digital converter 104 having a detection range of one quarter of one period of the clock signal CKV to be measured.

With this configuration, the time-to-digital converter 104 having a narrow detection range (TDC detection range) because of a shortened delay line can be used in the phase locked loop 10 (FIG. 1) and thus the circuit area and power consumption of the time-to-digital converter 104 can be reduced. In addition, since the detection range of the time-to-digital converter 104 is narrow, it is possible to attain high resolution of the time-to-digital converter 104 while suppressing the growth of the circuit area and power consumption thereof.

(Other Configurations of Time-to-Digital Converter (TDC))

Incidentally, the resolution of the time-to-digital converter 104 illustrated in FIG. 1 is defined by the delay of the delay elements 121 (FIG. 2) used in the delay line, which produces a quantization noise in the phase detection. In order to mitigate the contribution of the quantization noise (TDC quantization noise) of the time-to-digital converter 104 in the loop design of the phase locked loop (PLL), it is preferable to use the time-to-digital converter 104 with higher resolution.

Here, with reference to FIGS. 5 and 6, a two-step time-to-digital converter 104 capable of attaining higher resolution will be described as the time-to-digital converter 104 used in the phase locked loop 10 (FIG. 1).

Figure 5:
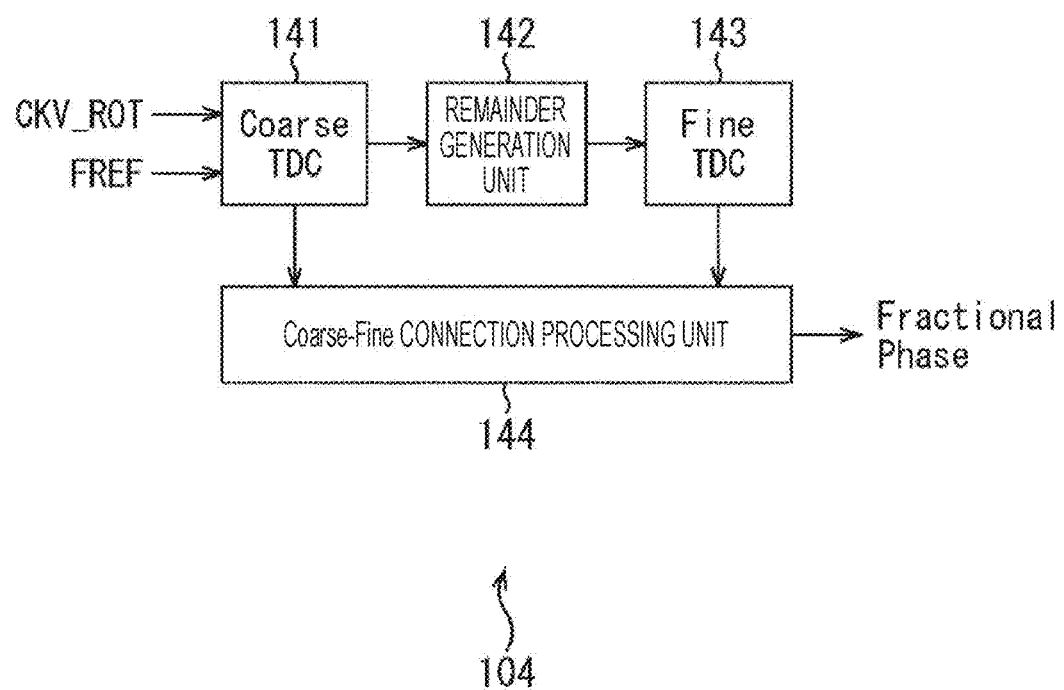
FIG. 5 is a diagram illustrating a configuration example of a two-step time-to-digital converter.

The time-to-digital converter 104 in FIG. 5 is constituted by a Coarse TDC 141, a remainder generation unit 142, a Fine TDC 143, and a Coarse-Fine connection processing unit 144.

The selected clock signal CKV_ROT and the reference clock signal FREF are input to the Coarse TDC 141. The Coarse TDC 141 is a time-to-digital converter (TDC) that roughly detects the phase difference between the selected clock signal CKV_ROT and the reference clock signal FREF with the delay of the delay element as a unit. The Coarse TDC 141 outputs a result of the detection to the remainder generation unit 142 and the Coarse-Fine connection processing unit 144.

The remainder generation unit 142 generates a remainder phase difference with respect to the detection result (quantization step) from the Coarse TDC 141 to output to the Fine TDC 143.

The Fine TDC 143 is a time-to-digital converter (TDC) capable of detecting a phase difference with high resolution as compared with the Coarse TDC 141. The Fine TDC 143 detects the remainder phase difference from the remainder generation unit 142 with high resolution and outputs a result of the detection to the Coarse-Fine connection processing unit 144. Note that, for example, Vernier-TDC can be used as this Fine TDC 143. In the Vernier-TDC, two input signals are individually input to separate delay lines and the phase difference is detected with high resolution by utilizing a difference between two types of delay obtained from the separate delay lines.

The detection results (output codes) are input from the Coarse TDC 141 and the Fine TDC 143 to the Coarse-Fine connection processing unit 144. The Coarse-Fine connection processing unit 144 generates and outputs a final output code (fractional phase) by combining the output code from the Coarse TDC 141 and the output code from the Fine TDC 143.

Figure 6:
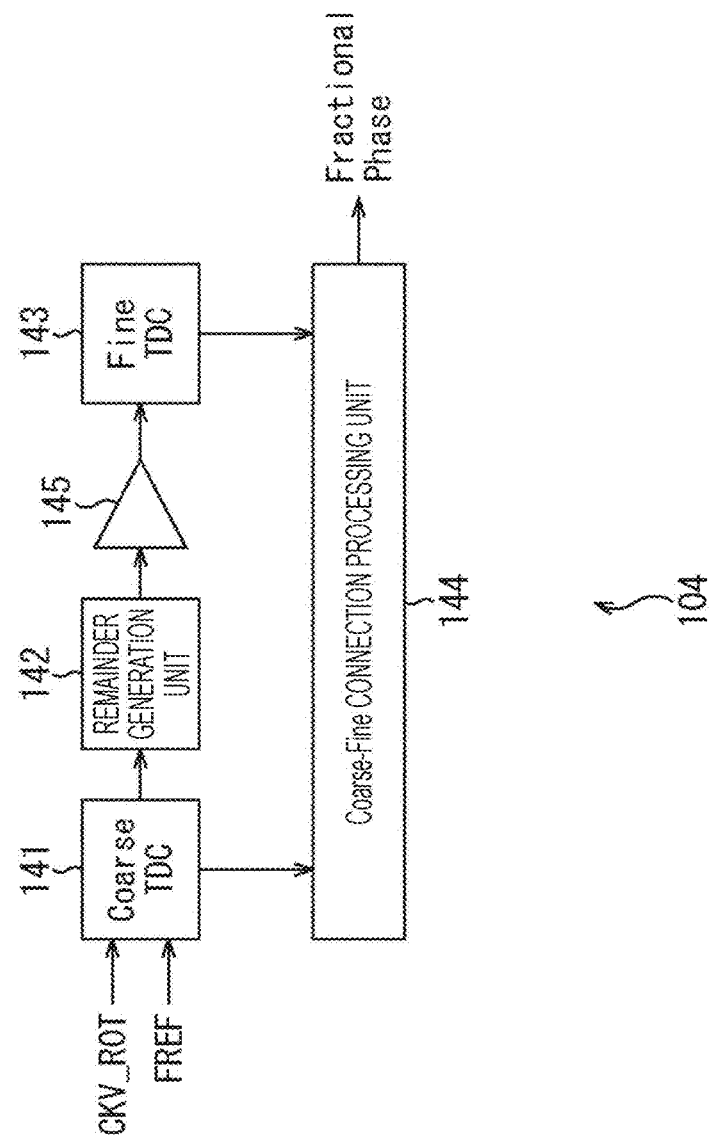
FIG. 6 is a diagram illustrating a configuration example of a two-step time-to-digital converter.

The time-to-digital converter 104 in FIG. 6 differs from the time-to-digital converter 104 in FIG. 5 in that a time amplifier 145 is provided between the remainder generation unit 142 and the Fine TDC 143. The time amplifier 145 amplifies the remainder phase difference from the remainder generation unit 142 to output to the Fine TDC 143. The Fine TDC 143 detects the remainder phase difference from the time amplifier 145 with high resolution but, since this remainder phase difference is amplified by the time amplifier 145, high resolution can be attained even if the Fine TDC 143 has the resolution to the same extent as the resolution of the Coarse TDC 141.

As described above, when the two-step time-to-digital converter 104 (FIGS. 5 and 6) is used in the phase locked loop 10 (FIG. 1), higher resolution can be attained and, as a result, the contribution of the quantization noise (TDC quantization noise) of the time-to-digital converter 104 can be mitigated in the loop design of the phase locked loop 10 (FIG. 1).

Note that the two-step time-to-digital converter 104 has been described here in order to attain high resolution in the time-to-digital converter 104, but the time-to-digital converter 104 that attains high resolution is not limited thereto. For example, high resolution of the time-to-digital converter 104 may be attained by another technique such as a pipeline technique.

(Loop Design Example of PLL)

Next, a loop design example of the phase locked loop 10 having the two-step time-to-digital converter 104 will be described with reference to FIGS. 7 to 10.

Figure 7:
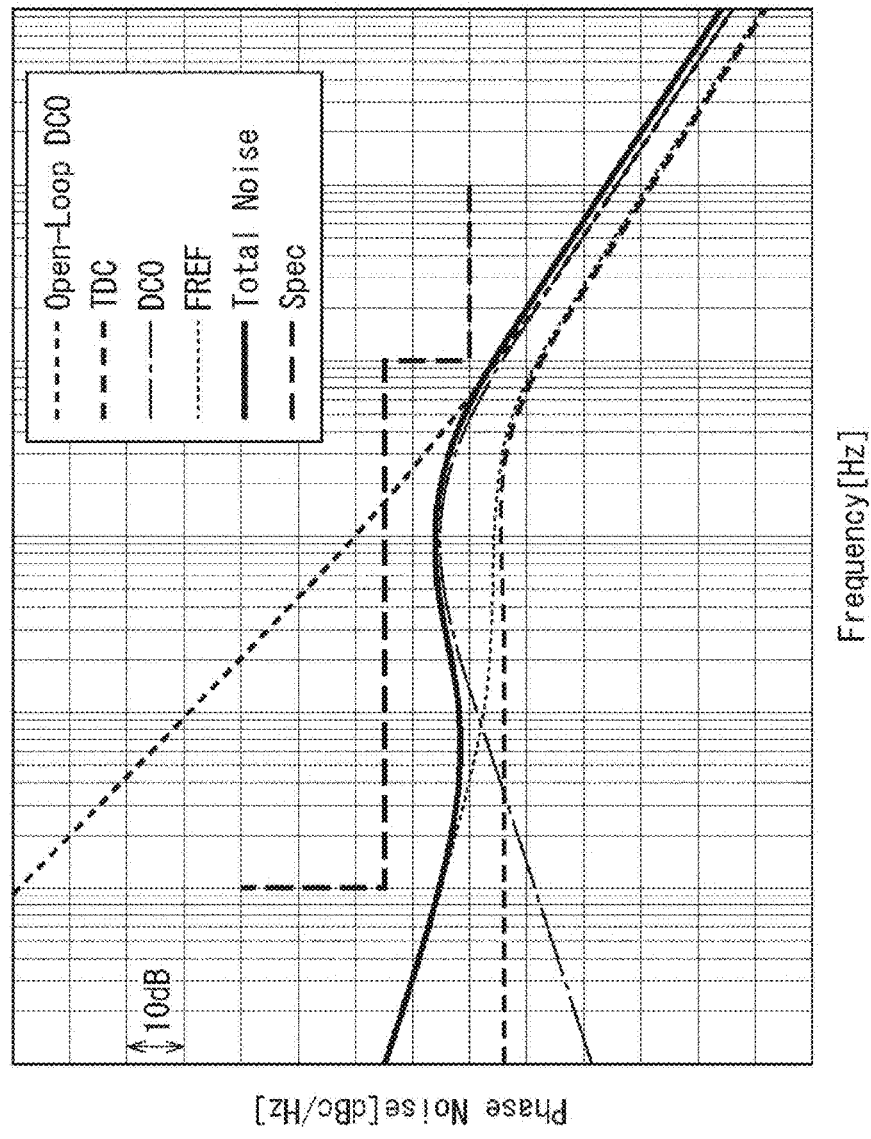
FIG. 7 is a diagram illustrating a loop design example of a PLL according to the present technology.

FIG. 7 is a diagram illustrating a loop design example of the PLL (ADPLL) according to the present technology. In FIG. 7, the horizontal axis represents the frequency (Hz) and the vertical axis represents the phase noise (dBc/Hz)

In FIG. 7, in addition to the characteristics of the digitally controlled oscillator (DCO) 101 and the time-to-digital converter (TDC) 104 of the phase locked loop 10 (FIG. 1), the loop design example according to the present technology is illustrated with the reference clock signal FREF, the total noise amount (Total Noise), and the like.

Figure 8:
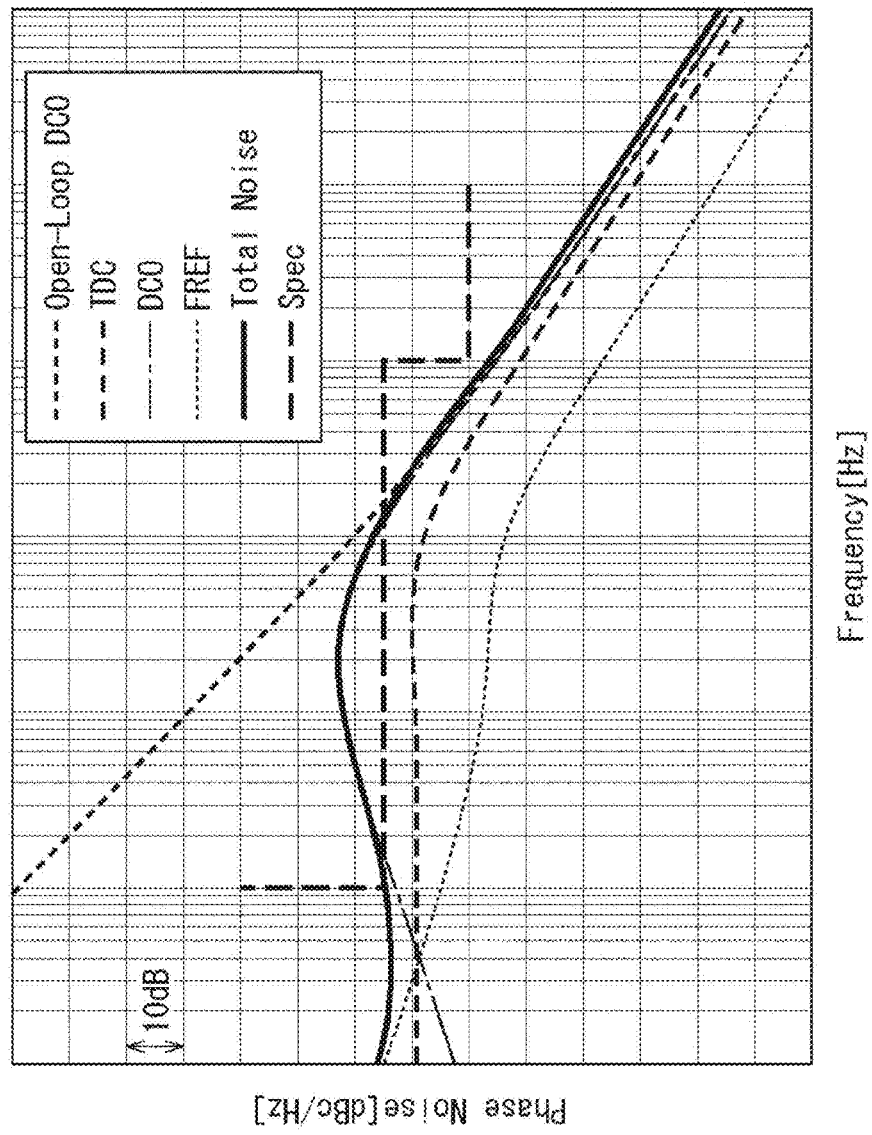
FIG. 8 is a diagram illustrating a loop design example of a conventional PLL (when a narrowband is set).
Figure 9:
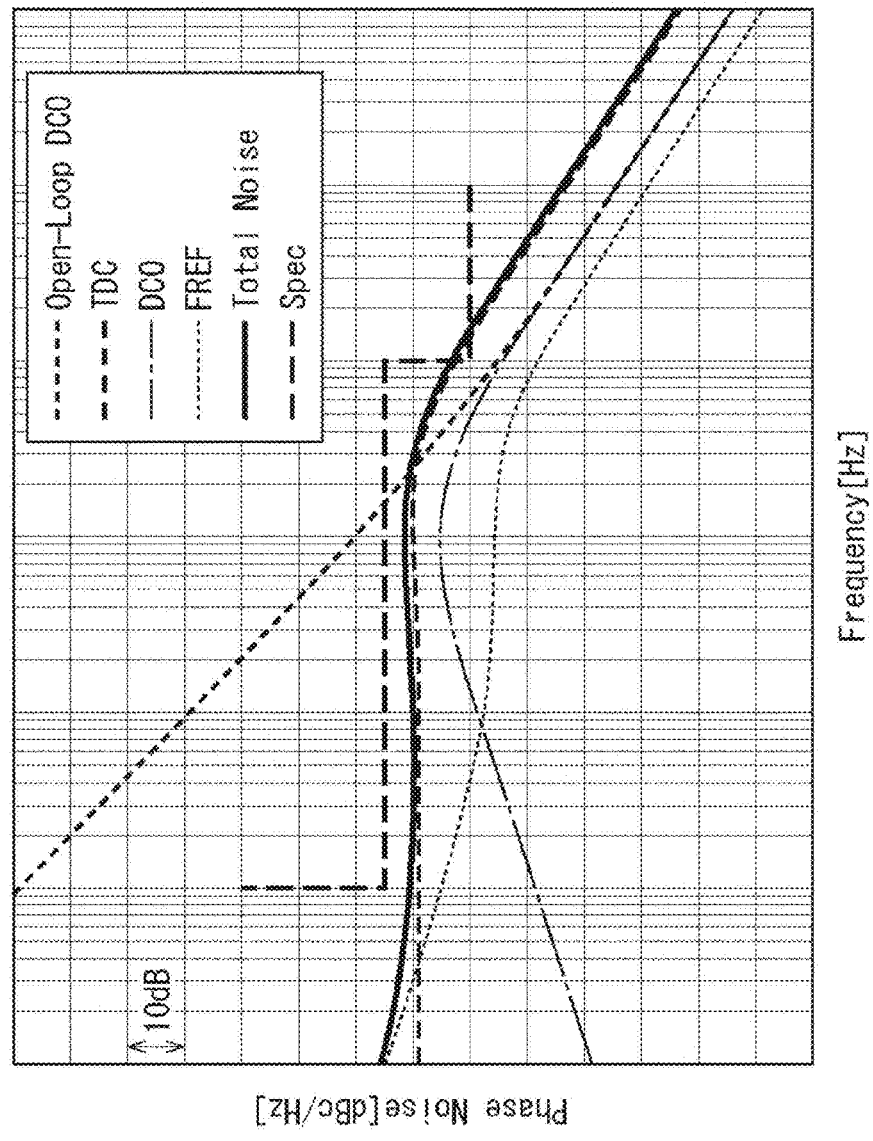
FIG. 9 is a diagram illustrating a loop design example of a conventional PLL (when a broadband is set).
Figure 10:
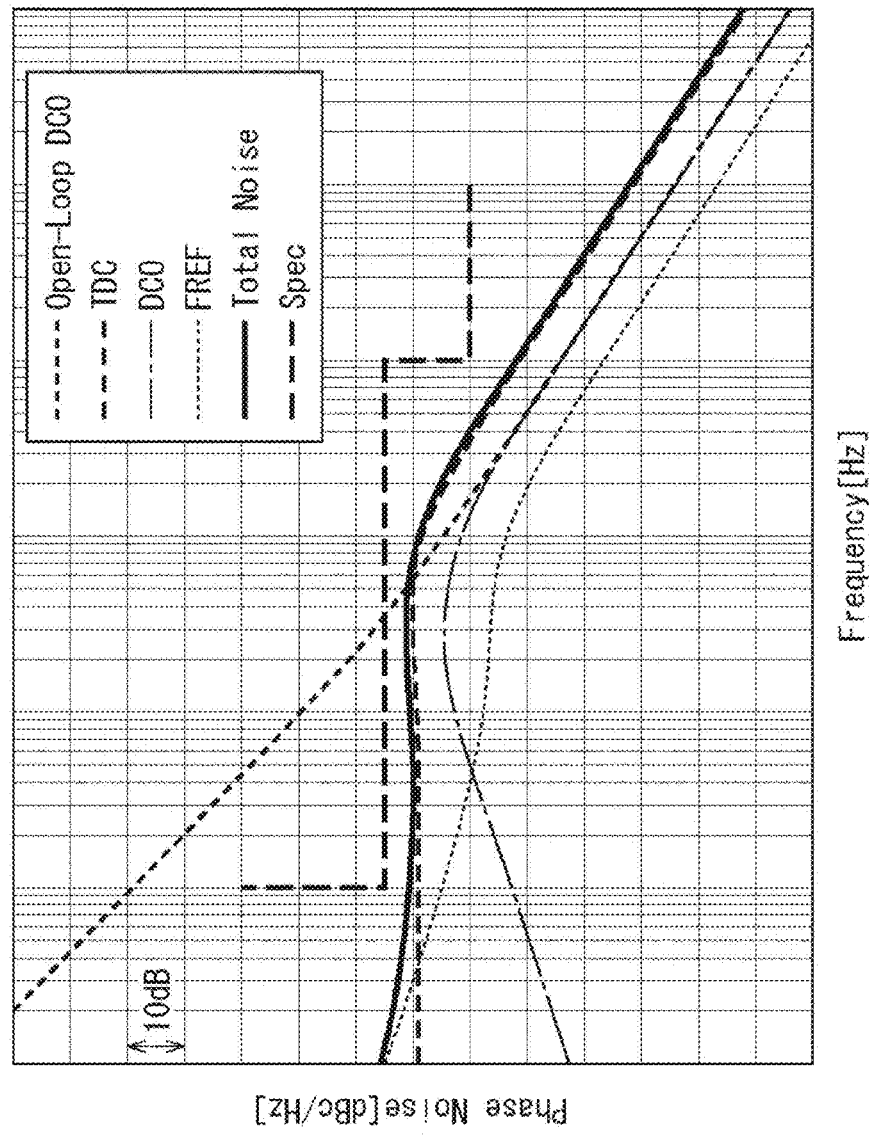
FIG. 10 is a diagram illustrating a loop design example of a conventional PLL (when a DCO is improved).

For comparison here, FIGS. 8 to 10 illustrate loop design examples of a conventional PLL (ADPLL).

FIG. 8 illustrates a loop design in a case where the loop is set to a narrowband in order to diminish the contribution of the phase noise (TDC phase noise) of the time-to-digital converter (TDC). In this loop design in FIG. 8, while out-of-band specifications are satisfactory, sufficient feedback cannot be applied to an amount owing to the contribution of the digitally controlled oscillator (DCO) in the narrowband loop and in-band specifications are not satisfactory.

FIG. 9 illustrates a loop design in a case where the loop is set to a broadband in order to apply sufficient feedback to the digitally controlled oscillator (DCO). In this loop design in FIG. 9, while an amount owing to the contribution of the digitally controlled oscillator (DCO) is repressed and in-band specifications are satisfactory, the phase noise (TDC phase noise) of the time-to-digital converter (TDC) extends to a higher region and thus out-of-band specifications are not satisfactory.

FIG. 10 illustrates a loop design in a case where the phase noise (DCO phase noise) of the digitally controlled oscillator (DCO) is improved and the loop is set to a narrowband. In this loop design in FIG. 10, although both the in-band and out-of-band specifications are satisfactory, the phase noise (DCO phase noise) of the digitally controlled oscillator (DCO) needs to be improved by about 10 dB to 20 dB as compared with the case of the above-described loop designs in FIGS. 8 and 9, which results in the growth of power consumption.

Returning to the explanation of FIG. 7, while the same characteristics as those indicated by the above-described loop designs in FIGS. 8 and 9 are used for the phase noise (DCO phase noise) of the digitally controlled oscillator 101 in the loop design example in FIG. 7, since an amount owing to the contribution of the time-to-digital converter 104 is diminished, the loop can be set to a broadband and the phase noise (DCO phase noise) of the digitally controlled oscillator 101 can be sufficiently restrained. As a result, good characteristics satisfying both the in-band and out-of-band specifications can be obtained.

That is, in the phase locked loop 10 (FIG. 1) to which the loop design in FIG. 7 is applied, since the contribution of the phase noise (TDC phase noise) of the time-to-digital converter 104 is small, it is possible to set the loop to a broadband and apply sufficient feedback to the digitally controlled oscillator 101, so as to sufficiently restrain the phase noise (DCO phase noise) of the digitally controlled oscillator 101. Therefore, in the phase locked loop 10 (FIG. 1), the digitally controlled oscillator 101 can be designed with low power consumption.

As described above, the time-to-digital converter 104 having a narrow detection range because of a shortened delay line can be used in the phase locked loop 10 (FIG. 1) of the first embodiment and thus the circuit area and power consumption of the time-to-digital converter 104 can be reduced.

In addition, in the phase locked loop 10, since the detection range of the time-to-digital converter 104 is narrow, it is possible to attain high resolution and lower the quantization noise in the time-to-digital converter 104 while suppressing the growth of the circuit area and power consumption thereof.

Additionally, the loop band can be designed widely because of a lowered quantization noise of the time-to-digital converter 104, whereby the phase noise of the digitally controlled oscillator 101 can be restrained. Therefore, the requirement for the phase noise of the digitally controlled oscillator 101 can be relaxed and low power consumption can be attained in the digitally controlled oscillator 101.

That is, the phase locked loop 10 can achieve low power consumption and good phase noise while suppressing the growth of circuit area. In addition, in the time-to-digital converter 104 of the phase locked loop 10, the delay line constituted by the plurality of delay elements 121 can be shortened, such that degradation of integral nonlinearity (INL) of the time-to-digital converter 104 can be restrained.

Note that, since the phase locked loop 10 has the configuration as described above, in the phase locked loop 10, the oscillation period of the digitally controlled oscillator 101 can be made longer than a value obtained by dividing a range of detection (of time) by the time-to-digital converter 104 by the frequency division ratio of the frequency divider 102. The time-to-digital converter 104 also can be enabled to have a finer resolution than the propagation delay of a logic gate.

<2. Second Embodiment>
(Configuration of Phase Locked Loop)

Figure 11:
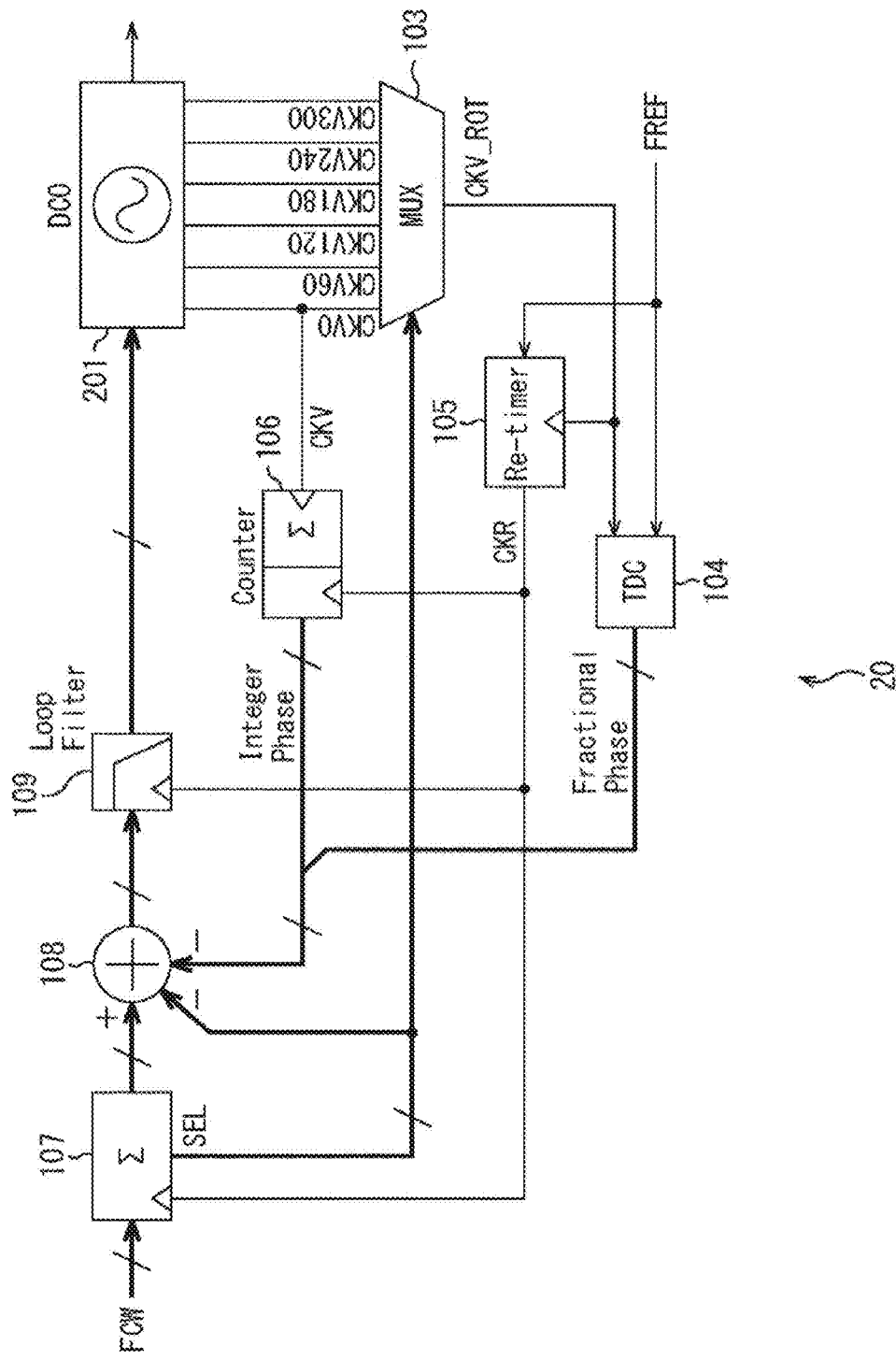
FIG. 11 is a diagram illustrating a configuration example of a phase locked loop according to a second embodiment.

FIG. 11 is a diagram illustrating the configuration of a phase locked loop to which the present technology is applied according to an embodiment (second embodiment).

In FIG. 11, a phase locked loop 20 is constituted by a digitally controlled oscillator 201, a multiplexer 103, a time-to-digital converter 104, a retiming circuit 105, a counter 106, a reference phase generation unit 107, a phase comparator 108, and a digital loop filter 109.

That is, the phase locked loop 20 in FIG. 11 differs from the phase locked loop 10 in FIG. 1 in that the frequency divider 102 is removed and the digitally controlled oscillator 201 is provided instead of the digitally controlled oscillator 101.

The digitally controlled oscillator 201 generates six-phase clock signals (CKV0, CKV60, CKV120, CKV180, CKV240, and CKV300) in accordance with a control signal (control signal in a digital format) from the digital loop filter 109 to output to the multiplexer 103.

Figure 12:
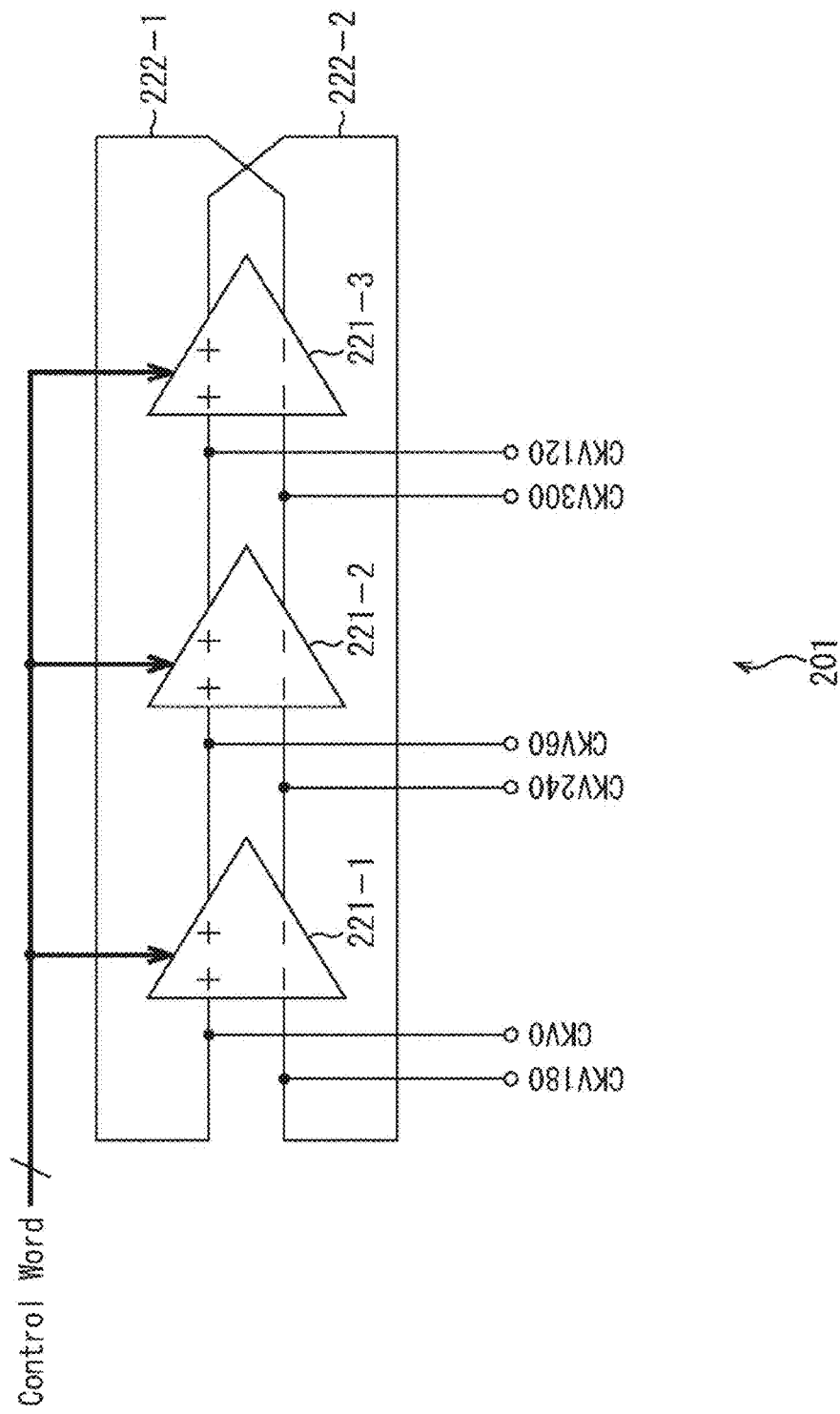
FIG. 12 is a diagram illustrating a configuration example of a digitally controlled oscillator in FIG. 11.

FIG. 12 depicts the detailed configuration of the digitally controlled oscillator 201. In the digitally controlled oscillator 201 in FIG. 12, a three-stage ring oscillator having oscillation rings 222-1 and 222-2 is formed by differential amplifiers 221-1 to 221-3 linked in a ring shape.

In this ring oscillator, by inputting a control word to the differential amplifiers 221-1 to 221-3, the output of each stage is taken out, such that the six-phase clock signals (CKV0, CKV60, CKV120, CKV180, CKV240, and CKV300) can be output.

Note that the ring oscillator illustrated in FIG. 12 is an example of a configuration for generating clock signals with multiple phases and a configuration different from the configuration illustrated in FIG. 12 may be adopted to generate clock signals with a desired number of phases by changing the number of stages. For example, it is also possible to generate clock signals with multiple phases using a plurality of LC oscillators by connecting the LC oscillators with each other and this configuration can be applied.

Returning to the explanation of FIG. 11, in accordance with a control signal SEL input from the reference phase generation unit 107, the multiplexer 103 selects any one clock signal out of the six-phase clock signals (CKV0, CKV60, CKV120, CKV180, CKV240, and CKV300) input from the digitally controlled oscillator 201. A selected clock signal CKV_ROT selected by the multiplexer 103 is output to the time-to-digital converter 104.

Note that, in the phase locked loop 20 in FIG. 11, the same parts as those of the phase locked loop 10 in FIG. 1 are denoted by the same reference numerals and the description thereof will be omitted. However, in the phase locked loop 20 in FIG. 11, six-phase clock signals are generated and the selected clock signal CKV_ROT is selected from among these clock signals, such that the time-to-digital converter 104 is designed to have a length capable of measuring one sixth of one period of the clock signal CKV to be measured.

The phase locked loop 20 is configured as described above.

As described above, in the phase locked loop 20 (FIG. 11) of the second embodiment, clock signals with multiple phases can be generated by the digitally controlled oscillator 201 that controls the oscillation frequency by the control signal in a digital format.

Note that, although the first embodiment has described the four-phase clock signals (CKV0, CKV90, CKV180, and CKV270) and the second embodiment has described the six-phase clock signals (CKV0, CKV60, CKV120, CKV180, CKV240, and CKV300) as the clock signals input to the multiplexer 103, the four phases and six phases are examples of the number of phases of the clock signals and clock signals with another number of phases may be used as long as the clock signals have multiple phases.

However, in the time-to-digital converter 104, as the clock signals have a larger number of phases, the delay line constituted by the plurality of delay elements 121 can be shortened and the circuit area and power consumption can be reduced. In addition, shortening this delay line also leads to restraining degradation of integral nonlinearity (INL) of the time-to-digital converter 104.

Furthermore, since the phase locked loop 20 has the configuration as described above, in the phase locked loop 20, the oscillation period of the digitally controlled oscillator 201 can be made longer than a range of detection (of time) by the time-to-digital converter 104.

<3. Third Embodiment>

Incidentally, according to the above-described timing chart illustrated in FIGS. 3A, 3B, and 3C, the detection range (TDC detection range) of the time-to-digital converter 104 has a length equivalent to four stages of delay elements tracing back from the rising edge of the reference clock signal FREF. Here, when the edges of the selected clock signal CKV_ROT and the reference clock signal FREF are out of the detection range of the time-to-digital converter 104 in a case where the measurable length of the time-to-digital converter 104 is shorter than one period of the clock signal CKV to be measured, a precise phase cannot be detected and good performance cannot be obtained in some cases.

In addition, in the above-described time-to-digital converter 104 (a core circuit thereof) illustrated in FIG. 2, since the two input clock signals, namely, the selected clock signal CKV_ROT and the reference clock signal FREF, arrive at the time-to-digital converter 104 (the core circuit thereof) through many buffers (various delays), the phases of the both are offset.

Figure 13:
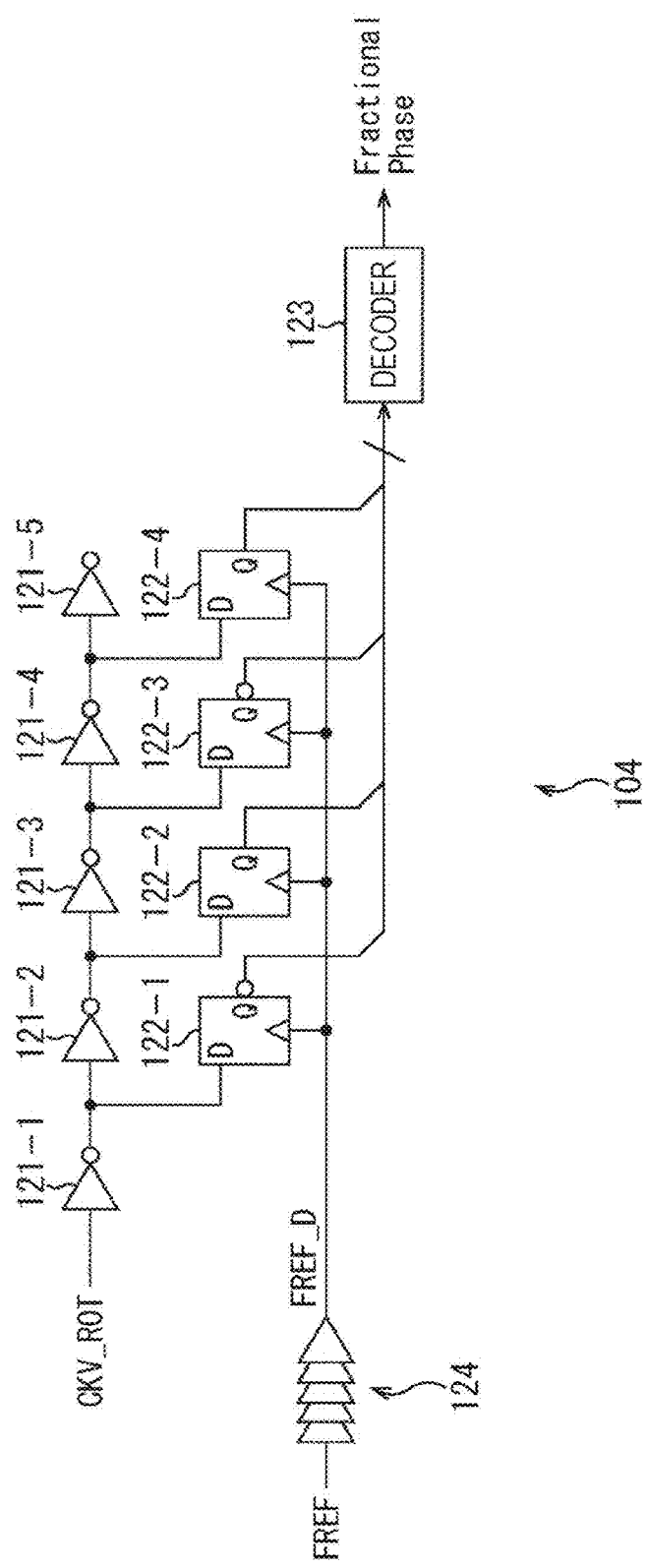
FIG. 13 is a diagram illustrating a configuration example of a time-to-digital converter.

FIG. 13 depicts the configuration of the time-to-digital converter 104 (the core circuit thereof) to which two offset input clock signals are to be input. In the time-to-digital converter 104 (the core circuit thereof), the reference clock signal FREF is input as a delayed reference clock signal FREF_D by passing through many buffers 124 (various delays). That is, in the time-to-digital converter 104 (the core circuit thereof), the phases of the selected clock signal CKV_ROT and the delayed reference clock signal FREF_D are offset.

Note that, in the time-to-digital converter 104, it is also assumed that the selected clock signal CKV_ROT is delayed instead of the reference clock signal FREF, but this case can be considered similarly to a case where the reference clock signal FREF is delayed and thus only the case where the reference clock signal FREF is delayed will be described here.

(Operation of Time-to-Digital Converter)

FIGS. 14A, 14B, and 14C are timing charts illustrating the operation of the time-to-digital converter 104 (FIG. 13) to which two offset input clock signals are to be input.

In FIGS. 14A, 14B, and 14C, in addition to a case where the phase difference between the selected clock signal CKV_ROT and the reference clock signal FREF falls within the detection range of the time-to-digital converter 104 (FIG. 13), a case where the phase difference falls outside the detection range is also depicted. However, also in FIGS. 14A, 14B, and 14C, the detection range of the time-to-digital converter 104 (FIG. 13) is specified as a length equivalent to four stages of delay elements tracing back from the rising edge of the reference clock signal FREF ("TDC detection range" indicated by dotted lines in FIGS. 14A, 14B, and 14C).

(FIG. 14A) A case where the phase difference between CKV_ROT and FREF_D falls within the detection range FIG. 14A illustrates a timing chart in a case where the phase difference between the selected clock signal CKV_ROT and the delayed reference clock signal FREF_D can be detected by the time-to-digital converter 104 (FIG. 13).

In the time-to-digital converter 104, signals D(0) to D(3) obtained by gradually delaying the selected clock signal CKV_ROT input from the multiplexer 103 in delay elements 121-1 to 121-5 are sampled by flip-flops 122-1 to 122-4 at the same time at the rising edge of the delayed reference clock signal FREF_D at time t1.

At this time, in FIG. 14A, since the rising edge of the selected clock signal CKV_ROT (signals D(0), D(1), D(2), and D(3)) is input later than the rising edge of the reference clock signal FREF, properly, the phase difference between the selected clock signal CKV_ROT and the reference clock signal FREF cannot be precisely detected.

However, since the delayed reference clock signal FREF_D obtained by delaying the reference clock signal FREF by the buffers 124 is used in the time-to-digital converter 104 (FIG. 13), the rising edge of the selected clock signal CKV_ROT (signals D(0) and D(1)) is present within the TDC detection range of the time-to-digital converter 104 (FIG. 13) and a code of "1100" is output to the flip-flops 122-1 to 122-4 at the rising edge of the delayed reference clock signal FREF_D at the time t1. Therefore, it is possible to detect a phase relationship between the selected clock signal CKV_ROT and the delayed reference clock signal FREF_D by a change point of the output code from 1 to 0.

(FIG. 14B) A case where the phase difference between CKV_ROT and FREF_D falls outside the detection range FIG. 14B illustrates a timing chart in a case where the phase difference between the selected clock signal CKV_ROT and the delayed reference clock signal FREF_D cannot be detected by the time-to-digital converter 104 (FIG. 13).

In FIG. 14B, while the phase relationship between the selected clock signal CKV_ROT and the reference clock signal FREF is such that both the signals are present within the TDC detection range of the time-to-digital converter 104 (FIG. 13), the phase relationship between the selected clock signal CKV_ROT and the delayed reference clock signal FREF_D is such that both the signals are located out of the TDC detection range of the time-to-digital converter 104 (FIG. 13). Accordingly, it is impossible to precisely detect the phase difference between the selected clock signal CKV_ROT and the delayed reference clock signal FREF_D.

That is, since the rising edge of the selected clock signal CKV_ROT (signals D(0), D(1), D(2), and D(3)) is input earlier than the rising edge of the delayed reference clock signal FREF_D, the outputs of the flip-flops 122-1 to 122-4 all become 1 ("1111")

(FIG. 14C) A case where the phase difference between CKV_ROT and FREF_D falls outside the detection range FIG. 14C illustrates a timing chart in a case where the phase difference between the selected clock signal CKV_ROT and the delayed reference clock signal FREF_D cannot be detected by the time-to-digital converter 104 (FIG. 13).

In FIG. 14C, the phase relationship between the selected clock signal CKV_ROT and the reference clock signal FREF is such that the edge of the selected clock signal CKV_ROT is input earlier than the rising edge of the reference clock signal FREF. In addition, since the phase relationship between the selected clock signal CKV_ROT and the delayed reference clock signal FREF_D is such that both the signals are located out of the TDC detection range of the time-to-digital converter 104 (FIG. 13), it is impossible to precisely detect the phase difference between the selected clock signal CKV_ROT and the delayed reference clock signal FREF_D.

(Phase Selection by Multiplexer)

FIGS. 15A, 15B, 15C, 15D, and 15E are timing charts illustrating an operation of phase selection by the multiplexer 103 in a case where the reference clock signal FREF is delayed by the buffers 124. Note that, in FIGS. 15A, 15B, 15C, 15D, and 15E, it is supposed that the maximum detectable value of the time-to-digital converter 104 (FIG. 13) is 0.3.

(FIG. 15A) A case where the fractional part of the reference phase is between 0 and 0.25.

Figures 15A, 15B, 15C, 15D, 15E:
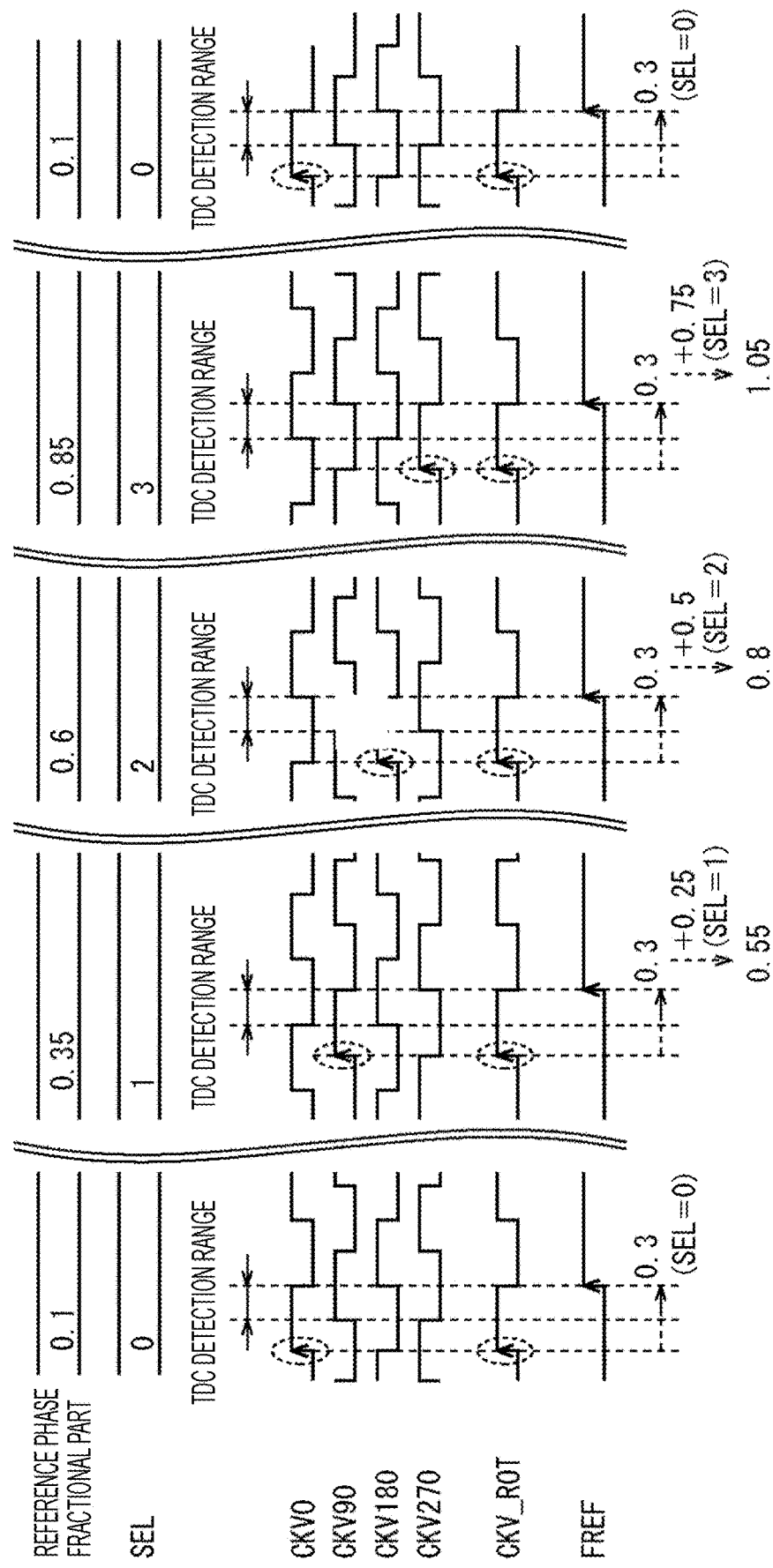
FIGS. 15A, 15B, 15C, 15D, and 15E are timing charts illustrating an operation of phase selection by a multiplexer.

As an example of a case where the fractional part of the reference phase generated by the reference phase generation unit 107 is between 0 and 0.25, FIG. 15A illustrates a timing chart when the fractional part of the reference phase becomes 0.1.

In FIG. 15A, the control signal SEL to be input from the reference phase generation unit 107 to the multiplexer 103 is set to 0. Therefore, in the multiplexer 103, the 0-degree phase output CKV0 is selected out of the four-phase clock signals (CKV0, CKV90, CKV180, and CKV270) generated by the frequency divider 102 and output as the selected clock signal CKV_ROT.

At this time, since the selected clock signal CKV_ROT (0-degree phase output CKV0) is out of the TDC detection range of the time-to-digital converter 104 (FIG. 13), the maximum detectable difference between fractional phases, namely, 0.3 is to be output to the phase comparator 108. However, this is a value different from the phase difference between the selected clock signal CKV_ROT and the reference clock signal FREF originally intended to be detected.

(FIG. 15B) A case where the fractional part of the reference phase is between 0.25 and 0.5.

As an example of a case where the fractional part of the reference phase generated by the reference phase generation unit 107 is between 0.25 and 0.5, FIG. 15B illustrates a timing chart when the fractional part of the reference phase becomes 0.35.

In FIG. 15B, since the control signal SEL is set to 1 by the reference phase generation unit 107, in the multiplexer 103, the 90-degree phase output CKV90 is selected out of the four-phase clock signals (CKV0, CKV90, CKV180, and CKV270) and output as the selected clock signal CKV_ROT.

At this time, since the selected clock signal CKV_ROT (90-degree phase output CKV90) is out of the TDC detection range of the time-to-digital converter 104 (FIG. 13), the maximum detectable difference between fractional phases, namely, 0.3 is to be output to the phase comparator 108.

Meanwhile, the control signal SEL (=1) set by the reference phase generation unit 107 is also input to the phase comparator 108 and the phase comparator 108 adds a correction amount obtained by multiplying the control signal SEL of 1 by 0.25 to the fractional phase difference (=0.3) from the time-to-digital converter 104 (FIG. 13). Then, the phase comparator 108 finds 0.55, which is a value obtained by correcting the fractional phase difference, as a final fractional phase. However, this is a value different from the phase difference between the selected clock signal CKV_ROT and the reference clock signal FREF originally intended to be detected.

(FIG. 4C) A case where the fractional part of the reference phase is between 0.5 and 0.75.

As an example of a case where the fractional part of the reference phase generated by the reference phase generation unit 107 is between 0.5 and 0.75, FIG. 15C illustrates a timing chart when the fractional part of the reference phase becomes 0.6.

In FIG. 15C, since the control signal SEL is set to 2 by the reference phase generation unit 107, in the multiplexer 103, the 180-degree phase output CKV180 is selected out of the four-phase clock signals (CKV0, CKV90, CKV180, and CKV270) and output as the selected clock signal CKV_ROT.

At this time, since the selected clock signal CKV_ROT (180-degree phase output CKV180) is out of the TDC detection range of the time-to-digital converter 104 (FIG. 13), the maximum detectable difference between fractional phases, namely, 0.3 is to be output to the phase comparator 108.

Meanwhile, the phase comparator 108 adds a correction amount (=0.5) obtained by multiplying the control signal SEL (=2) set by the reference phase generation unit 107 by 0.25 to the fractional phase difference (=0.3) from the time-to-digital converter 104 (FIG. 13). Then, the phase comparator 108 finds 0.8, which is a value obtained by correcting the fractional phase difference, as a final fractional phase. However, this is a value different from the phase difference between the selected clock signal CKV_ROT and the reference clock signal FREF originally intended to be detected.

(FIG. 15D) A case where the fractional part of the reference phase is between 0.75 and 1.0

As an example of a case where the fractional part of the reference phase generated by the reference phase generation unit 107 is between 0.75 and 1.0, FIG. 15D illustrates a timing chart when the fractional part of the reference phase becomes 0.85.

In FIG. 15D, since the control signal SEL is set to 3 by the reference phase generation unit 107, in the multiplexer 103, the 270-degree phase output CKV270 is selected out of the four-phase clock signals (CKV0, CKV90, CKV180, and CKV270) and output as the selected clock signal CKV_ROT.

At this time, since the selected clock signal CKV_ROT (270-degree phase output CKV270) is out of the TDC detection range of the time-to-digital converter 104 (FIG. 13), the maximum detectable difference between fractional phases, namely, 0.3 is to be output to the phase comparator 108.

Meanwhile, the phase comparator 108 adds a correction amount (=0.75) obtained by multiplying the control signal SEL (=3) set by the reference phase generation unit 107 by 0.25 to the fractional phase difference (=0.3) from the time-to-digital converter 104 (FIG. 13). Then, the phase comparator 108 finds 1.05, which is a value obtained by correcting the fractional phase difference, as a final fractional phase. However, this is a value different from the phase difference between the selected clock signal CKV_ROT and the reference clock signal FREF originally intended to be detected.

As described above, when the multiplexer 103 is controlled on the basis of information on the reference phase of the reference phase generation unit 107 in a configuration using the multiplexer 103 to select a phase close to the reference clock signal FREF, a precise phase cannot be selected due to the influence of offset in some cases.

In addition, this offset varies depending on process voltage and temperature (PVT). Accordingly, an offset value (OFST) to be added to the output of the phase comparator 108, which will be described later, is not appropriate with a fixed value and adjustment corresponding to the PVT is required.

Furthermore, in a Type-I PLL in which the integral term is only an oscillator (digitally controlled oscillator), the output of the phase comparator converges to a certain direct current (DC) value. This DC value is amplified by a loop gain and the oscillator will be controlled to a desired frequency. Since the DC value to which the output of the phase comparator converges varies depending on the center frequency of the oscillator, the phase relationship between the clock signal CKV to be measured and the reference clock signal FREF in a locked state cannot be managed with a fixed offset value. Accordingly, also from this point of view, it is necessary to perform adjustment corresponding to the PVT.

Hereinafter, a configuration for avoiding such a situation will be described as the third embodiment.

(Configuration of Phase Locked Loop)

Figure 16:
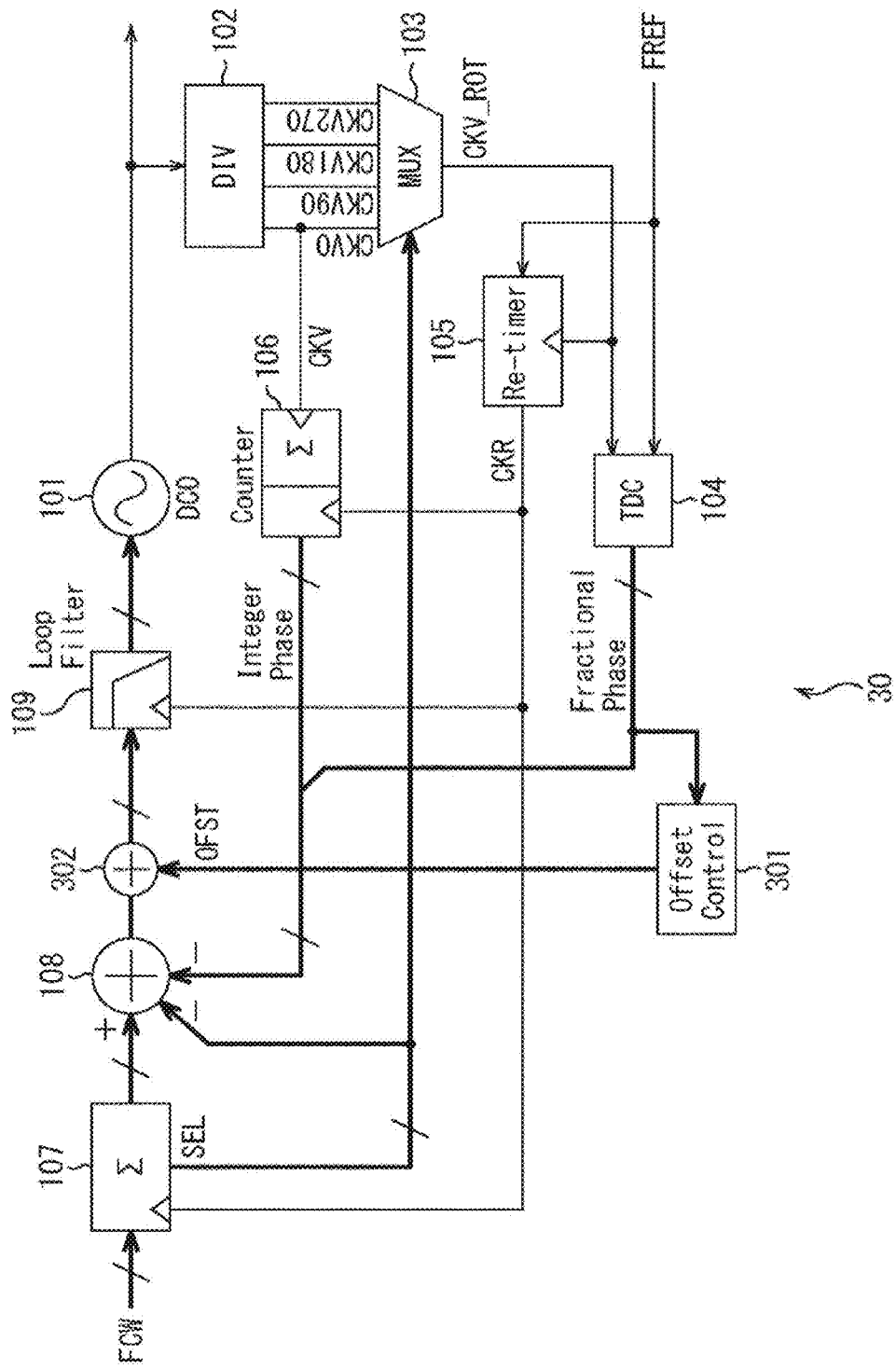
FIG. 16 is a diagram illustrating a configuration example of a phase locked loop according to a third embodiment.

FIG. 16 is a diagram illustrating the configuration of a phase locked loop to which the present technology is applied according to an embodiment (third embodiment).

In FIG. 16, a phase locked loop 30 is constituted by a digitally controlled oscillator 101, a frequency divider 102, a multiplexer 103, a time-to-digital converter 104, a retiming circuit 105, a counter 106, a reference phase generation unit 107, a phase comparator 108, a digital loop filter 109, an offset adjustment unit 301, and an adder 302.

That is, in the phase locked loop 40 in FIG. 16, the offset adjustment unit 301 and the adder 302 are newly provided as compared with the phase locked loop 10 in FIG. 1.

The offset adjustment unit 301 monitors the output from the time-to-digital converter 104. The offset adjustment unit 301 adjusts the offset value (OFST) according to a result of the monitoring such that the time difference between the selected clock signal CKV_ROT and the reference clock signal FREF is put within the detection range (TDC detection range) of the time-to-digital converter 104. This offset value (OFST) is output to the adder 302.

The output (comparison result) of the phase comparator 108 and the offset value (OFST) from the offset adjustment unit 301 are input to the adder 302. The adder 302 adds the offset value (OFST) to the output (comparison result) of the phase comparator 108 to output to the digital loop filter 109.

Note that, in the phase locked loop 30 in FIG. 16, the same parts as those of the phase locked loop 10 in FIG. 1 are denoted by the same reference numerals and the description thereof will be omitted.

The phase locked loop 30 is configured as described above.

(Offset Adjustment Process)

Figure 17:
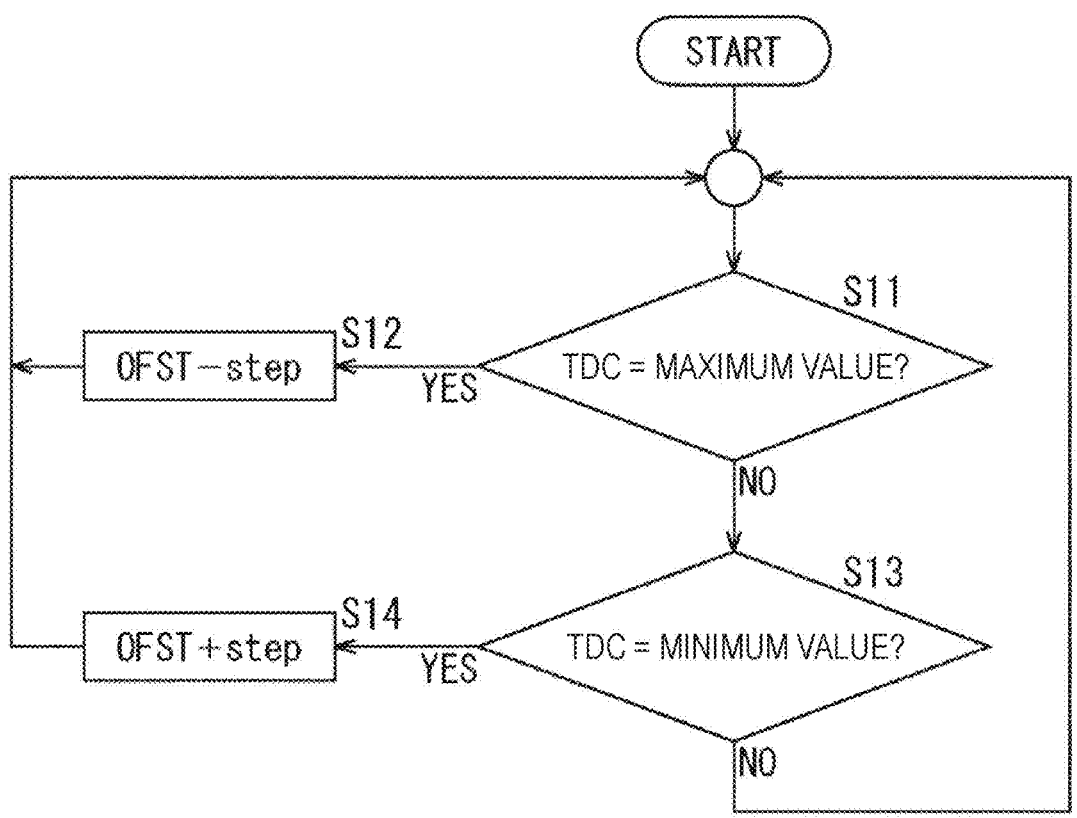
FIG. 17 is a flowchart for explaining a first offset adjustment process.
Figure 18:
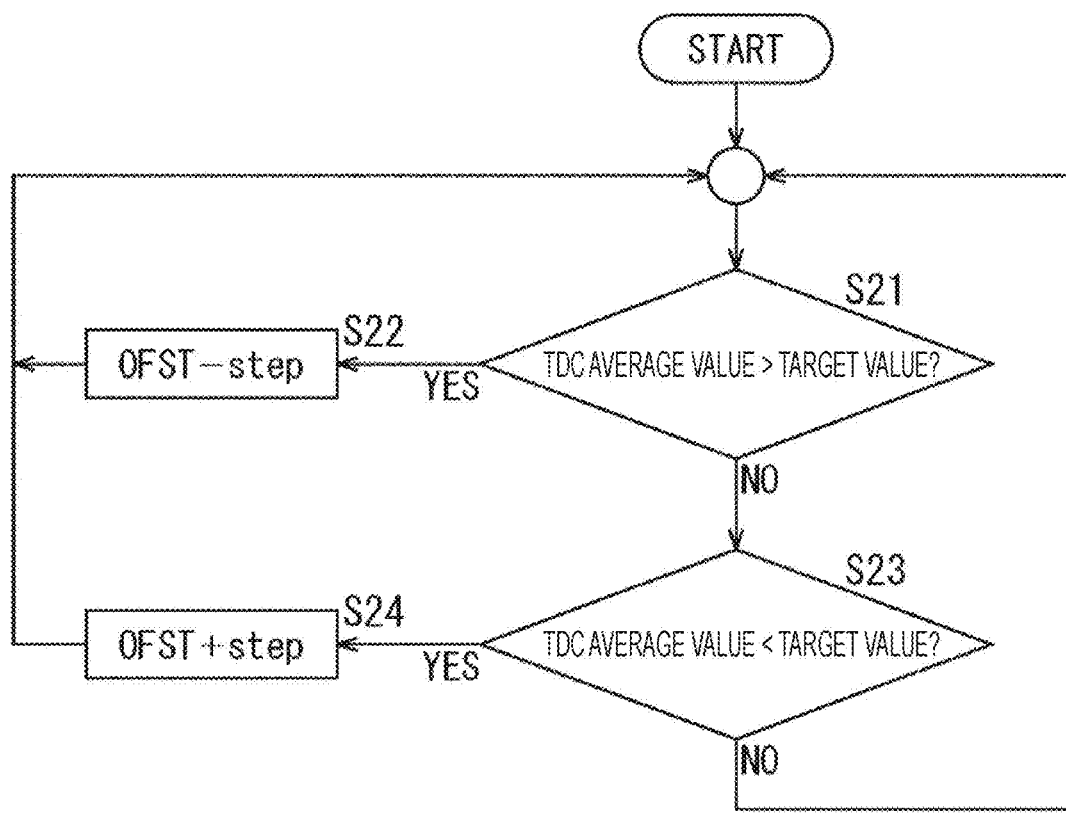
FIG. 18 is a flowchart for explaining a second offset adjustment process.

An offset adjustment process executed by the offset adjustment unit 301 (FIG. 16) will now be described with reference to flowcharts in FIGS. 17 and 18.

(A) Flow of First Offset Adjustment Process First, the flow of a first offset adjustment process of adjusting the offset value (OFST) according to the maximum value or the minimum value of the output code of the time-to-digital converter 104 (FIG. 16) will be described with reference to the flowchart in FIG. 17.

In step S11, the offset adjustment unit 301 determines whether the time-to-digital converter 104 has output a code of the maximum value, on the basis of the monitoring result for the output of the time-to-digital converter 104. In a case where it is determined in step S11 that the time-to-digital converter 104 has output a code of the maximum value, the process proceeds to step S12.

In step S12, the offset adjustment unit 301 decreases the offset value (OFST) by a step amount (step) designated in advance (OFST−step). Consequently, in the adder 302, the offset value (OFST) from which the step amount has been decreased is added to the output (comparison result) of the phase comparator 108.

Upon completion of the process in step S12, the process returns to step S11 and the subsequent processes are repeated. On the other hand, in a case where it is determined in step S11 that the time-to-digital converter 104 has not output a code of the maximum value, the process proceeds to step S13.

In step S13, the offset adjustment unit 301 determines whether the time-to-digital converter 104 has output a code of the minimum value, on the basis of the monitoring result for the output of the time-to-digital converter 104. In a case where it is determined in step S13 that the time-to-digital converter 104 has output a code of the minimum value, the process proceeds to step S14.

In step S14, the offset adjustment unit 301 increases the offset value (OFST) by a step amount (step) designated in advance (OFST+step). Consequently, in the adder 302, the offset value (OFST) in which the step amount has been increased is added to the output (comparison result) of the phase comparator 108.

Upon completion of the process in step S14 or in a case where it is determined that the time-to-digital converter 104 has not output a code of the minimum value ("NO" in S13), the process returns to step S11 and the subsequent processes are repeated.

As described above, in the first offset adjustment process, the offset value (OFST) is adjusted such that the output code of the time-to-digital converter 104 does not reach up to the maximum value or the minimum value. For example, in a case where the maximum value of the output code is 0.25 and the minimum value thereof is 0, the offset value (OFST) will be decreased when the output code matches the maximum value (=0.25) and the offset value (OFST) will be increased when the output code matches the minimum value (=0).

(B) Flow of Second Offset Adjustment Process

Next, the flow of a second offset adjustment process of adjusting the offset value (OFST) according to the average value of the output codes of the time-to-digital converter 104 (FIG. 16) will be described with reference to the flowchart in FIG. 18.

In step S21, the offset adjustment unit 301 determines whether the average value of the output codes exceeds a target value designated in advance, on the basis of the monitoring result for the output of the time-to-digital converter 104. In a case where it is determined in step 21 that the average value of the output codes exceeds the target value, the process proceeds to step S22.

In step S22, the offset adjustment unit 301 decreases the offset value (OFST) by a step amount (step) designated in advance (OFST−step). Consequently, in the adder 302, the offset value (OFST) from which the step amount has been decreased is added to the output (comparison result) of the phase comparator 108.

Upon completion of the process in step S22, the process returns to step S21 and the subsequent processes are repeated. On the other hand, in a case where it is determined in step S21 that the average value of the output codes is equal to or less than the target value, the process proceeds to step S23.

In step S23, the offset adjustment unit 301 determines whether the average value of the output codes is less than the target value designated in advance, on the basis of the monitoring result for the output of the time-to-digital converter 104. In a case where it is determined in step S23 that the average value of the output codes is less than the target value, the process proceeds to step S24.

In step S24, the offset adjustment unit 301 increases the offset value (OFST) by a step amount (step) designated in advance (OFST+step). Consequently, in the adder 302, the offset value (OFST) in which the step amount has been increased is added to the output (comparison result) of the phase comparator 108.

Upon completion of the process in step S24 or in a case where it is determined that the average value of the output codes is equal to or larger than the target value ("NO" in S23), the process returns to step S21 and the subsequent processes are repeated.

As described above, in the second offset adjustment process, the offset value (OFST) is adjusted such that the average value of the output codes of the time-to-digital converter 104 always approaches the target value. For example, in a case where the maximum value of the output code is 0.25 and the minimum value thereof is 0, 0.125 is set as the target value such that the offset value (OFST) will be decreased when the average value of the output codes exceeds the target value and the offset value (OFST) will be increased when the average value of the output codes is less than the target value.

Note that the above-described first offset adjustment process and second offset adjustment process are examples of the adjustment process for the offset value (OFST) and, for example, the offset value (OFST) may be adjusted using another parameter other than the maximum value and the average value. In addition, in the second offset adjustment process, the target values used in the determination processes in steps S21 and S23 may be the same value or different values.

As described above, in the phase locked loop 30 (FIG. 16) of the third embodiment, the output of the time-to-digital converter 104 is monitored by the offset adjustment unit 301 and the offset value (OFST) is adjusted such that the selected clock signal CKV_ROT and the reference clock signal FREF are put within the detection range of the time-to-digital converter 104. Therefore, even in a case where there is a fixed phase difference as a consequence of circuit mounting or a case where the PVT varies, the phase difference between the selected clock signal CKV_ROT and the reference clock signal FREF can be put within the detection range of the time-to-digital converter 104.

<4. Fourth Embodiment>

Incidentally, in the third embodiment described above, the offset value (OFST) is added to the output (comparison result) of the phase comparator 108. However, in a case where the offset value (OFST) is added to the output (comparison result) of the phase comparator 108, the offset-adjusted value is reflected on the digitally controlled oscillator 101 via a time constant of the digital loop filter 109. As a result, there are cases where an unlocked state is transiently brought about.

FIGS. 19A, 19B, 19C, 19D, and 19E illustrate an example of a transient unlocking operation at the time of updating the offset value (OFST) in the phase locked loop 30 (FIG. 16) of the third embodiment. FIGS. 19A, 19B, 19C, 19D, and 19E illustrate timing charts of a phase error (Phase Error), the output of the time-to-digital converter 104 (TDC output), the update of the offset value (OFST), the overflow of the time-to-digital converter 104 (TDC overflow), and the underflow of the time-to-digital converter 104 (TDC underflow).

As illustrated in FIGS. 19A, 19B, 19C, 19D, and 19E, in the phase locked loop 30 (FIG. 16), overflow or underflow continuously occurs (reaching-up appears) in the time-to-digital converter 104 at the time of updating the offset value (OFST) according to the environmental variations (PVT variations) and an unlocked state is transiently brought about.

In an application that cannot tolerate such a condition, it is necessary to take a measure, for example, acquiring an appropriate adjustment value beforehand at a timing such as the time of activation (a timing different from the time of practical use) and the like and then applying a fixed value in practical use. However, in a case where such a measure is taken, there are cases where the phase locked loop (PLL) cannot follow the environmental variations after locking.

Hereinafter, a configuration for avoiding such a situation will be described as a fourth embodiment.

(Configuration of Phase Locked Loop)

Figure 20:
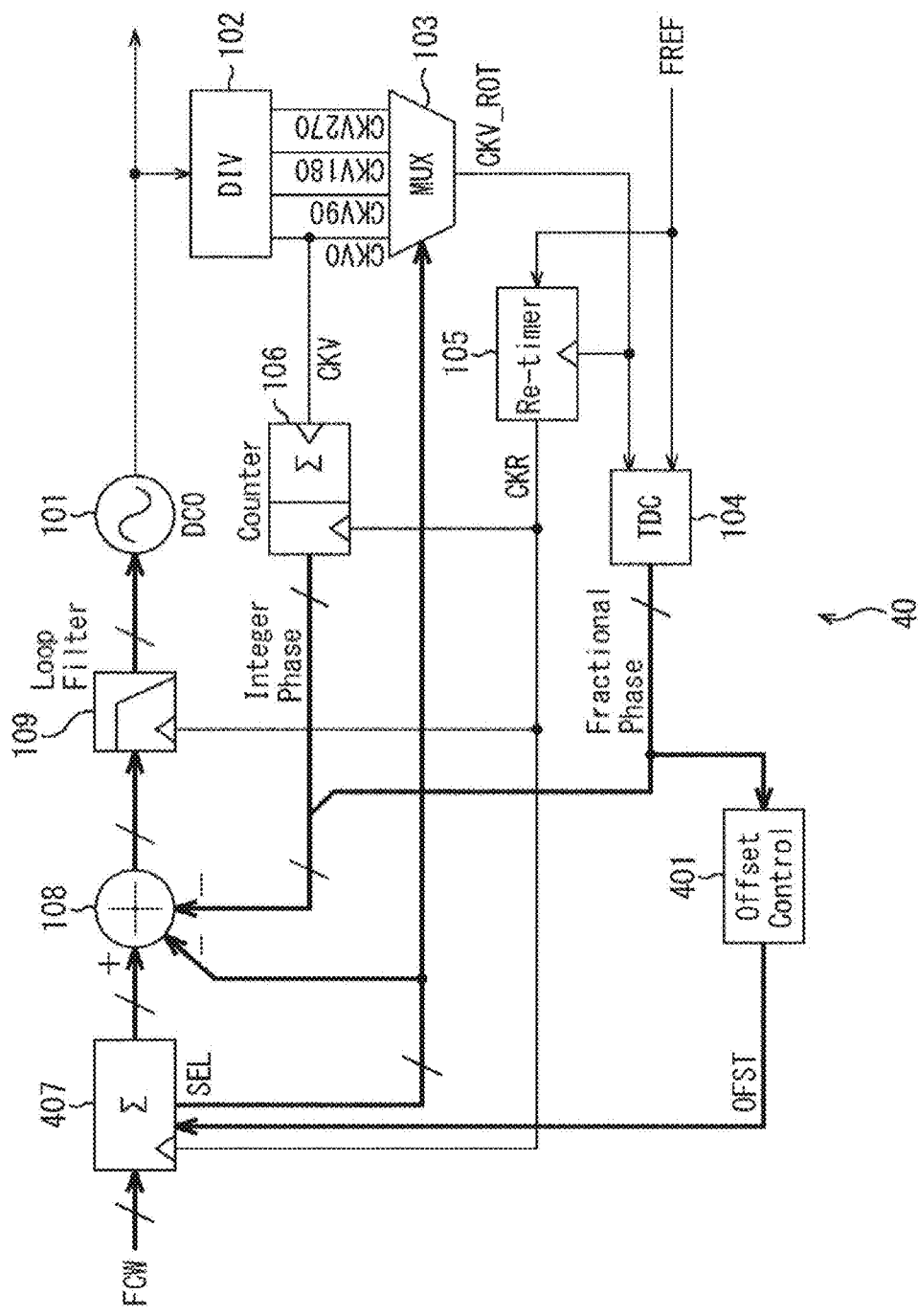
FIG. 20 is a diagram illustrating a configuration example of a phase locked loop according to a fourth embodiment.

FIG. 20 is a diagram illustrating the configuration of a phase locked loop to which the present technology is applied according to an embodiment (fourth embodiment).

In FIG. 20, a phase locked loop 40 is constituted by a digitally controlled oscillator 101, a frequency divider 102, a multiplexer 103, a time-to-digital converter 104, a retiming circuit 105, a counter 106, a reference phase generation unit 407, a phase comparator 108, a digital loop filter 109, and an offset adjustment unit 401.

That is, in the phase locked loop 40 in FIG. 20, the reference phase generation unit 407 is provided instead of the reference phase generation unit 107 and additionally, the offset adjustment unit 401 is newly provided as compared with the phase locked loop 10 in FIG. 1.

The offset adjustment unit 401 is configured in a similar manner to the offset adjustment unit 301 in FIG. 16 but differs in that the output destination of the offset value (OFST) is not the adder 302 (FIG. 16) but the reference phase generation unit 407 (FIG. 20).

That is, the offset adjustment unit 401 monitors the output from the time-to-digital converter 104 and adjusts the offset value (OFST) according to a result of the monitoring such that the time difference between the selected clock signal CKV_ROT and the reference clock signal FREF is put within the detection range (TDC detection range) of the time-to-digital converter 104.

As a method for this adjustment of the offset value (OFST), for example, the above-described first offset adjustment process (FIG. 17) and second offset adjustment process (FIG. 18) can be used. This offset value (OFST) is output to the reference phase generation unit 407.

The reference phase generation unit 407 accumulates the frequency division ratio FCW (frequency command word) input thereto to generate the reference phase and outputs the reference phase to the phase comparator 108. In addition, the reference phase generation unit 407 corrects the reference phase on the basis of the offset value (OFST) input from the offset adjustment unit 401. Then, the reference phase generation unit 407 generates the control signal SEL according to the fractional part of the corrected reference phase to output to the multiplexer 103 and the phase comparator 108.

Figure 21:
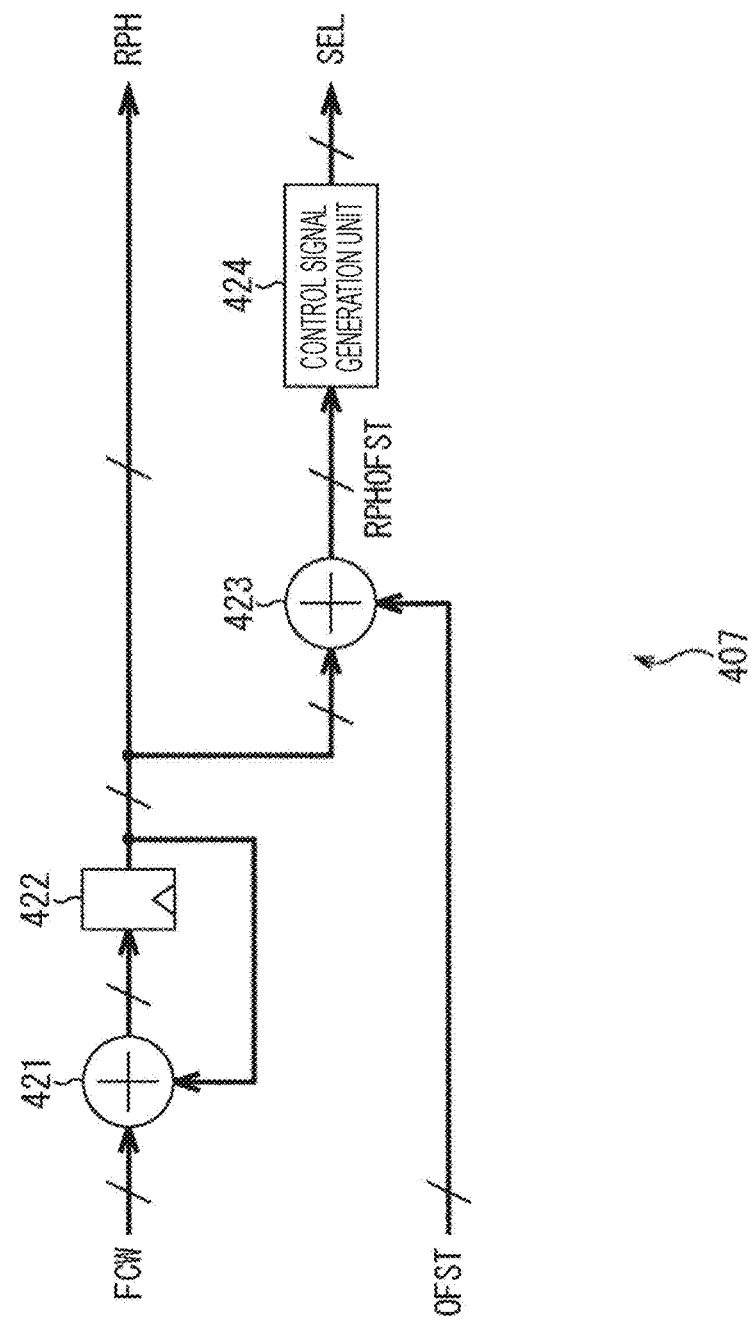
FIG. 21 is a diagram illustrating a configuration example of a reference phase generation unit in FIG. 20.

FIG. 21 depicts the detailed configuration of the reference phase generation unit 407. In FIG. 21, the reference phase generation unit 407 is constituted by an adder 421, a flip-flop 422, an adder 423, and a control signal generation unit 424.

The adder 421 and the flip-flop 422 cumulatively add the frequency division ratio FCW input thereto to generate and output a reference phase RPH.

The reference phase RPH generated by the adder 421 and the flip-flop 422 and the offset value (OFST) from the offset adjustment unit 401 (FIG. 20) are input to the adder 423. The adder 423 adds the offset value (OFST) to the reference phase RPH to correct the reference phase RPH. A reference phase RPHOFST obtained by correcting the reference phase RPH with the offset value (OFST) is output to the control signal generation unit 424.

The control signal generation unit 424 generates the control signal SEL on the basis of the fractional part of the reference phase RPHOFST input from the adder 423 to output to the multiplexer 103 and the phase comparator 108.

Note that, in the phase locked loop 40 in FIG. 20, the same parts as those of the phase locked loop 10 in FIG. 1 are denoted by the same reference numerals and the description thereof will be omitted.

The phase locked loop 40 is configured as described above.

(Phase Selection by Multiplexer)

FIGS. 22A, 22B, 22C, 22D, and 22E are timing charts illustrating an operation of phase selection by the multiplexer 103 in FIG. 20.

(FIG. 22A) A case where the fractional part of the corrected reference phase is between 0 and 0.25.

Figure 22:
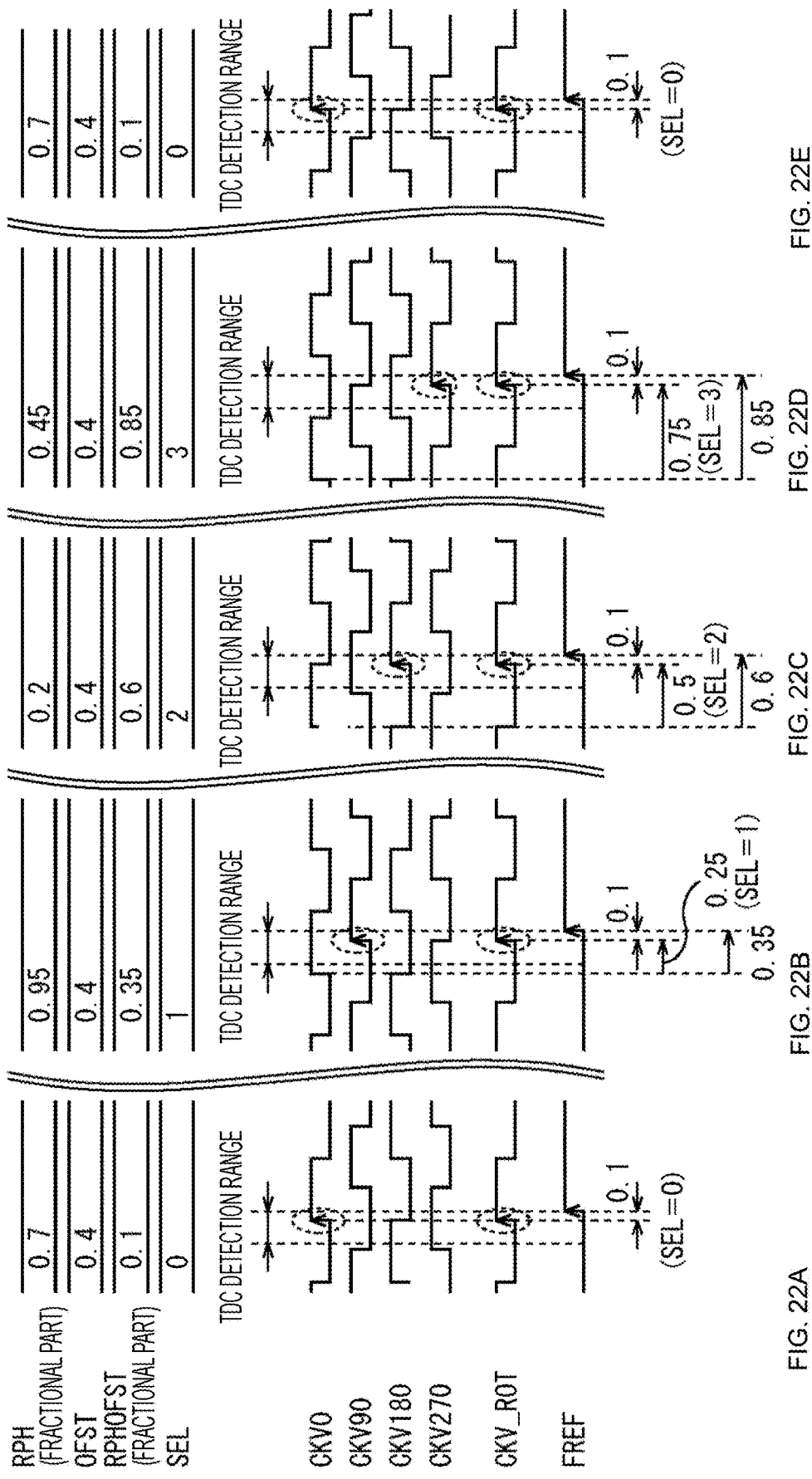
FIGS. 22A, 22B, 22C, 22D, and 22E are timing charts illustrating an operation of phase selection by a multiplexer in FIG. 20.
Figure 23:
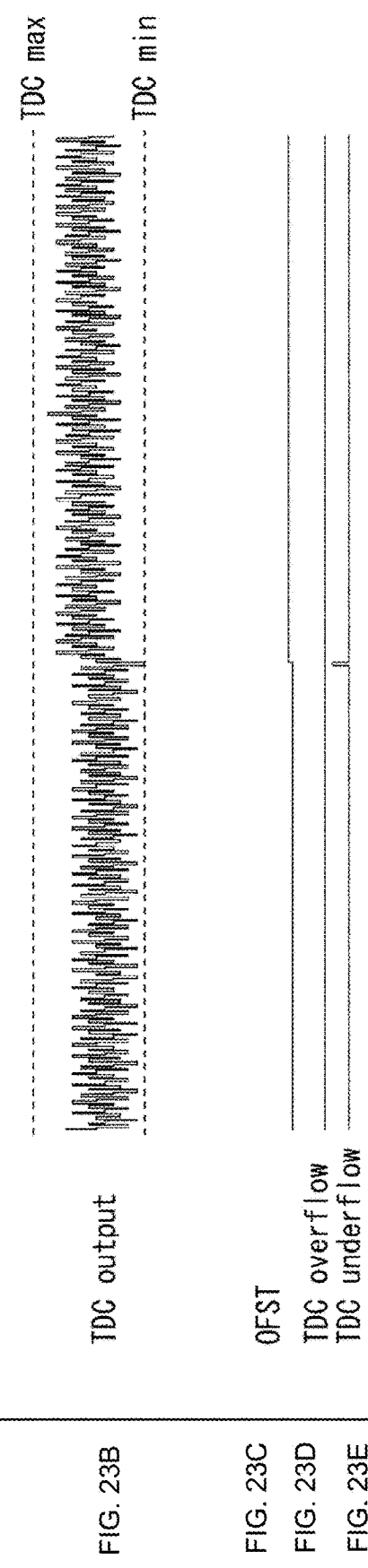
FIGS. 23A, 23B, 23C, 23D, and 23E are diagrams illustrating a state without unlock at the time of updating an offset value.

As an example of a case where the fractional part of the reference phase generated by the reference phase generation unit 407 is between 0 and 0.25, FIG. 22A illustrates a timing chart when the fractional part of the reference phase corrected by the offset value (OFST) becomes 0.1.

In FIG. 22A, in a case where the offset value (OFST) adjusted by the offset adjustment unit 401 is 0.4, this offset value (=0.4) is added to the fractional part (=0.7) of the reference phase RPH by the reference phase generation unit 407 and the fractional part of this corrected reference phase RPHOFST is given as 0.1 (0.1 as the fractional part of 1.1).

As a result, the control signal SEL to be input from the reference phase generation unit 407 to the multiplexer 103 is set to 0. Therefore, in the multiplexer 103, the 0-degree phase output CKV0 is selected out of the four-phase clock signals (CKV0, CKV90, CKV180, and CKV270) generated by the frequency divider 102 and output as the selected clock signal CKV_ROT.

At this time, the time-to-digital converter 104 detects the phase relationship between the selected clock signal CKV_ROT (0-degree phase output CKV0) and the reference clock signal FREF within the TDC detection range indicated by a range of dotted lines in FIGS. 22A, 22B, 22C, 22D, and 22E. Then, the time-to-digital converter 104 outputs 0.1, which is a detected difference between the fractional phases, to the phase comparator 108.

(FIG. 22B) A case where the fractional part of the corrected reference phase is between 0.25 and 0.5

As an example of a case where the fractional part of the reference phase generated by the reference phase generation unit 407 is between 0.25 and 0.5, FIGS. 22A, 22B, 22C, 22D, and 22E illustrate a timing chart when the fractional part of the reference phase corrected by the offset value (OFST) becomes 0.35.

In FIG. 22B, in a case where the offset value (OFST) adjusted by the offset adjustment unit 401 is 0.4, this offset value (=0.4) is added to the fractional part (=0.95) of the reference phase RPH by the reference phase generation unit 407 and the fractional part of this corrected reference phase RPHOFST is given as 0.35 (0.35 as the fractional part of 1.35).

As a result, since the control signal SEL is set to 1 by the reference phase generation unit 407, in the multiplexer 103, the 90-degree phase output CKV90 is selected out of the four-phase clock signals (CKV0, CKV90, CKV180, and CKV270) and output as the selected clock signal CKV_ROT.

At this time, the time-to-digital converter 104 detects the phase relationship between the clock signal (90-degree phase output CKV90) and the reference clock signal FREF within the TDC detection range, thereby outputting 0.1, which is a difference between the fractional phases, to the phase comparator 108.

Meanwhile, the control signal SEL (=1) set by the reference phase generation unit 407 is also input to the phase comparator 108 and the phase comparator 108 adds a correction amount obtained by multiplying the control signal SEL of 1 by 0.25 to the fractional phase difference (=0.1) from the time-to-digital converter 104. Then, the phase comparator 108 finds 0.35, which is a value obtained by correcting the fractional phase difference, as a final fractional phase.

(FIG. 22C) A case where the fractional part of the corrected reference phase is between 0.5 and 0.75

As an example of a case where the fractional part of the reference phase generated by the reference phase generation unit 407 is between 0.5 and 0.75, FIG. 22C illustrates a timing chart when the fractional part of the reference phase corrected by the offset value (OFST) becomes 0.6.

In FIG. 22C, in a case where the offset value (OFST) adjusted by the offset adjustment unit 401 is 0.4, this offset value (=0.4) is added to the fractional part (=0.2) of the reference phase RPH by the reference phase generation unit 407 and the fractional part of this corrected reference phase RPHOFST is given as 0.6.

As a result, since the control signal SEL is set to 2 by the reference phase generation unit 407, in the multiplexer 103, the 180-degree phase output CKV180 is selected out of the four-phase clock signals (CKV0, CKV90, CKV180, and CKV270) and output as the selected clock signal CKV_ROT.

At this time, the time-to-digital converter 104 detects the phase relationship between the clock signal (180-degree phase output CKV180) and the reference clock signal FREF within the TDC detection range, thereby outputting 0.1, which is a difference between the fractional phases, to the phase comparator 108.

Meanwhile, the phase comparator 108 adds a correction amount (=0.5) obtained by multiplying the control signal SEL (=2) set by the reference phase generation unit 407 by 0.25 to the fractional phase difference (=0.1) from the time-to-digital converter 104. Then, the phase comparator 108 finds 0.6, which is a value obtained by correcting the fractional phase difference, as a final fractional phase.

(FIG. 22D) A case where the fractional part of the corrected reference phase is between 0.75 and 1.0

As an example of a case where the fractional part of the reference phase generated by the reference phase generation unit 407 is between 0.75 and 1.0, FIG. 22D illustrates a timing chart when the fractional part of the reference phase corrected by the offset value (OFST) becomes 0.85.

In FIG. 22D, in a case where the offset value (OFST) adjusted by the offset adjustment unit 401 is 0.4, this offset value (=0.4) is added to the fractional part (=0.45) of the reference phase RPH by the reference phase generation unit 407 and the fractional part of this corrected reference phase RPHOFST is given as 0.85.

As a result, since the control signal SEL is set to 3 by the reference phase generation unit 407, in the multiplexer 103, the 270-degree phase output CKV270 is selected out of the four-phase clock signals (CKV0, CKV90, CKV180, and CKV270) and output as the selected clock signal CKV_ROT.

At this time, the time-to-digital converter 104 detects the phase relationship between the clock signal (270-degree phase output CKV270) and the reference clock signal FREF within the TDC detection range, thereby outputting 0.1, which is a difference between the fractional phases, to the phase comparator 108.

Meanwhile, the phase comparator 108 adds a correction amount (=0.75) obtained by multiplying the control signal SEL (=3) set by the reference phase generation unit 407 by 0.25 to the fractional phase difference (=0.1) from the time-to-digital converter 104. Then, the phase comparator 108 finds 0.85, which is a value obtained by correcting the fractional phase difference, as a final fractional phase.

(FIG. 22E) A case where the fractional part of the corrected reference phase is between 0 and 0.25

As an example of a case where the fractional part of the reference phase generated by the reference phase generation unit 407 is between 0 and 0.25, FIG. 22E illustrates a timing chart when the fractional part of the reference phase corrected by the offset value (OFST) becomes 0.1, as in FIG. 22A.

That is, as described above, in the operation of phase selection by the multiplexer 103, different control signals SEL (0, 1, 2, and 3) are set for respective ranges (0 to 0.25, 0.25 to 0.5, 0.5 to 0.75, and 0.75 to 1.0) obtained by dividing the range (0 to 1.0) of the fractional part of the reference phase into four ranges by 0.25 and one clock signal (CKV_ROT) is selected out of the four-phase clock signals (CKV0, CKV90, CKV180, and CKV270) according to one of these control signals SEL. In this configuration, this range of the fractional part made up of the four-divided ranges is regarded as one period and a similar operation of phase selection is repeated thereafter.

As described above, in the phase locked loop 40 (FIG. 20), the reference phase generation unit 407 adds an appropriate offset value (OFST) adjusted by the offset adjustment unit 401 to the reference phase and uses the corrected reference phase to generate the control signal for the multiplexer 103, whereby a phase close to the reference clock signal FREF can be selected.

FIGS. 23A, 23B, 23C, 23D, and 23E illustrate an example of an operation in a steady state at the time of updating the offset value (OFST) in the phase locked loop 40 (FIG. 20) of the fourth embodiment. As in FIGS. 19A, 19B, 19C, 19D, and 19E, FIGS. 23A, 23B, 23C, 23D, and 23E illustrate timing charts of a phase error (Phase Error), the output of the time-to-digital converter 104 (TDC output), the update of the offset value (OFST), the overflow of the time-to-digital converter 104 (TDC overflow), and the underflow of the time-to-digital converter 104 (TDC underflow).

As illustrated in FIGS. 23A, 23B, 23C, 23D, and 23E, in the phase locked loop 40 (FIG. 20), overflow or underflow (almost) does not occur in the time-to-digital converter 104 at the time of updating the offset value (OFST) according to the environmental variations (PVT variations) and a steady state is brought about.

That is, in the phase locked loop 40, the update of the offset value (OFST) occurring from being involved in the environmental variations (PVT variations) is immediately reflected in the phase control signal for a feedback clock and additionally the phase shift in the multiplexer 103 is compensated by the phase comparator 108, such that the phase error is not affected at all.

In this manner, by adopting the configuration of the phase locked loop 40 of the fourth embodiment, it is possible to select an appropriate phase by following the environmental variations after the phase locked loop (PLL) is locked without affecting the performance. That is, there is provided the method of adjusting the feedback clock signal that can constantly follow the environmental variations without affecting the loop operation even if the offset value (OFST) is updated.

As described thus far, in the phase locked loop 40 (FIG. 20) of the fourth embodiment, the reference phase generation unit 407 corrects the reference phase according to the offset value (OFST) adjusted by the offset adjustment unit 401 and generates the control signal SEL using the corrected reference phase. Accordingly, it is possible to restrain the unlock state from being transiently brought about at the time of updating the offset value (OFST).

<5. Fifth Embodiment>

Incidentally, in the above-described timing chart in FIGS. 3A, 3B, and 3C, the detection range of the time-to-digital converter 104 has a length equivalent to four stages of delay elements tracing back from the rising edge of the reference clock signal FREF ("TDC detection range" indicated by dotted lines in FIGS. 3A, 3B, and 3C).

The length of the time-to-digital converter 104 needs to be prepared as a detection range that can cover one period of the feedback clock signal. If the detection range of the time-to-digital converter 104 is narrower than one period of the feedback clock signal, precise phase information cannot be detected and a large phase error occurs, which may lead to severe phase noise degradation.

In addition, in the above-described timing chart in FIGS. 4A, 4B, 4C, 4D, and 4E, the principle of measuring the phase difference between the reference clock signal FREF and the selected clock signal CKV_ROT (feedback clock signal) has been described. Note that, in FIGS. 4A, 4B, 4C, 4D, and 4E, a value normalized by one period of a referred signal is used as an amount indicating the phase difference. For example, the phase difference equal to one period of the clock signal is written as 1 and the phase difference equal to the half period of the clock signal is written as 0.5.

In FIGS. 4A, 4B, 4C, 4D, and 4E, the final fractional phase is calculated by following formula (1).

$$\text{Fractional phase=SEL value} \times \text{fixed value+TDC-detected fractional phase difference} \quad (1)$$

However, in formula (1), the "SEL value" means the value of the control signal SEL for the multiplexer 103. In addition, the "fixed value" is a value obtained by equally dividing one period of the clock signal by the number of phases of the clock signals. For example, in the case of the four-phase clock signals (CKV0, CKV90, CKV180, and CKV 270), 0.25 (=one period/four phases) is employed.

Furthermore, the "TDC-detected fractional phase difference" in formula (1) is a fractional phase obtained by dividing the code (TDC code) detected by the time-to-digital converter 104 by the set value of the number of stages of the time-to-digital converter 104 (number of TDC stages) equivalent to one period of the feedback clock signal. For example, when 6 is obtained as the TDC code in a case where the number of TDC stages for one period is set to 60 stages, 0.1 (=‰) is obtained as the TDC-detected fractional phase difference.

In this case, as illustrated in FIG. 4A, the control signal SEL is set to 0 in a case where the fractional part of the reference phase is between 0 and 0.25. Accordingly, if the difference between the fractional phases detected by the time-to-digital converter 104 at this time is 0.1, 0.1 is obtained as a final fractional phase because the SEL value is 0.

In addition, as illustrated in FIG. 4B, the control signal SEL is set to 1 in a case where the fractional part of the reference phase is between 0.25 and 0.5. Accordingly, if the difference between the fractional phases detected by the time-to-digital converter 104 at this time is 0.1, 0.35 is obtained as a final fractional phase by adding a value obtained by multiplying the SEL value by the fixed value (0.25=1×0.25) to this difference.

In addition, as illustrated in FIG. 4C, the control signal SEL is set to 2 in a case where the fractional part of the reference phase is between 0.5 and 0.75. Accordingly, if the difference between the fractional phases detected by the time-to-digital converter 104 at this time is 0.1, 0.6 is obtained as a final fractional phase by adding a value obtained by multiplying the SEL value by the fixed value (0.5=2×0.25) to this difference.

In addition, as illustrated in FIG. 4D, the control signal SEL is set to 3 in a case where the fractional part of the reference phase is between 0.75 and 1.0. Accordingly, if the difference between the fractional phases detected by the time-to-digital converter 104 at this time is 0.1, 0.85 is obtained as a final fractional phase by adding a value obtained by multiplying the SEL value by the fixed value (0.75=3×0.25) to this difference.

In this manner, in the example in FIGS. 4A, 4B, 4C, 4D, and 4E, the final fractional phase is found by applying formula (1) with the fixed value specified as 0.25. However, there is a possibility that an error is included in the "fixed value" in formula (1) and, in such a case, it is also assumed that an offset occurs in an added amount to the "TDC-detected fractional phase difference" and accurate feedback phase information cannot be obtained.

Hereinafter, a configuration for avoiding such a situation will be described as a fifth embodiment.

(Configuration of Phase Locked Loop)

Figure 24:
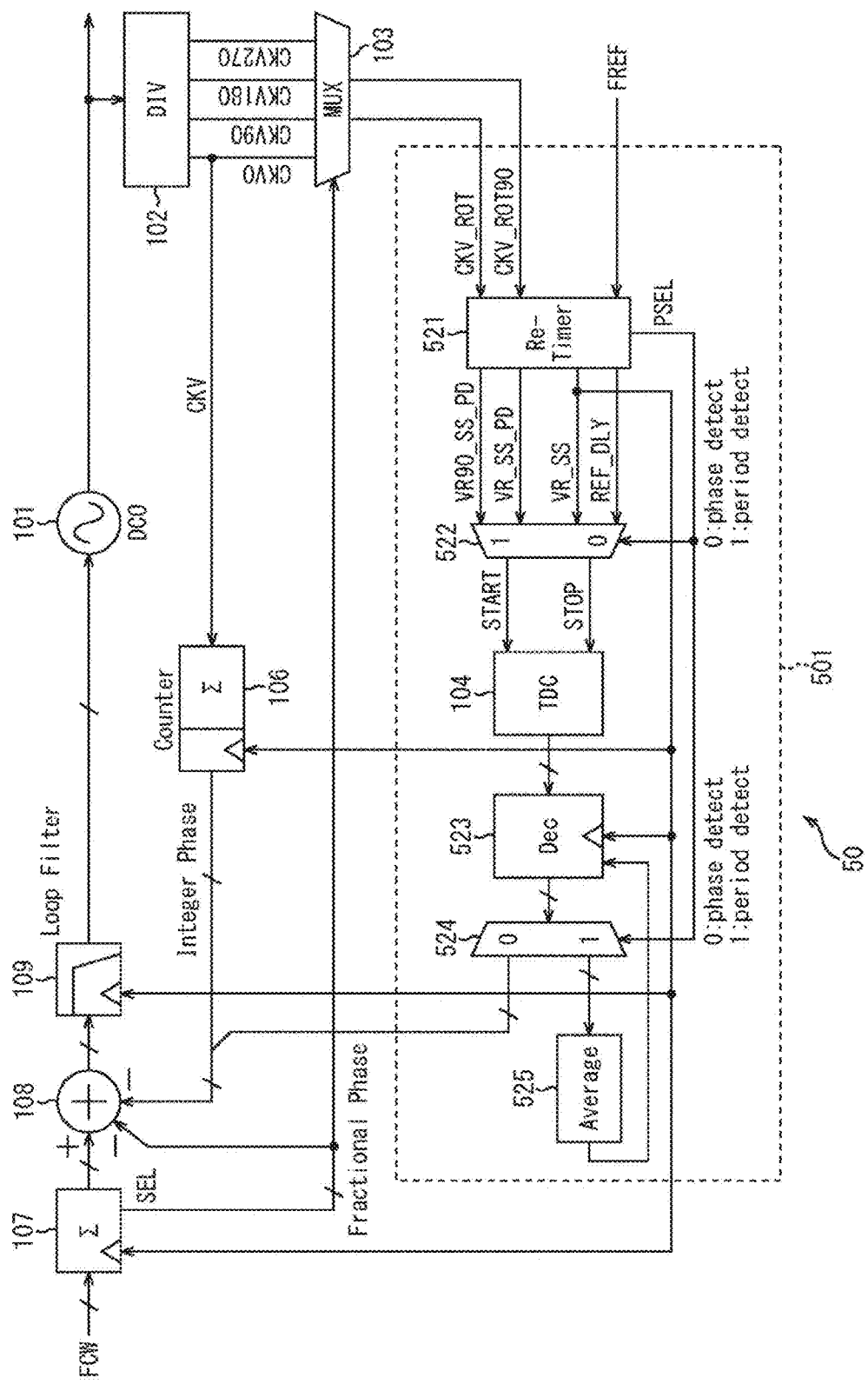
FIG. 24 is a diagram illustrating a configuration example of a phase locked loop according to a fifth embodiment.

FIG. 24 is a diagram illustrating the configuration of a phase locked loop to which the present technology is applied according to an embodiment (fifth embodiment).

In FIG. 24, a phase locked loop 50 is constituted by a digitally controlled oscillator 101, a frequency divider 102, a multiplexer 103, a counter 106, a reference phase generation unit 107, a phase comparator 108, a digital loop filter 109, and a phase detection/period measurement unit 501.

That is, in the phase locked loop 50 in FIG. 24, the phase detection/period measurement unit 501 is provided instead of the time-to-digital converter 104 and the retiming circuit 105, as compared with the phase locked loop 10 in FIG. 1. The phase detection/period measurement unit 501 operates in one of modes, namely, "phase detection (phase detect)" for finding the fractional phase and "period measurement (period detect)" for ensuring that the "fixed value" indicated in formula (1) is replaced with a constantly measured value.

In order to function for both of phase detection and period measurement, the phase detection/period measurement unit 501 is constituted by a retiming circuit 521, a multiplexer 522, a decoder 523, a demultiplexer 524, and an average value arithmetic unit 525 included therein, in addition to the above-described time-to-digital converter 104.

A clock signal CKV_ROT and a clock signal CKV_ROT90 from the multiplexer 103 and the reference clock signal FREF which is a clock signal serving as a reference are input to the retiming circuit 521. Here, the clock signals CKV_ROT and CKV_ROT90 are two clock signals selected by the multiplexer 103 out of the four-phase clock signals (CKV0, CKV90, CKV180, and CKV270) and these clock signals have a relationship of phases deviated by 90° from each other.

The retiming circuit 521 outputs a clock signal REF_DLY obtained by delaying the reference clock signal FREF to the multiplexer 522. In addition, the retiming circuit 521 synchronizes the clock signal REF_DLY with the clock signal CKV_ROT and outputs a clock signal VR_SS obtained by the synchronization to the multiplexer 522.

The retiming circuit 521 synchronizes the clock signal REF_DLY with the clock signal CKV_ROT and outputs a clock signal VR_SS_PD obtained by the synchronization to the multiplexer 522. The retiming circuit 521 also synchronizes the clock signal REF_DLY with the clock signal CKV_ROT90 and outputs a clock signal VR90_SS_PD obtained by the synchronization to the multiplexer 522.

Additionally, the retiming circuit 521 generates a control signal PSEL on the basis of the reference clock signal FREF to output to the multiplexer 522 and the demultiplexer 524. Here, for this control signal PSEL, 0 is set in a case where the phase detection (phase detect) is performed by the phase detection/period measurement unit 501 and 1 is set in a case where the period measurement (period detect) is performed by the phase detection/period measurement unit 501.

In a case where the phase detection is performed in accordance with the control signal PSEL (PSEL=0) from the retiming circuit 521, the multiplexer 522 outputs the clock signals REF_DLY and VR_SS input from the retiming circuit 521 to the time-to-digital converter 104.

The time-to-digital converter 104 detects the time difference between the clock signals REF_DLY (START) and VR_SS (STOP) from the multiplexer 522 and outputs a detection result (TDC code) obtained by the detection to the decoder 523.

Note that, in FIG. 24, the clock signal VR_SS from the retiming circuit 521 is output to the counter 106, the reference phase generation unit 107, the digital loop filter 109, and the decoder 523 as a synchronous clock signal CKR. That is, in a case where the phase detection is performed in the phase detection/period measurement unit 501, the time-to-digital converter 104 and the retiming circuit 521 operate similarly to the time-to-digital converter 104 and the retiming circuit 105 in the above-described phase locked loop 10 (FIG. 1) and the like.

The TDC code from the time-to-digital converter 104 and an arithmetic result of the average value from the average value arithmetic unit 525 are input to the decoder 523. The decoder 523 converts the TDC code and a code obtained from the arithmetic result of the average value into an expression suitable for a process in the subsequent stage and outputs data (output code) obtained by the conversion to the demultiplexer 524. In addition, as will be described later, the average value arithmetic unit 525 performs an arithmetic process of calculating the average value of the TDC codes for each phase in a case where the period measurement is performed.

In a case where the phase detection is performed in accordance with the control signal PSEL (PSEL=0) from the retiming circuit 521, the demultiplexer 524 outputs the data (data relating to the fractional phase) from the decoder 523 to the phase comparator 108.

Meanwhile, in a case where the period measurement is performed in accordance with the control signal PSEL (PSEL=1) from the retiming circuit 521, the multiplexer 522 outputs the clock signals VR_SS_PD and VR90_SS_PD input from the retiming circuit 521 to the time-to-digital converter 104.

The time-to-digital converter 104 measures the time difference between the clock signals VR_SS_PD (START) and VR90_SS_PD (STOP) for period measurement from the multiplexer 522 and outputs a measurement result (TDC code) obtained by the measurement to the decoder 523. The decoder 523 processes the TDC code from the time-to-digital converter 104 and outputs data obtained by the process to the demultiplexer 524.

In a case where the period measurement is performed in accordance with the control signal PSEL (PSEL=1) from the retiming circuit 521, the demultiplexer 524 outputs the data (data relating to the TDC code) from the decoder 523 to the average value arithmetic unit 525.

Since the TDC code for each phase is obtained as the output from the demultiplexer 524, the average value arithmetic unit 525 calculates the average value of these TDC codes for each phase and outputs the arithmetic result of this average value to the decoder 523 (applies feedback thereto).

Consequently, the decoder 523 adds the average values of the TDC codes for each phase, which is obtained from the average value arithmetic unit 525 as the arithmetic results of the average values, thereby obtaining a TDC code for one period of the feedback clock signal. Then, in phase comparison, a more accurate fractional phase can be obtained by performing a predetermined arithmetic operation of applying the arithmetic result obtained during the period measurement to the detection result obtained during the phase detection. Note that details of a method for obtaining the accurate fractional phase as mentioned above will be described later.

The phase locked loop 50 is configured as described above.

(Operation of Time-to-Digital Converter during Period Measurement)

FIGS. 25A, 25B, 25C, and 25D are timing charts illustrating an operation at the time of period measurement by the time-to-digital converter 104 in FIG. 24.

At the time of period measurement, the phase detection/period measurement unit 501 sequentially selects clock time differences QP1 to QP4 obtained from the two clock signals CKV_ROT and CKV_ROT90 having phases deviated by 90° from each other, which have been selected by the multiplexer 103 out of the four-phase clock signals (CKV0, CKV90, CKV180, and CKV270), thereby performing measurement.

(FIG. 25A) A case where the clock time difference QP1 is measured

First, in a case where the clock time difference QP1 is measured, the clock signals CKV0 and CKV90 from the multiplexer 103 are input to the retiming circuit 521 as the clock signals CKV_ROT and CKV_ROT90. The retiming circuit 521 outputs the clock signals VR_SS_PD (CKV0) and VR90_SS_PD (CKV90) for period measurement synchronized with the clock signals CKV_ROT (CKV0) and CKV_ROT90 (CKV90) to the multiplexer 522.

Figure 25:
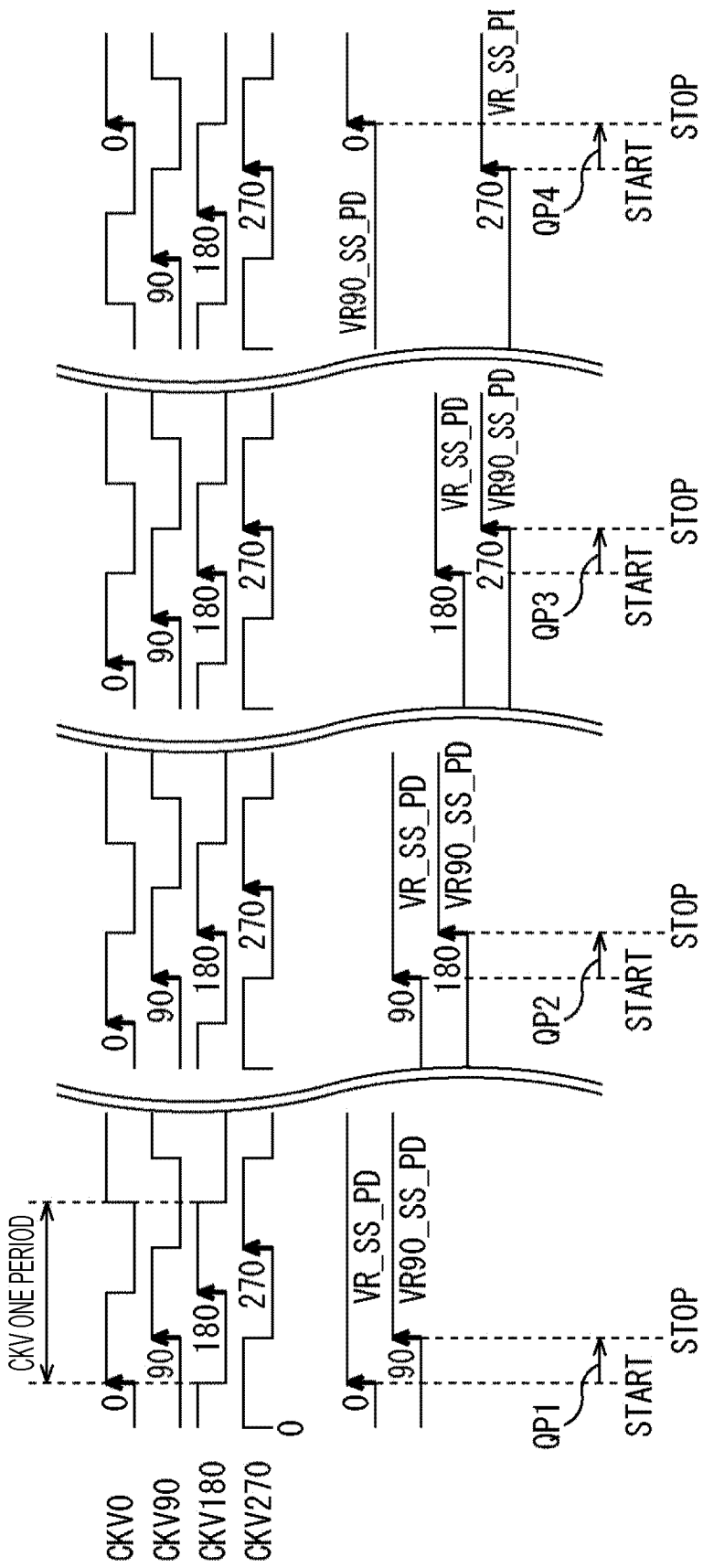
FIGS. 25A, 25B, 25C, and 25D are timing charts illustrating an operation at the time of period measurement by a phase detection/period measurement unit.

Here, 1 is set in the multiplexer 522 as the control signal PSEL in a case where the period measurement is performed and accordingly the clock signals VR_SS_PD (CKV0) and VR90_SS_PD (CKV90) for period measurement from the retiming circuit 521 are input to the time-to-digital converter 104. That is, as illustrated in FIG. 25A, the time of an interval in which the rising edge of the clock signal VR_SS_PD (CKV0) is specified as the start position (START) and the rising edge of the clock signal VR90_SS_PD (CKV90) is specified as the end position (STOP) is measured by the time-to-digital converter 104 as the clock time difference QP1.

(FIG. 25B) A case where the clock time difference QP2 is measured

Next, in a case where the clock time difference QP2 is measured, the clock signals CKV90 and CKV180 from the multiplexer 103 are input to the retiming circuit 521 as the clock signals CKV_ROT and CKV_ROT90. The retiming circuit 521 outputs the clock signals VR_SS_PD (CKV90) and VR90_SS_PD (CKV180) for period measurement synchronized with the clock signals CKV_ROT (CKV90) and CKV_ROT90 (CKV180) to the multiplexer 522.

In a case where the period measurement is performed, 1 is set in the multiplexer 522 as the control signal PSEL and the clock signals VR_SS_PD (CKV90) and VR90_SS _PD (CKV180) for period measurement from the retiming circuit 521 are input to the time-to-digital converter 104. That is, as illustrated in FIG. 25B, the time of an interval in which the rising edge of the clock signal VR_SS_PD (CKV90) is specified as the start position (START) and the rising edge of the clock signal VR90_SS_PD (CKV180) is specified as the end position (STOP) is measured by the time-to-digital converter 104 as the clock time difference QP2.

(FIG. 25C) A case where the clock time difference QP3 is measured

Next, in a case where the clock time difference QP3 is measured, the clock signals CKV180 and CKV270 from the multiplexer 103 are input to the retiming circuit 521 as the clock signals CKV_ROT and CKV_ROT90. The retiming circuit 521 outputs the clock signals VR_SS_PD (CKV180) and VR90_SS_PD (CKV270) for period measurement synchronized with the clock signals CKV_ROT (CKV180) and CKV_ROT90 (CKV270) to the multiplexer 522.

In a case where the period measurement is performed, 1 is set in the multiplexer 522 as the control signal PSEL and the clock signals VR_SS_PD (CKV180) and VR90_SS_PD (CKV270) for period measurement from the retiming circuit 521 are input to the time-to-digital converter 104. That is, as illustrated in FIG. 25C, the time of an interval in which the rising edge of the clock signal VR_SS_PD (CKV180) is specified as the start position (START) and the rising edge of the clock signal VR90_SS_PD (CKV270) is specified as the end position (STOP) is measured by the time-to-digital converter 104 as the clock time difference QP3.

(FIG. 25D) A case where the clock time difference QP4 is measured

Finally, in a case where the clock time difference QP4 is measured, the clock signals CKV270 and CKV0 from the multiplexer 103 are input to the retiming circuit 521 as the clock signals CKV_ROT and CKV_ROT90. The retiming circuit 521 outputs the clock signals VR_SS_PD (CKV270) and VR90_SS_PD (CKV0) for period measurement synchronized with the clock signals CKV_ROT (CKV270) and CKV_ROT90 (CKV0) to the multiplexer 522.

In a case where the period measurement is performed, 1 is set in the multiplexer 522 as the control signal PSEL and the clock signals VR_SS_PD (CKV270) and VR90_SS_PD (CKV0) for period measurement from the retiming circuit 521 are input to the time-to-digital converter 104. That is, as illustrated in FIG. 25D, the time of an interval in which the rising edge of the clock signal VR_SS_PD (CKV270) is specified as the start position (START) and the rising edge of the clock signal VR90_SS_PD (CKV0) is specified as the end position (STOP) is measured by the time-to-digital converter 104 as the clock time difference QP4.

Using the procedures described above, at the time of period measurement, the time-to-digital converter 104 of the phase detection/period measurement unit 501 measures the clock time differences QP1 to QP4 obtained from the two clock signals CKV_ROT and CKV_ROT90 having phases deviated by 90° from each other, out of the four-phase clock signals (CKV0, CKV90, CKV180, and CKV270).

(Operation of Phase Detection/Period Measurement Unit)

Here, on the premise that the operation illustrated in FIGS. 25A, 25B, 25C, and 25D is performed by the time-to-digital converter 104 at the time of period measurement, operations at the time of period measurement and phase detection by the phase detection/period measurement unit 501 will be described with reference to FIGS. 26 and 27.

(Operation of Phase Detection/Period Measurement Unit during Period Measurement)

First, an operation at the time of period measurement by the phase detection/period measurement unit 501 will be described with reference to FIG. 26.

As described above, the phase detection/period measurement unit 501 is provided with the multiplexer 522 and the demultiplexer 524 in order to function for both of phase detection (phase detect) and period measurement (period detect). In the configuration in FIG. 26, since the period measurement is performed by the phase detection/period measurement unit 501, 1 is set in the multiplexer 522 and the demultiplexer 524 as the control signal PSEL.

Figure 26:
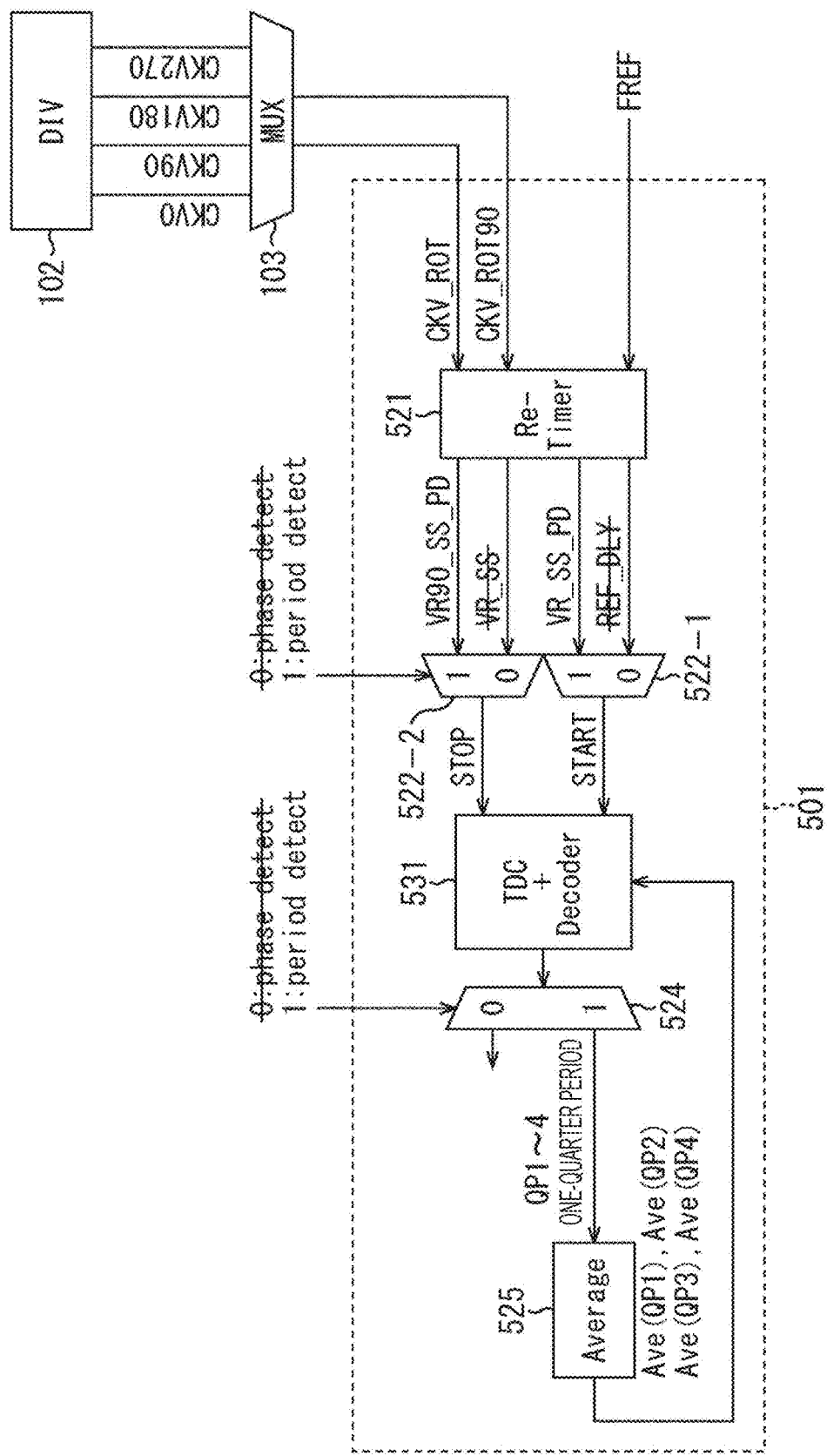
FIG. 26 is a diagram for explaining an operation at the time of period measurement by the phase detection/period measurement unit.

For convenience of explanation, however, in the configuration in FIG. 26, the multiplexer 522 illustrated in FIG. 24 is depicted separately as a multiplexer 522-1 to which the clock signals VR_SS_PD and REF_DLY are input and a multiplexer 522-2 to which the clock signals VR90_SS_PD and VR_SS are input. In addition, the time-to-digital converter 104 and the decoder 523 illustrated in FIG. 24 are collectively depicted as a TDC+Decoder 531 in the configuration in FIG. 26.

Since 1 is set in the multiplexer 522-1 as the control signal PSEL, the clock signal VR_SS_PD for period measurement out of the clock signals VR_SS_PD and REF_DLY is input to the TDC+Decoder 531. Meanwhile, since 1 is set in the multiplexer 522-2 as the control signal PSEL, the clock signal VR90_SS_PD for period measurement out of the clock signals VR90_SS_PD and VR_SS is input to the TDC+Decoder 531.

The TDC+Decoder 531 (time-to-digital converter 104) measures the time difference between the clock signal VR_SS_PD (START) for period measurement from the multiplexer 522-1 and the clock signal VR90_SS_PD (STOP) for period measurement from the multiplexer 522-2. As illustrated in FIGS. 25A, 25B, 25C, and 25D mentioned above, the time of an interval in which the rising edge of the clock signal VR_SS_PD for period measurement is specified as the start position (START) and the rising edge of the clock signal VR90_SS_PD for period measurement is specified as the end position (STOP) is measured by the time-to-digital converter 104 sequentially for each phase as the clock time differences QP1 to QP4.

Then, the TDC codes of the clock time differences QP1 to QP4 measured by the TDC+Decoder 531 (time-to-digital converter 104) are input to the demultiplexer 524. In the demultiplexer 524, since 1 is set as the control signal PSEL, the data from the TDC+Decoder 531 (the TDC codes of the clock time differences (QP1 to QP4) for each phase) is output to the average value arithmetic unit 525 out of the output destinations, namely, the phase comparator 108 and the average value arithmetic unit 525.

The average value arithmetic unit 525 calculates the average value (Ave(QP)) of the clock time differences for each phase on the basis of the data from the demultiplexer 524 and outputs the arithmetic result of this average value to the TDC+Decoder 531 (decoder 523) (applies feedback thereto). That is, in the average value arithmetic unit 525, since the clock time differences QP1 to QP4 for each phase are sequentially input thereto, the average value of the clock time differences are calculated for each phase, such that average values Ave(QP1), Ave(QP2), Ave(QP3), and Ave(QP4) can be obtained as arithmetic results of the calculation.

In the TDC+Decoder 531 (decoder 523), the average values (Ave(QP)) for each phase from the average value arithmetic unit 525 are added in such a manner as Ave(QP1)+Ave(QP2)+Ave(QP3)+Ave(QP4), such that a TDC code for one period (P) of the feedback clock signal can be obtained. Here, in a case where the period is normalized, 1/P, which is the reciprocal of one period (P) of the feedback clock signal, can be used as a normalization coefficient for such a case.

As described thus far, the phase detection/period measurement unit 501 finds the average values (Ave(QP)) of clock time differences for each phase and adds these average values at the time of period measurement, thereby being able to obtain the TDC code for one period of the feedback clock signal.

(Operation of Phase Detection/Period Measurement Unit during Phase Detection)

Next, an operation at the time of phase detection by the phase detection/period measurement unit 501 will be described with reference to FIG. 27.

The phase detection/period measurement unit 501 is provided with the multiplexer 522 and the demultiplexer 524 so as to function for both of phase detection and period measurement. In the configuration in FIG. 27, since the phase detection is performed, 0 is set as the control signal PSEL.

Since 0 is set in the multiplexer 522-1 as the control signal PSEL, the clock signal REF_DLY for phase detection out of the clock signals VR_SS_PD and REF_DLY is input to the TDC+Decoder 531. Meanwhile, since 0 is set in the multiplexer 522-2 as the control signal PSEL, the clock signal VR_SS for phase detection out of the clock signals VR90_SS_PD and VR_SS is input to the TDC+Decoder 531.

The TDC+Decoder 531 (time-to-digital converter 104) detects the time difference between the clock signal REF_DLY (START) for phase detection from the multiplexer 522-1 and the clock signal VR_SS (STOP) for phase detection from the multiplexer 522-2. Then, the TDC+Decoder 531 (decoder 523) outputs, to the demultiplexer 524, the detection result (TDC code) detected by the time-to-digital converter 104 and the data (output code) obtained from the arithmetic result of the average value at the time of period measurement.

In the demultiplexer 524, since 0 is set as the control signal PSEL, the data from the TDC+Decoder 531 (the data relating to the fractional phase) is output to the phase comparator 108 out of the output destinations, namely, the phase comparator 108 and the average value arithmetic unit 525. Consequently, the phase comparator 108 can find the fractional phase by applying the data from the phase detection/period measurement unit 501 to following formula (2).

[Mathematical Formula 1]

$$\text{Fractional Phase} = \left(\sum_{i=1}^{SEL} ave(QP_i)\right) \times 1/P + TDC\,\text{Code} \times 1/P \qquad (2)$$

That is, although the fractional phase is found by "SEL value×fixed value+TDC-detected fractional phase difference" in above formula (1), in formula (2), the term of "SEL value×fixed value" in formula (1) is replaced with a term constituted by a "formula for multiplying an added value of the average values (Ave(QP)) of the clock time differences for each phase by the normalization coefficient". In addition, the term of "TDC-detected fractional phase difference" in formula (1) is replaced with a term constituted by a "formula for multiplying the TDC code by the normalization coefficient" in formula (2).

Here, it is assumed as mentioned earlier that, in above formula (1), in a case where an error is included in the "fixed value", an offset is developed in the added amount to the "TDC-detected fractional phase difference" and thus accurate feedback phase information cannot be obtained. Meanwhile, in formula (2), the "fixed value" is replaced with a "constantly measured value (variable value)" such that an offset is not developed in the added amount to "TDC code×1/P", whereby a more accurate fractional phase can be obtained.

Specifically, for example, in a case where the average value arithmetic unit 525 calculates the average value Ave (QP1) as 13 stages, the average value Ave(QP2) as 16 stages, the average value Ave(QP3) as 15 stages, and the average value Ave(QP4) as 16 stages at the time of period measurement illustrated in FIG. 26, one period (P) of the feedback clock signal is given as 60 stages in the TDC+Decoder 531 (decoder 523) by adding the above average values Ave(QP). Accordingly, 1/60 is obtained as the normalization coefficient (1/P).

Figure 27:
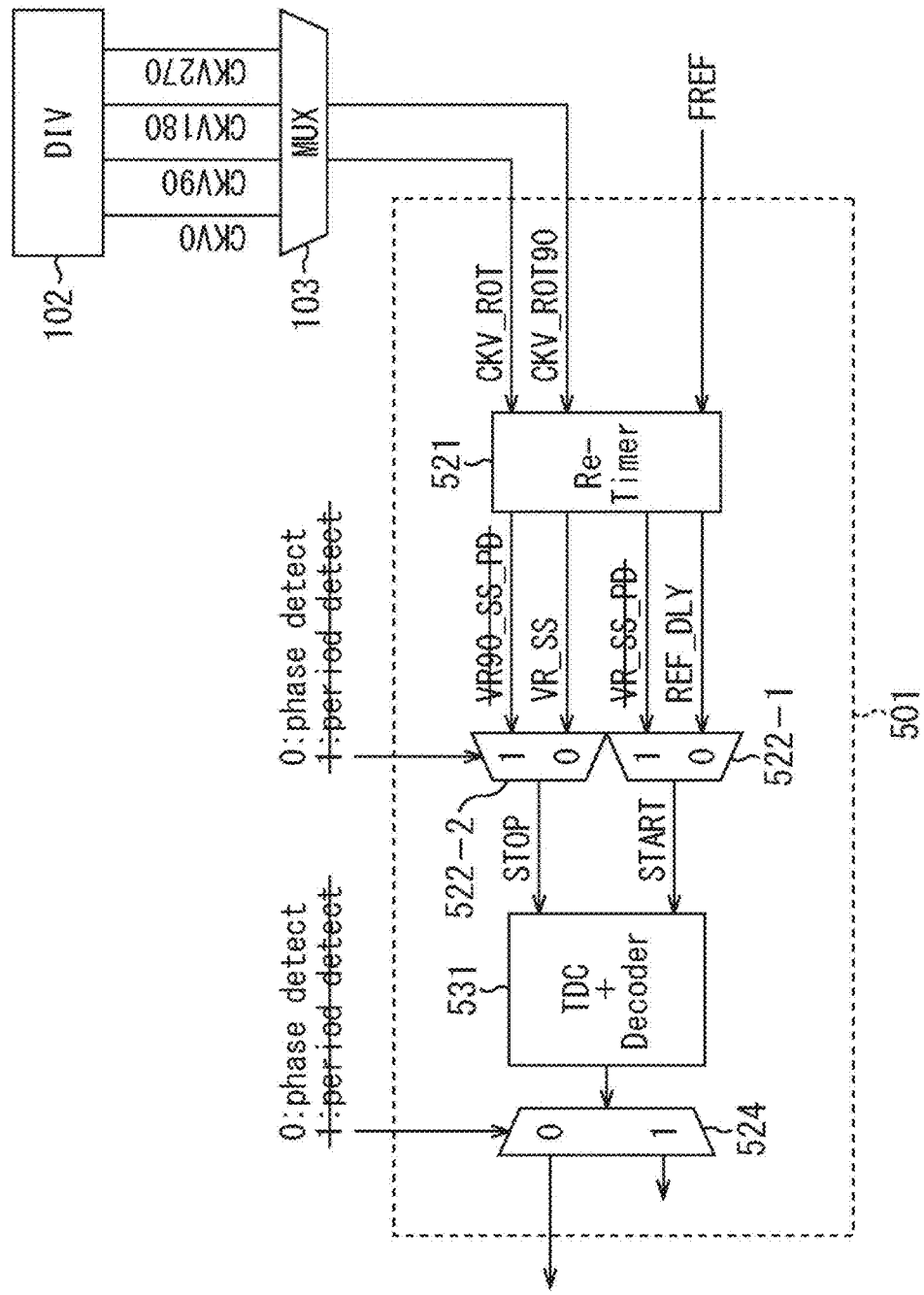
FIG. 27 is a diagram for explaining an operation at the time of phase detection by the phase detection/period measurement unit.

Meanwhile, in a case where the detection result (TDC code) of 1 is obtained by the time-to-digital converter 104 at the time of phase detection illustrated in FIG. 27 and the SEL value of 2 is set as the control signal SEL, 0.5 is obtained in the phase comparator 108 as the fractional phase by applying above formula (2). In other words, in formula (2), (13+16) is multiplied by 1/60 in line with (Ave(QP1)+Ave(QP2))×1/P and 1 is multiplied by 1/60 in line with TDC code×1/P. The resulting two values are summed up and as a consequence, the fractional phase of 0.5 is found.

As described above, when the phase detection/period measurement unit 501 performs not only the phase detection but also the period measurement, the value (sum of the average values Ave(QP)×1/P) obtained from the measurement result (TDC code) at the time of period measurement is applied to the value (TDC code×1/P) obtained from the detection result (TDC code) at the time of phase detection, whereby a more accurate fractional phase can be obtained.

(Period Measurement Using Lowering Edge of Reference Clock Signal FREF)

Next, a specific example of period measurement using the lowering edge of the reference clock signal FREF will be described with reference to FIGS. 28 and 29.

(Circuit Configuration Example)

Figure 28:
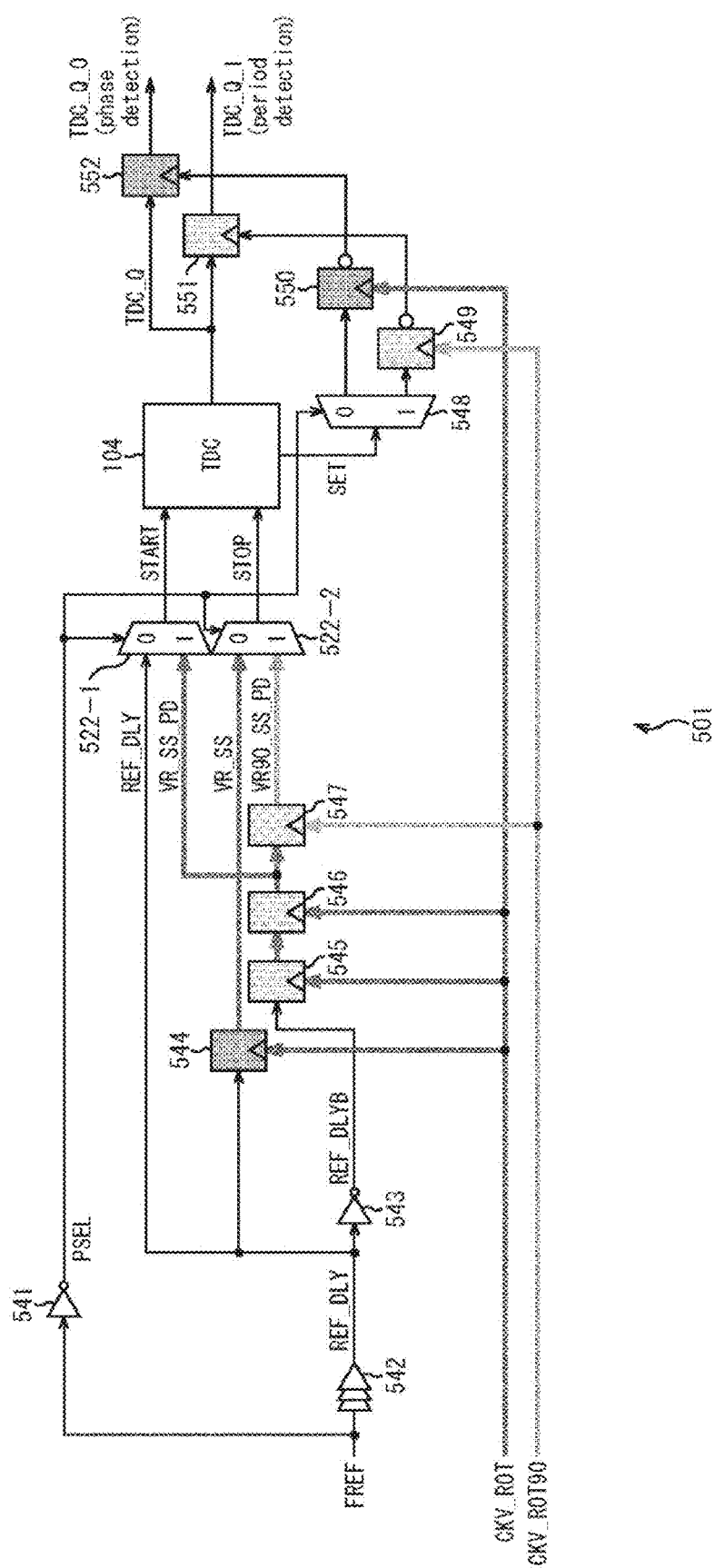
FIG. 28 is a diagram illustrating a circuit configuration example of the phase detection/period measurement unit according to the fifth embodiment.

FIG. 28 is a diagram representing a part of the configuration of the phase detection/period measurement unit 501 in FIG. 24 in a circuit form.

In FIG. 28, the phase detection/period measurement unit 501 is constituted by an inverter 541, flip-flops 544 to 547, a demultiplexer 548, and flip-flops 549 to 552 included therein, in addition to the time-to-digital converter 104 and the multiplexers 522-1 and 522-2. Note that, in FIG. 28, a buffer 542 and a delay element 543 represent delay.

That is, FIG. 28 illustrates a part of the configuration of the phase detection/period measurement unit 501 and, for example, the inverter 541, the flip-flops 544 to 547, and the like are equivalent to the retiming circuit 521 (FIG. 24). However, the illustration of the circuit configuration of the average value arithmetic unit 525 (FIG. 24) and the like is omitted for convenience of explanation.

The reference clock signal FREF is input to the inverter 541. The inverter 541 inverts the reference clock signal FREF input thereto and outputs the inverted signal as the control signal PSEL to the multiplexers 522-1 and 522-2 and the demultiplexer 548. That is, in a case where the phase detection is performed, the control signal PSEL of 0 is input to the multiplexers 52-1 and 522-2 and the demultiplexer 548 and, in a case where the period measurement is performed, the control signal PSEL of 1 is input thereto.

At the time of phase detection, the multiplexer 522-1 outputs, to the time-to-digital converter 104, the clock signal REF_DLY obtained by delaying the reference clock signal FREF by the buffer 542 in accordance with the control signal PSEL (PSEL=0).

In addition, at the time of phase detection, the multiplexer 522-2 outputs the clock signal VR_SS input via the flip-flop 544 to the time-to-digital converter 104 in accordance with the control signal PSEL (PSEL=0). However, the clock signal VR_SS is obtained in the flip-flop 544 by synchronizing the clock signal REF_DLY with the clock signal CKV_ROT.

Then, the time-to-digital converter 104 detects the time difference between the clock signal REF_DLY (START) from the multiplexer 522-1 and the clock signal VR_SS (STOP) from the multiplexer 522-2 and outputs a detection result (TDC code: TDC_Q) obtained by the detection.

Here, the time-to-digital converter 104 outputs a control signal SET of 1 to the demultiplexer 548 during its operation (during the phase detection operation). The demultiplexer 548 outputs the control signal SET from the time-to-digital converter 104 to the flip-flop 550 in accordance with the control signal PSEL (PSEL=0). The flip-flop 550 synchronizes the control signal SET with the clock signal CKV_ROT and outputs a signal obtained by the synchronization to the flip-flop 552.

Consequently, the output destination of the detection result (TDC_Q) from the time-to-digital converter 104 at the time of phase detection is assigned to the flip-flop 552. Then, in the flip-flop 552, TDC_Q_0 stored therein is replaced with the detection result (TDC_Q) from the time-to-digital converter 104 and the data is updated. That is, the data (TDC_Q_0) thus updated is output to the decoder 523 in the subsequent stage and will be used for the arithmetic operation of above-described formula (2).

Meanwhile, at the time of period measurement, the multiplexer 522-1 outputs the clock signal VR_SS_PD input via the flip-flops 545 and 546 to the time-to-digital converter 104 in accordance with the control signal PSEL (PSEL=1). However, the clock signal VR_SS_PD is obtained in the flip-flops 545 and 546 in such a manner that a clock signal REF_DLYB obtained by delaying the clock signal REF_DLY by the delay element 543 is synchronized with the clock signal CKV_ROT.

In addition, at the time of period measurement, the multiplexer 522-2 outputs the clock signal VR90_SS_PD input via the flip-flop 547 to the time-to-digital converter 104 in accordance with the control signal PSEL (PSEL=1). However, the clock signal VR90_SS_PD is obtained in the flip-flop 547 by synchronizing the clock signal REF_DLYB with the clock signal CKV_ROT90.

Then, the time-to-digital converter 104 measures the time difference between the clock signal VR_SS_PD (START) from the multiplexer 522-1 and the clock signal VR90_SS_PD (STOP) from the multiplexer 522-2 and outputs a measurement result (TDC code: TDC_Q) obtained by the measurement.

Here, as described above, while the time-to-digital converter 104 outputs the control signal SET of 1 during its operation (during the period measurement operation), the demultiplexer 548 outputs the control signal SET to the flip-flop 549 in accordance with the control signal PSEL (PSEL=1). The flip-flop 549 synchronizes the control signal SET with the clock signal CKV_ROT90 and outputs a signal obtained by the synchronization to the flip-flop 551.

Consequently, the output destination of the measurement result (TDC_Q) from the time-to-digital converter 104 at the time of period measurement is assigned to the flip-flop 551. Then, in the flip-flop 551, TDC_Q_1 stored therein is replaced with the measurement result (TDC_Q) from the time-to-digital converter 104 and the data is updated. That is, the data (TDC_Q_1) thus updated is output to the decoder 523 in the subsequent stage and will be used for the arithmetic operation of the average value (Ave(QP)) for each phase by the average value arithmetic unit 525.

(Phase Detection and Period Measurement Operations)

Next, operations at the time of phase detection and period measurement by the phase detection/period measurement unit 501 in FIG. 28 will be described with reference to a timing chart in FIG. 29.

Figure 29:
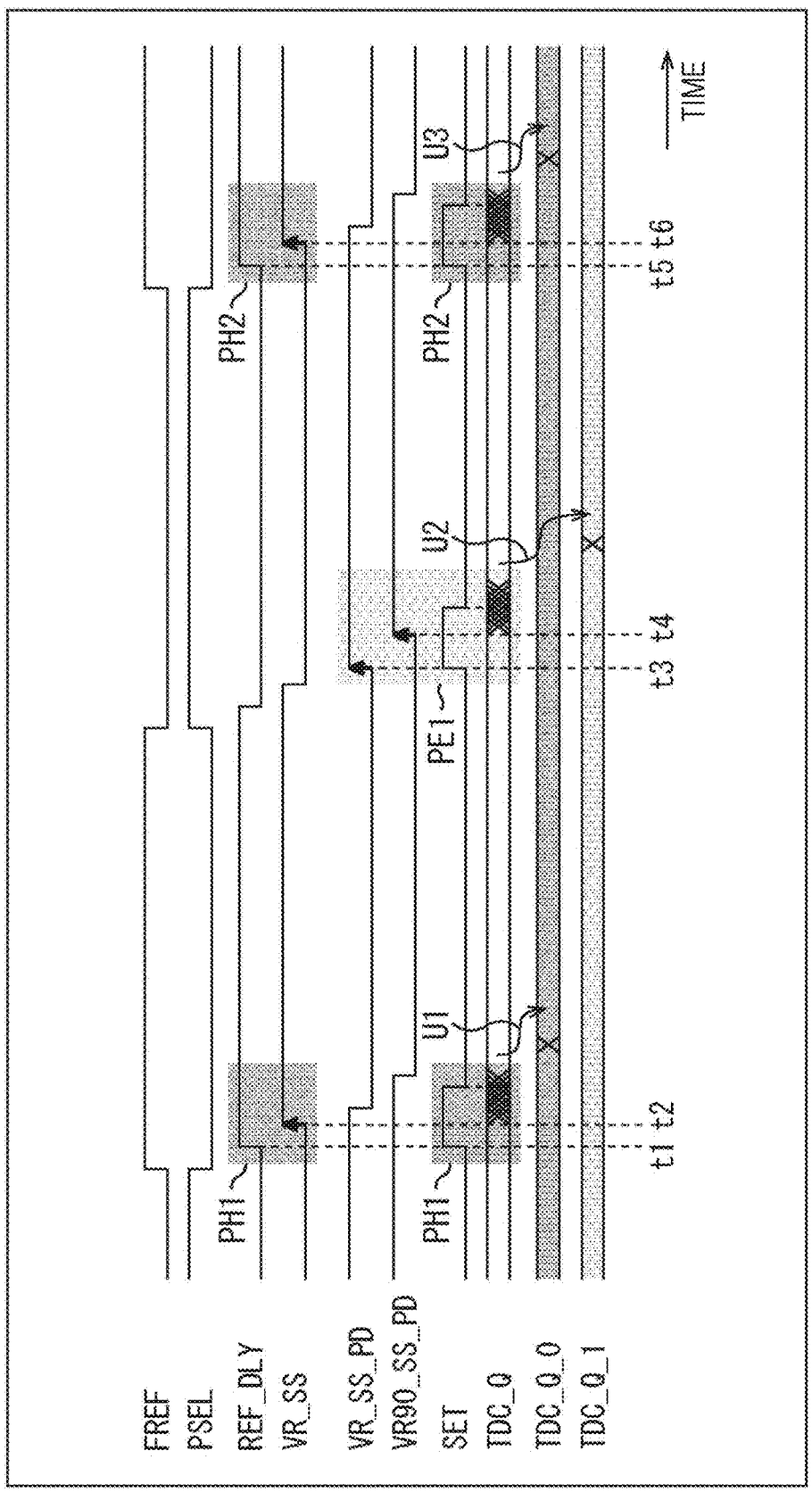
FIG. 29 is a timing chart illustrating the operation of the phase detection/period measurement unit in FIG. 28 at the time of phase detection and period measurement.

In FIG. 29, since the control signal PSEL is a signal obtained by inverting the reference clock signal FREF, 0 and 1 are reversed in these signals. That is, in FIG. 29, an interval in which PSEL=0 (FREF=1) is given means an interval in which the phase detection (PH) is performed, whereas an interval in which PSEL=1 (FREF=0) is given means an interval in which the period detection (PE) is performed.

For example, initially, a first interval in which PSEL=0 is given is a phase detection interval and the time difference between the clock signals REF_DLY and VR_SS (t2–t1) is detected by the time-to-digital converter 104 ("PH1" in FIG. 29). In addition, the output destination of the detection result (TDC_Q) from the time-to-digital converter 104 is defined according to the control signals PSEL and SET ("PH1" in FIG. 29)

As a result, the data of TDC_Q_0 is updated by the detection result (TDC_Q) from the time-to-digital converter 104 ("U1" in FIG. 29).

Next, a second interval following the first interval, in which PSEL=1 is given, is a period measurement interval and the time difference between the clock signals VR_SS_PD and VR90_SS_PD (t4–t3) is measured by the time-to-digital converter 104 ("PE1" in FIG. 29). In addition, the output destination of the measurement result (TDC_Q) from the time-to-digital converter 104 is defined according to the control signals PSEL and SET. As a result, the data of TDC_Q_1 is updated by the measurement result (TDC_Q) from the time-to-digital converter 104 ("U2" in FIG. 29).

Next, a third interval following the second interval, in which PSEL=0 is given, is a phase detection interval and the time difference between the clock signals REF_DLY and VR_SS (t6–t5) is detected by the time-to-digital converter 104 ("PH2" in FIG. 29). Consequently, the data of TDC_Q_0 is updated by the detection result (TDC_Q) from the time-to-digital converter 104 ("U3" in FIG. 29).

Note that, although no further explanation will be given because the same explanation will be repeated, the interval for phase detection with PSEL=0 and the interval for period measurement with PSEL=1 are alternately repeated in intervals subsequent to the third interval. Then, in the phase detection interval, the data of TDC_Q_0 is updated by the detection result (TDC_Q) obtained from the time difference between the clock signals REF_DLY (START) and VR_SS (STOP), whereas, in the period measurement interval, the data of TDC_Q_1 is updated by the measurement result (TDC_Q) obtained from the time difference between the clock signals VR_SS_PD (START) and VR90_SS_PD (STOP)

In this manner, in the example illustrated in FIGS. 28 and 29, the control signal PSEL obtained by inverting the reference clock signal FREF is used to utilize the lowering edge of the reference clock signal FREF such that an interval in which PSEL=1 (FREF=0) is given is specified as an interval for period measurement and the period measurement is performed by the phase detection/period measurement unit 501.

As described above, in the phase detection/period measurement unit 501 of the phase locked loop 50 of the fifth embodiment, the period measurement is performed together with the phase detection such that the fractional phase can be found by above formula (2), whereby the possibility of including an error like the "fixed value" in above formula (1) is eliminated and a more accurate fractional phase can be found.

Furthermore, since the phase detection/period measurement unit 501 of the fifth embodiment is enabled to function for both of phase detection and period measurement, the same circuit can be used for phase detection and period measurement such that low power consumption can be achieved by suppressing the circuit area.

Note that, in order to perform the period measurement together with the phase detection, the phase locked loop 50 (FIG. 24) of the fifth embodiment is provided with the phase detection/period measurement unit 501 instead of the time-to-digital converter 104 and the retiming circuit 105, as compared with the phase locked loop 10 (FIG. 1) of the first embodiment, but has a basically similar configuration. That is, also in the phase locked loop 50 of the fifth embodiment, similar effects to those of the phase locked loop 10 of the first embodiment can be exerted, including an effect of enabling the reduction of the circuit area and power consumption of the time-to-digital converter 104 by using the time-to-digital converter 104 having a narrow detection range because of a shortened delay line, for example.

<6. Sixth Embodiment>

Incidentally, the fifth embodiment described above has indicated an example in which a signal obtained by inverting the reference clock signal FREF by the inverter 541 is used as the control signal PSEL to be input to the multiplexers 522-1 and 522-2 and the demultiplexer 548. However, the control signal PSEL may be generated by another method. A method of generating the control signal PSEL by delaying the reference clock signal FREF will be described here as a sixth embodiment.

(Configuration of Phase Detection/Period Measurement Unit)

Figure 30:
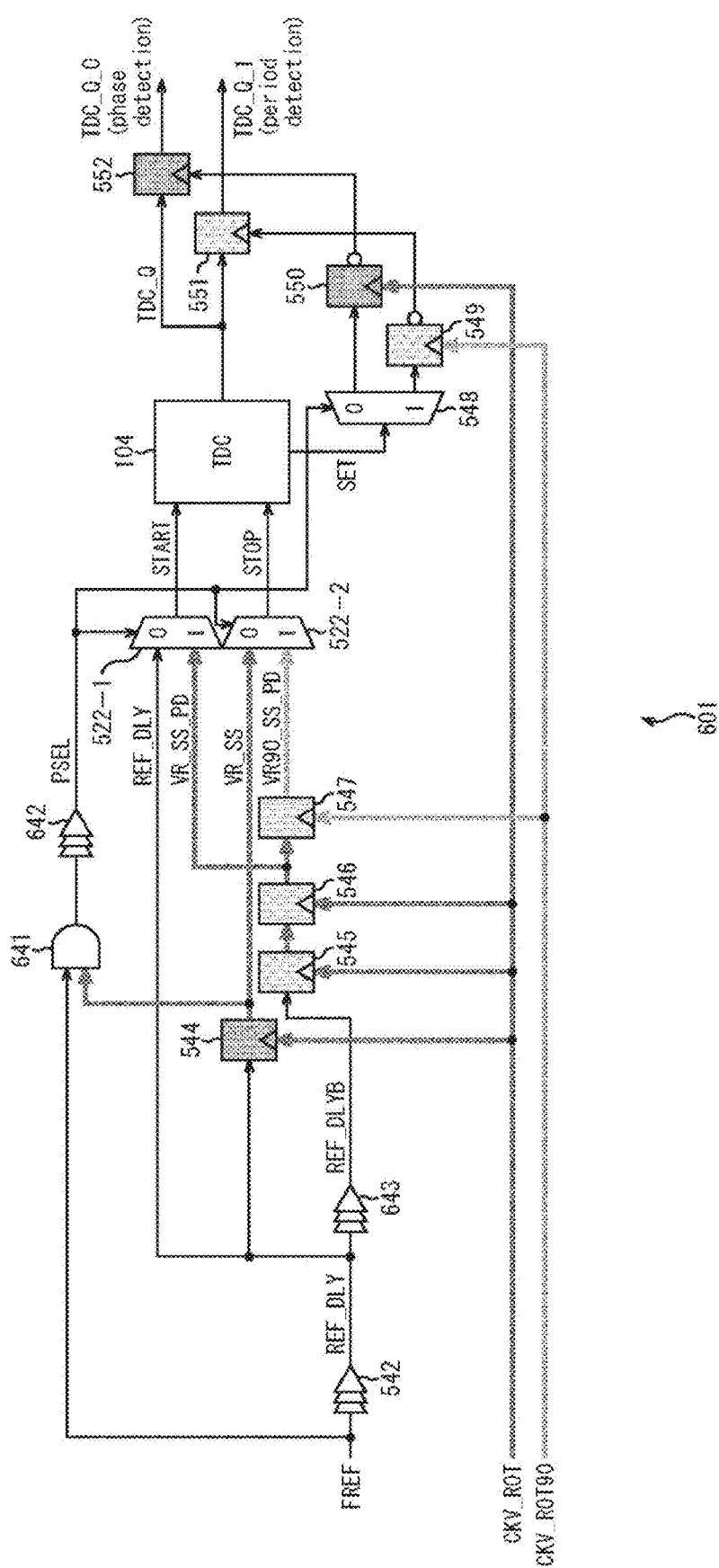
FIG. 30 is a diagram illustrating a circuit configuration example of a phase detection/period measurement unit according to a sixth embodiment.

FIG. 30 is a diagram illustrating the configuration of a phase detection/period measurement unit in a phase locked loop to which the present technology is applied according to an embodiment (sixth embodiment).

In FIG. 30, the phase detection/period measurement unit 601 is provided with a logic circuit 641 instead of the inverter 541, as compared with the phase detection/period measurement unit 501 in FIG. 28. In addition, a buffer 642 represents delay. Note that, in the phase detection/period measurement unit 601 in FIG. 30, the same parts as those of the phase detection/period measurement unit 501 in FIG. 28 are denoted by the same reference numerals and the description thereof will be omitted as appropriate.

The reference clock signal FREF and the clock signal VR_SS are input to the logic circuit 641. The logic circuit 641 waits for the completion of the operation of a time-to-digital converter 104 at the time of phase detection in accordance with the clock signal VR_SS such that the control signal PSEL obtained by delaying the reference clock signal FREF is output. That is, as the control signal PSEL obtained by delaying the reference clock signal FREF in this manner, the control signal PSEL of 0 will be output in a case where the phase detection is performed and the control signal PSEL of 1 will be output in a case where the period measurement is performed.

Therefore, at the time of phase detection, the clock signal REF_DLY from a multiplexer 522-1 and the clock signal VR_SS from a multiplexer 522-2 are input to the time-to-digital converter 104. The time-to-digital converter 104 detects the time difference between the clock signals REF_DLY (START) and VR_SS (STOP) and outputs a detection result (TDC code: TDC_Q) obtained by the detection.

Then, since the output destination of the detection result (TDC_Q) from the time-to-digital converter 104 at the time of phase detection is assigned to a flip-flop 552, TDC_Q_0 stored therein is replaced with TDC_Q and the data is updated. That is, the data (TDC_Q_0) thus updated is output to a decoder 523 in the subsequent stage and will be used for the arithmetic operation of above-described formula (2).

Meanwhile, at the time of period measurement, the clock signal VR_SS_PD from the multiplexer 522-1 and the clock signal VR90_SS_PD from the multiplexer 522-2 are input to the time-to-digital converter 104. The time-to-digital converter 104 measures the time difference between the clock signals VR_SS_PD (START) and VR90_SS_PD (STOP) and outputs a measurement result (TDC code: TDC_Q) obtained by the measurement.

Then, since the output destination of the measurement result (TDC_Q) from the time-to-digital converter 104 at the time of period measurement is assigned to a flip-flop 551, TDC_Q_1 stored therein is replaced with TDC_Q and the data is updated. That is, the data (TDC_Q_1) thus updated is output to the decoder 523 in the subsequent stage and will be used for the arithmetic operation of the average value (Ave(QP)) for each phase by an average value arithmetic unit 525.

(Phase Detection and Period Measurement Operations)

Next, operations at the time of phase detection and period measurement by the phase detection/period measurement unit 601 in FIG. 30 will be described with reference to a timing chart in FIG. 31.

Figure 31:
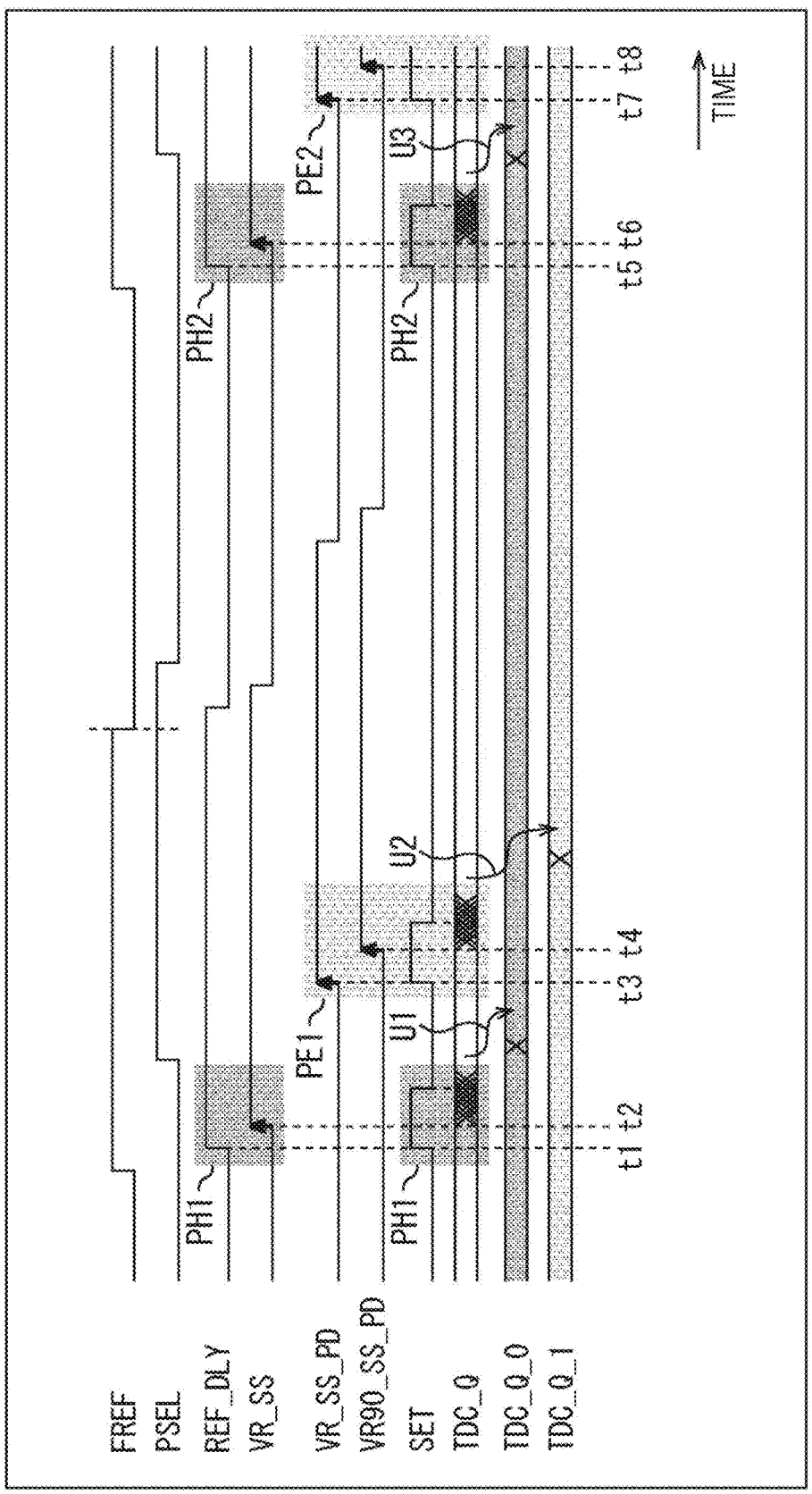
FIG. 31 is a timing chart illustrating the operation of the phase detection/period measurement unit in FIG. 30 at the time of phase detection and period measurement.

In FIG. 31, the control signal PSEL is a signal obtained by delaying the reference clock signal FREF and, when the operation of the time-to-digital converter 104 at the time of phase detection is completed, the control signal PSEL is switched from 0 to 1. That is, in FIG. 31, an interval in which PSEL=0 (FREF=1) is given means an interval in which the phase detection (PH) is performed, whereas an interval in which PSEL=1 (FREF=1) is given means an interval in which the period measurement (PE) is performed.

For example, initially, a first interval in which PSEL=0 (FREF=1) is given is a phase detection interval and the time difference between the clock signals REF_DLY and VR_SS (t2–t1) is detected by the time-to-digital converter 104 ("PH1" in FIG. 31). In addition, the output destination of the detection result (TDC_Q) from the time-to-digital converter 104 is defined according to the control signals PSEL and SET ("PH1" in FIG. 31)

As a result, the data of TDC_Q_0 is updated by the detection result (TDC_Q) from the time-to-digital converter 104 ("U1" in FIG. 31).

Next, a second interval following the first interval, in which PSEL=1 (FREF=1) is given, is a period measurement interval and the time difference between the clock signals VR_SS_PD and VR90_SS_PD (t4–t3) is measured by the time-to-digital converter 104 ("PE1" in FIG. 31). In addition, the output destination of the measurement result (TDC_Q) from the time-to-digital converter 104 is defined according to the control signals PSEL and SET. As a result, the data of TDC_Q_1 is updated by the measurement result (TDC_Q) from the time-to-digital converter 104 ("U2" in FIG. 31).

Next, a third interval following the second interval, in which PSEL=0 (FREF=1) is given, is a phase detection interval and the time difference between the clock signals REF_DLY and VR_SS (t6–t5) is detected by the time-to-digital converter 104 ("PH2" in FIG. 31). Then, the data of TDC_Q_0 is updated by the detection result (TDC_Q) from the time-to-digital converter 104 ("U3" in FIG. 31).

Next, a fourth interval following the third interval, in which PSEL=1 (FREF=1) is given, is a period measurement interval and the time difference between the clock signals VR_SS_PD and VR90_SS_PD (t8–t7) is measured by the time-to-digital converter 104 ("PE2" in FIG. 31). Then, the data of TDC_Q_1 is updated by the measurement result (TDC_Q) from the time-to-digital converter 104.

Note that, although no further explanation will be given because the same explanation will be repeated, the interval for phase detection with PSEL=0 (FREF=1) and the interval for period measurement with PSEL=1 (FREF=1) are alternately repeated in intervals subsequent to the fourth interval. Then, in the phase detection interval, the data of TDC_Q_0 is updated by the detection result (TDC_Q) obtained from the time difference between the clock signals REF_DLY (START) and VR_SS (STOP), whereas, in the period measurement interval, the data of TDC_Q_1 is updated by the measurement result (TDC_Q) obtained from the time difference between the clock signals VR_SS_PD (START) and VR90_SS_PD (STOP).

In this manner, in the example illustrated in FIGS. 30 and 31, the control signal PSEL obtained by delaying the reference clock signal FREF is generated after the operation of the time-to-digital converter 104 at the time of phase detection is completed such that an interval in which PSEL=1 (FREF=1) is given is specified as an interval for period measurement and the period measurement is performed by the phase detection/period measurement unit 601. Therefore, unlike the phase detection/period measurement unit 501 (FIG. 28), in the phase detection/period measurement unit 601 in FIG. 30, the operation at the time of period measurement is started instantly after the operation of the time-to-digital converter 104 at the time of phase detection is completed.

As described above, in the phase detection/period measurement unit 601 in the phase locked loop of the sixth embodiment, the period measurement is performed together with the phase detection such that the fractional phase can be found by above formula (2), whereby the possibility of including an error like the "fixed value" in above formula (1) is eliminated and a more accurate fractional phase can be found.

<7. Seventh Embodiment>

Incidentally, in the fifth and the sixth embodiments described above, the time-to-digital converter 104 is used for both of phase detection and period measurement. However, different time-to-digital converters 104 may be used at the time of phase detection and period measurement. Thus, a configuration in which a time-to-digital converter 104 for period measurement is provided in addition to a time-to-digital converter 104 for phase detection will be described as a seventh embodiment.

(Configuration of Phase Detection/Period Measurement Unit)

Figure 32:
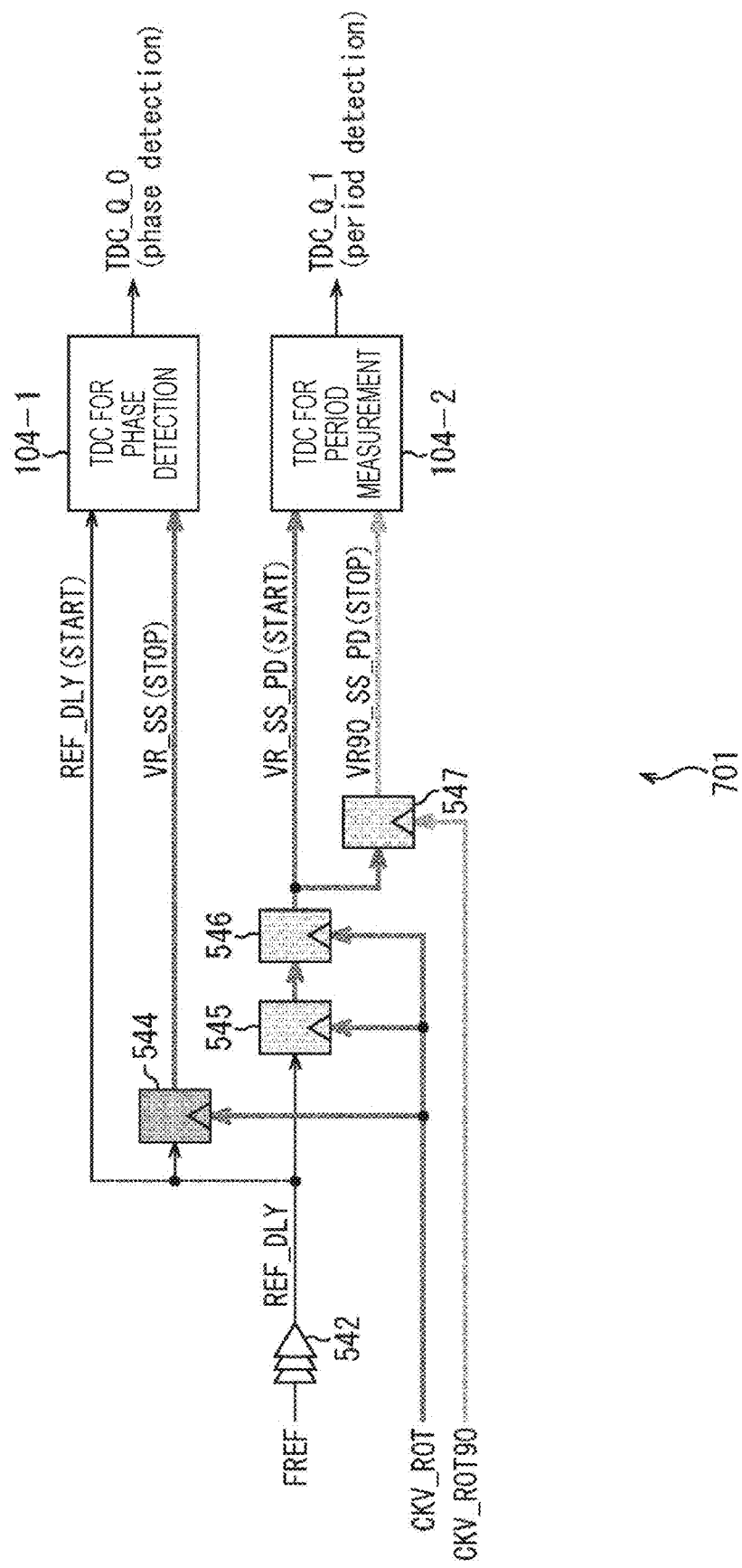
FIG. 32 is a diagram illustrating a circuit configuration example of a phase detection/period measurement unit according to a seventh embodiment.

FIG. 32 is a diagram illustrating the configuration of a phase detection/period measurement unit in a phase locked loop to which the present technology is applied according to an embodiment (seventh embodiment).

In FIG. 32, the phase detection/period measurement unit 701 is constituted by a time-to-digital converter 104-1 for phase detection and a time-to-digital converter 104-2 for period measurement included therein. Note that flip-flops 544 to 547 are provided in the phase detection/period measurement unit 701 in FIG. 32 as in the phase detection/period measurement unit 501 in FIG. 28. In addition, a buffer 542 represents delay.

The time-to-digital converter 104-1 is a TDC for phase detection, to which the clock signals REF_DLY and VR_SS are input. The time-to-digital converter 104-1 detects the time difference between the clock signals REF_DLY (START) and VR_SS (STOP) and outputs a detection result (TDC code: TDC_Q_0) obtained by the detection. Then, this detection result (TDC_Q_0) will be used for the arithmetic operation of above-described formula (2) in the subsequent stage.

The time-to-digital converter 104-2 is a TDC for period measurement, to which the clock signals VR_SS_PD and VR90_SS_PD are input. The time-to-digital converter 104-2 measures the time difference between the clock signals VR_SS_PD (START) and VR90_SS_PD (STOP) and outputs a measurement result (TDC code: TDC_Q_1) obtained as a result of the measurement. Then, this measurement result (TDC_Q_1) will be used for the arithmetic operation of the average value (Ave(QP)) in the subsequent stage.

Note that, although the time-to-digital converters 104-1 and 104-2 are used for different purposes for phase detection and period measurement, the time-to-digital converters 104-1 and 104-2 have the same configuration and are configured in a similar manner to the time-to-digital converter 104 described above.

(Phase Detection and Period Measurement Operations)

Next, operations at the time of phase detection and period measurement by the phase detection/period measurement unit 701 in FIG. 32 will be described with reference to a timing chart in FIG. 33.

However, in the seventh embodiment, unlike the fifth and sixth embodiments described above, the time-to-digital converter 104 is not used at both the time of phase detection and the time of period measurement and separate time-to-digital converters 104 for phase detection and for period measurement are provided. Accordingly, it is not necessary to use the control signals PSEL and SET and TDC_Q and descriptions thereof are excluded.

Figure 33:
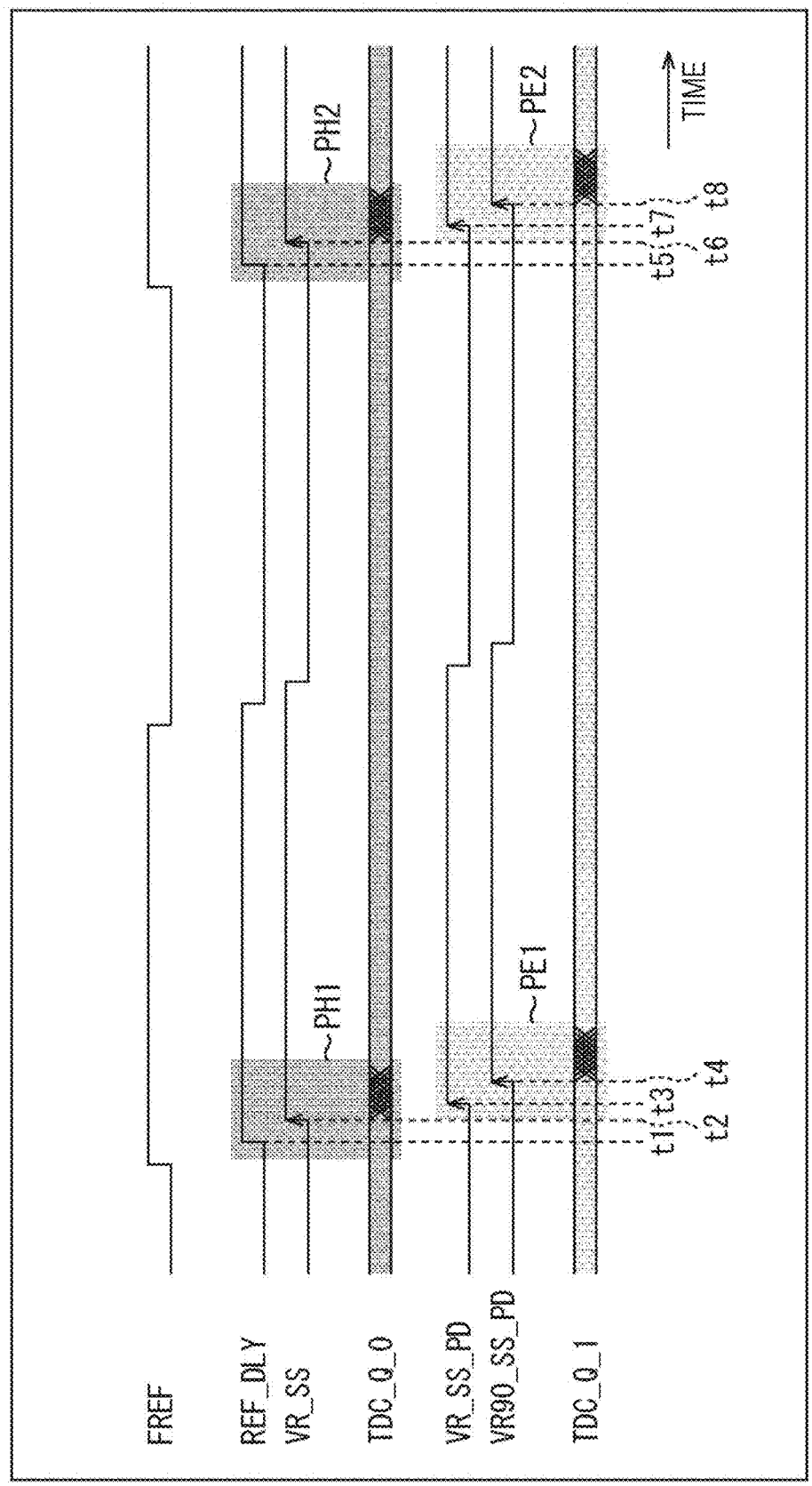
FIG. 33 is a timing chart illustrating the operation of the phase detection/period measurement unit in FIG. 32 at the time of phase detection and period measurement.

For example, in FIG. 33, initially, a first interval in which FREF=1 is given is a phase detection interval and the time difference between the clock signals REF_DLY and VR_SS (t2–t1) is detected by the time-to-digital converter 104-1 for phase detection ("PH1" in FIG. 33). Then, the detection result (TDC_Q_0) by the time-to-digital converter 104-1 for phase detection is output as it is to the subsequent stage.

In addition, while the first interval is a phase detection interval, it is also a period measurement interval. Accordingly, the time difference between the clock signals VR_SS_PD and VR90_SS_PD (t4–t3) is measured by the time-to-digital converter 104-2 for period measurement ("PE1" in FIG. 33). Then, the measurement result (TDC_Q_1) by the time-to-digital converter 104-2 for period measurement is output as it is to the subsequent stage.

Thereafter, a second interval in which FREF=1 is given after the first interval is a phase detection interval and the time difference between the clock signals REF_DLY and VR_SS (t6–t5) is detected by the time-to-digital converter 104-1 for phase detection ("PH2" in FIG. 33). Then, the detection result (TDC_Q_0) by the time-to-digital converter 104-1 for phase detection is output as it is to the subsequent stage.

In addition, while the second interval is a phase detection interval, it is also a period measurement interval. Accordingly, the time difference between the clock signals VR_SS_PD and VR90_SS_PD (t8–t7) is measured by the time-to-digital converter 104-2 for period measurement ("PE2" in FIG. 33). Then, the measurement result (TDC_Q_1) by the time-to-digital converter 104-2 for period measurement is output as it is to the subsequent stage.

Note that, although no further explanation will be given because the same explanation will be repeated, the interval in which FREF=1 is given is specified as an interval for phase detection and period measurement for intervals subsequent to the second interval. Then, in the interval in which FREF=1 is given, the detection result (TDC_Q_0) obtained from the time difference between the clock signals REF_DLY (START) and VR_SS (STOP) and the measurement result (TDC_Q_1) obtained from the time difference between the clock signals VR_SS_PD (START) and VR90_SS_PD (STOP) are individually obtained.

In this manner, in the example illustrated in FIGS. 32 and 33, since the time-to-digital converter 104-1 for phase detection and the time-to-digital converter 104-2 for period measurement are provided such that the phase detection and the period measurement are performed by different time-to-digital converters 104, the phase detection and the period measurement can be performed in parallel in the interval in which FREF=1 is given. In addition, since the phase detection and the period measurement are performed separately in the time-to-digital converters 104, there is no need to provide the multiplexers 522-1 and 522-2 (FIG. 28), the demultiplexer 548 (FIG. 28), and the like.

As described above, in the phase detection/period measurement unit 701 in the phase locked loop of the seventh embodiment, the phase detection is performed by the first time-to-digital converter 104-1 while the period measurement is performed by the second time-to-digital converter 104-2 such that the fractional phase can be found by above formula (2), whereby the possibility of including an error like the "fixed value" in above formula (1) is eliminated and a more accurate fractional phase can be found.

<8. Eighth Embodiment>

Incidentally, the fifth and sixth embodiments described above have exemplified methods of generating the control signal PSEL using the reference clock signal FREF. However, an enable signal in the phase locked loop (ADPLL circuit) may be used to generate the control signal PSEL. Hereinafter, such a configuration will be described as an eighth embodiment.

(Configuration of Phase Detection/Period Measurement Unit)

Figure 34:
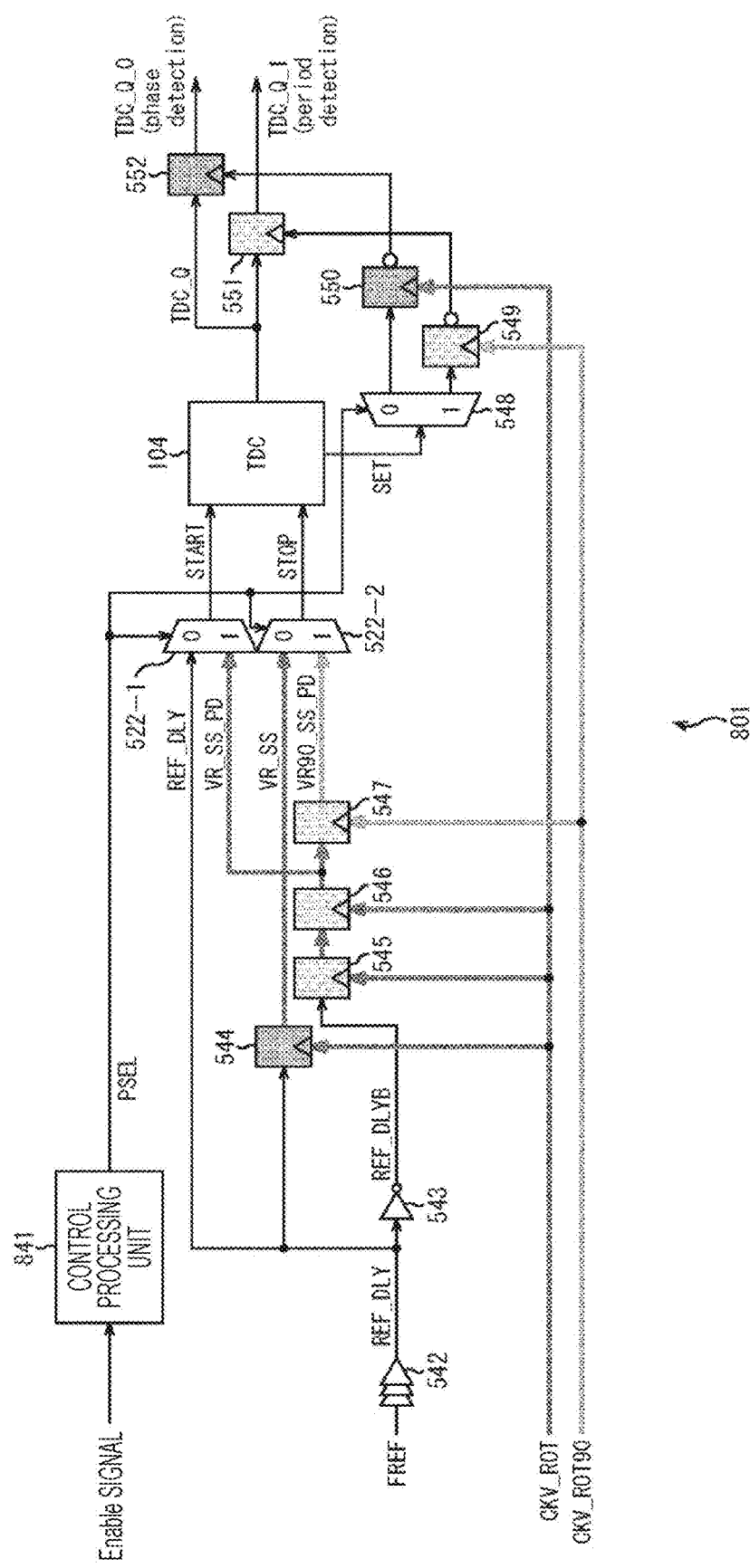
FIG. 34 is a diagram illustrating a circuit configuration example of a phase detection/period measurement unit according to an eighth embodiment.

FIG. 34 is a diagram illustrating the configuration of a phase detection/period measurement unit in a phase locked loop to which the present technology is applied according to an embodiment (eighth embodiment).

In FIG. 34, the phase detection/period measurement unit 801 is provided with a control processing unit 841 instead of the inverter 541, as compared with the phase detection/period measurement unit 501 in FIG. 28. Note that, in the phase detection/period measurement unit 801 in FIG. 34, the same parts as those of the phase detection/period measurement unit 501 in FIG. 28 are denoted by the same reference numerals and the description thereof will be omitted as appropriate.

An enable signal of the phase locked loop (ADPLL circuit) is input to the control processing unit 841. On the basis of the enable signal, the control processing unit 841 causes the control signal PSEL of 1 to be output only when the phase locked loop is activated. That is, as the control signal PSEL according to such an enable signal, the control signal PSEL of 1 for performing the period measurement will be output only when the phase locked loop is activated and, in the other durations, the control signal PSEL of 0 for performing the phase detection will be output.

Therefore, at the time of phase detection, the clock signal REF_DLY from a multiplexer 522-1 and the clock signal VR_SS from a multiplexer 522-2 are input to a time-to-digital converter 104. The time-to-digital converter 104 detects the time difference between the clock signals REF_DLY (START) and VR_SS (STOP) and outputs a detection result (TDC code: TDC_Q) obtained by the detection.

Then, since the output destination of the detection result (TDC_Q) from the time-to-digital converter 104 at the time of phase detection is assigned to a flip-flop 552, TDC_Q_0 stored therein is replaced with TDC_Q and the data is updated. That is, the data (TDC_Q_0) thus updated is output to a decoder 523 in the subsequent stage and will be used for the arithmetic operation of above-described formula (2).

Meanwhile, at the time of period measurement, the clock signal VR_SS_PD from the multiplexer 522-1 and the clock signal VR90_SS_PD from the multiplexer 522-2 are input to the time-to-digital converter 104. The time-to-digital converter 104 measures the time difference between the clock signals VR_SS_PD (START) and VR90_SS_PD (STOP) and outputs a measurement result (TDC code: TDC_Q) obtained by the measurement.

Then, since the output destination of the measurement result (TDC_Q) from the time-to-digital converter 104 at the time of period measurement is assigned to a flip-flop 551, TDC_Q_1 stored therein is replaced with TDC_Q and the data is updated. That is, the data (TDC_Q_1) thus updated is output to the decoder 523 in the subsequent stage and will be used for the arithmetic operation of the average value (Ave(QP)) for each phase by an average value arithmetic unit 525.

(Phase Detection and Period Measurement Operations)

Next, operations at the time of phase detection and period measurement by the phase detection/period measurement unit 801 in FIG. 34 will be described with reference to a timing chart in FIG. 35.

Figure 35:
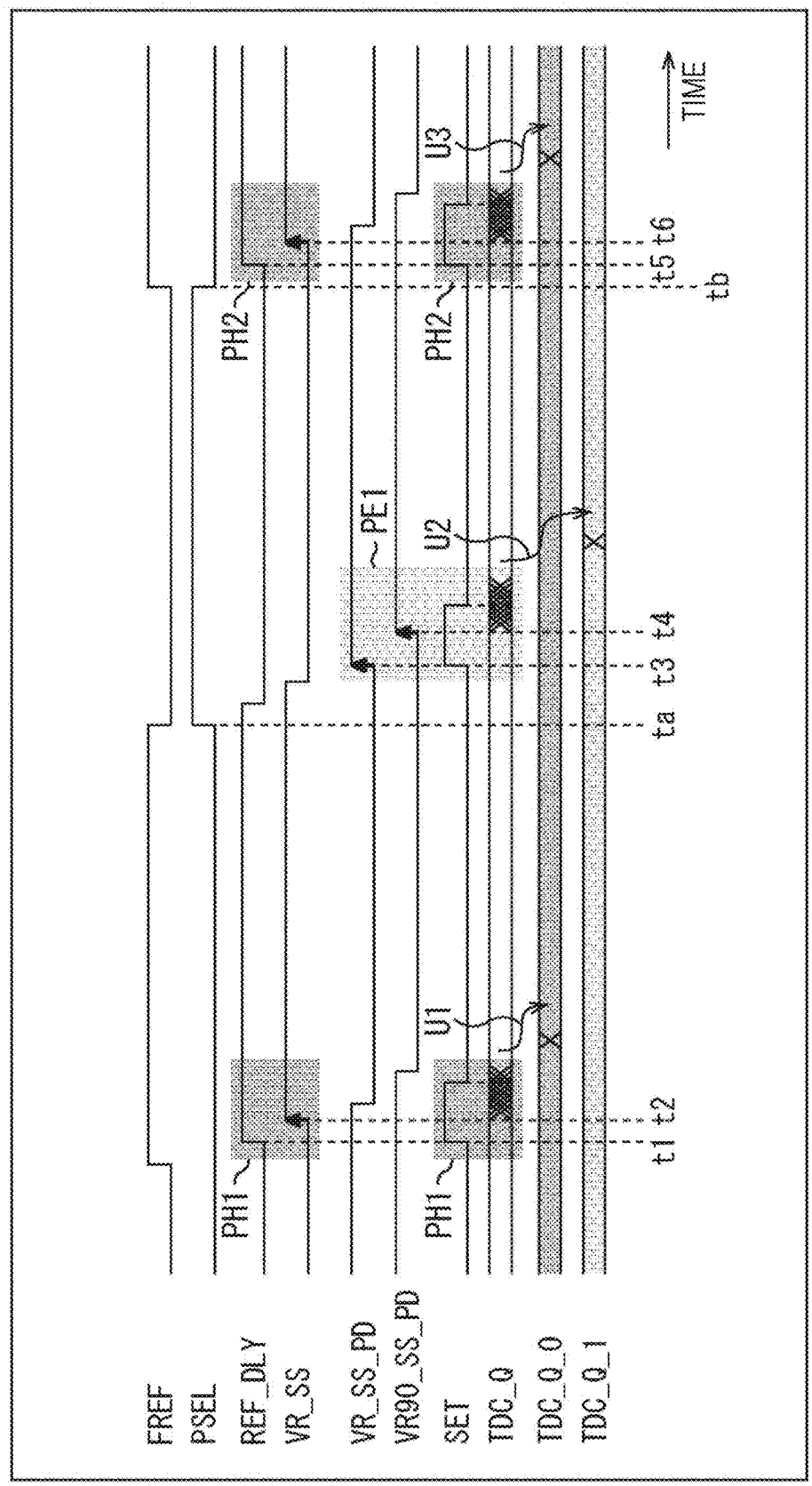
FIG. 35 is a timing chart illustrating the operation of the phase detection/period measurement unit in FIG. 34 at the time of phase detection and period measurement.

In FIG. 35, the control signal PSEL is a signal according to the enable signal and the control signal PSEL is switched from 0 to 1 at a timing when the phase locked loop (ADPLL circuit) is activated. That is, in FIG. 35, an interval from time ta to time tb is an interval in which the phase locked loop (ADPLL circuit) is activated and is specified as an interval in which the period measurement is performed (an interval in which PSEL=1 is given).

For example, a first interval before the time ta, in which PSEL=0 (FREF=1) is given, is a phase detection interval and the time difference between the clock signals REF_DLY and VR_SS (t2−t1) is detected by the time-to-digital converter 104 ("PH1" in FIG. 35). In addition, the output destination of the detection result (TDC_Q) from the time-to-digital converter 104 is defined according to the control signals PSEL and SET ("PH1" in FIG. 35). As a result, the data of TDC_Q_0 is updated by the detection result (TDC_Q) from the time-to-digital converter 104 ("U1" in FIG. 35).

Next, a second interval following the first interval from the time ta to the time tb, in which PSEL=1 (FREF=0) is given, is a period measurement interval and the time difference between the clock signals VR_SS_PD and VR90_SS_PD (t4−t3) is measured by the time-to-digital converter 104 ("PE1" in FIG. 35). In addition, the output destination of the measurement result (TDC_Q) from the time-to-digital converter 104 is defined according to the control signals PSEL and SET. As a result, the data of TDC_Q_1 is updated by the measurement result (TDC_Q) from the time-to-digital converter 104 ("U2" in FIG. 35).

Next, a third interval following the second interval after the time tb, in which PSEL=0 (FREF=1) is given, is a phase detection interval and the time difference between the clock signals REF_DLY and VR_SS (t6−t5) is detected by the time-to-digital converter 104 ("PH2" in FIG. 35). Then, the data of TDC_Q_0 is updated by the detection result (TDC_Q) from the time-to-digital converter 104 ("U3" in FIG. 35).

Note that, although no further explanation will be given because the same explanation will be repeated, intervals subsequent to the third interval include the interval for period measurement according to the enable signal with PSEL=1, in addition to the interval for phase detection with PSEL=0. Then, in the phase detection interval, the data of TDC_Q_0 is updated by the detection result (TDC_Q) obtained from the time difference between the clock signals REF_DLY (START) and VR_SS (STOP), whereas, in the period measurement interval, the data of TDC_Q_1 is updated by the measurement result (TDC_Q) obtained from the time difference between the clock signals VR_SS_PD (START) and VR90_SS_PD (STOP).

In this manner, in the example illustrated in FIGS. 34 and 35, the control signal PSEL according to the enable signal in the phase locked loop (ADPLL circuit) is generated such that an interval in which PSEL=1 is given is specified as an interval for period measurement and the period measurement is performed by the phase detection/period measurement unit 801. Therefore, in the phase detection/period measurement unit 801 in FIG. 34, the operation at the time of period measurement is started when the phase locked loop is activated.

As described above, in the phase detection/period measurement unit 801 in the phase locked loop of the eighth embodiment, the period measurement is performed together with the phase detection such that the fractional phase can be found by above formula (2), whereby the possibility of including an error like the "fixed value" in above formula (1) is eliminated and a more accurate fractional phase can be found.

Note that the following technology is cited as a conventional technology for measuring and normalizing one period of the feedback clock signal (period normalization). That is, a time-to-digital converter (TDC) measures one period of the feedback clock signal and uses the reciprocal of a value obtained by averaging the measured periods, as the normalization coefficient. Then, during the phase detection, the fractional phase is detected by multiplying the fractional phase information obtained by the time-to-digital converter (TDC) by the above normalization coefficient. For example, in a case where one period is assumed to include 60 stages as the number of TDC stages, the normalization coefficient is specified as 1/60 which is the reciprocal thereof. In addition, assuming that a TDC code of 30 is obtained as the fractional phase information, a fractional phase of 0.5 (=30×1/60) is obtained. Furthermore, by ensuring the period normalization to be performed at a time different from the phase detection, errors in the gain of the time-to-digital converter (TDC) varying depending on the PVT are suppressed.

However, in a case where such a conventional technology (periodic normalization) is adopted, in order to cover one period of the feedback clock signal, a delay line constituted by a large number of delay elements and a large number of flip-flops corresponding to the delay elements need to be prepared and it is difficult to reduce the circuit area and power consumption of the time-to-digital converter (TDC). In addition, a circuit configuration in which multistage delay elements are linked leads to deterioration of nonlinearity of the time-to-digital converter (TDC), especially integral nonlinearity (INL). The degradation of the INL of the time-to-digital converter (TDC) causes a fractional spurious (fractional-spur) occurring near an output frequency of the time-to-digital converter (TDC).

On the other hand, in the phase locked loops according to the fifth to eighth embodiments, similarly to the phase locked loop 10 (FIG. 1) of the first embodiment, and the like, the multiplexer 103 selects a phase close to the reference clock signal FREF out of the four-phase clock signals (CKV0, CKV90, CKV180, and CKV270) generated by the frequency divider 102, such that it is possible to configure an ADPLL circuit using the time-to-digital converter 104 having a detection range of one quarter of one period of the clock signal CKV to be measured (a narrower detection range), whereby the circuit area and power consumption can be reduced.

In addition, in the time-to-digital converters 104 in the phase locked loops of the fifth to eighth embodiments, the delay line constituted by the plurality of delay elements 121 can be shortened, such that degradation of integral nonlinearity (INL) of the time-to-digital converter 104 can be restrained. Furthermore, in addition to these advantages, in the phase locked loops of the fifth to eighth embodiments, the period measurement is performed together with the phase detection such that the fractional phase can be found by above formula (2), whereby the possibility of including an error like the "fixed value" in above formula (1) is eliminated and a more accurate fractional phase can be found. In other words, in the phase locked loops of the fifth to eighth embodiments, it is possible to solve all the disadvantages in the case of adopting the conventional technology (periodic normalization).

<9. Modifications>

Although the above explanation has described the four-phase clock signals (CKV0, CKV90, CKV180, and CKV270) and the six-phase clock signals (CKV0, CKV60, CKV120, CKV180, CKV240, and CKV300) as the clock signals input to the multiplexer 103, the four phases and six phases are examples of the number of phases of the clock signals and clock signals with another number of phases may be used as long as the clock signals have multiple phases. In these examples, as the clock signals input to the multiplexer 103 have a larger number of phases, the delay line constituted by the plurality of delay elements 121 can be shortened and the circuit area and power consumption can be reduced in the time-to-digital converter 104.

In addition, the above explanation has described a case where the selected clock signal CKV_ROT is directly input to the time-to-digital converter 104. Alternatively, another signal synchronized with the selected clock signal CKV_ROT may be generated by the retiming circuit 105 to be input to the time-to-digital converter 104. By adopting such a configuration, it is possible to diminish the toggling of signals passing through the delay line constituted by the delay elements 121-1 to 121-5 in the time-to-digital converter 104, such that lower power consumption can be realized in the time-to-digital converter 104.

Note that the embodiments according to the present technology are not limited to the aforementioned embodiments and various modifications can be made without departing from the scope of the present technology. For example, the above explanation has described a case where any of the fifth to eighth embodiments is applied to the first embodiment, but the fifth to eighth embodiments may be applied to any of the second to fourth embodiments.

Note that the present technology can be also configured as described below.

(1)

A phase locked loop including:

a digitally controlled oscillation unit that controls an oscillation frequency by a control signal in a digital format;

a multiphase clock generation unit that generates clock signals with multiple phases synchronized with the digitally controlled oscillation unit;

a clock selection unit that selects any one clock signal out of the clock signals with multiple phases as a selected clock signal;

a time-to-digital conversion unit that detects a time difference between the selected clock signal and a reference clock signal which is a clock signal serving as a reference;

a counter unit driven by any one clock signal out of the clock signals with multiple phases;

a reference phase generation unit that generates a reference phase;

a phase comparison unit that compares feedback phase information obtained from an output value of the counter unit and an output value of the time-to-digital conversion unit with the reference phase; and a digital loop filter unit that smoothes output of the phase comparison unit and generates the control signal for the digitally controlled oscillation unit.

(2)

The phase locked loop according to (1), in which the multiphase clock generation unit is constituted by a frequency divider.

(3)

The phase locked loop according to (2), in which an oscillation period of the digitally controlled oscillation unit is longer than a value obtained by dividing a range of detection of time by the time-to-digital conversion unit by a frequency division ratio of the frequency divider.

(4)

The phase locked loop according to (1), in which the digitally controlled oscillation unit is capable of generating the clock signals with multiple phases and also serves as the multiphase clock generation unit.

(5)

The phase locked loop according to (4), in which an oscillation period of the digitally controlled oscillation unit is longer than a range of detection of time by the time-to-digital conversion unit.

(6)

The phase locked loop according to any one of (1) to (5), in which the time-to-digital conversion unit has a finer resolution than a propagation delay of a logic gate.

(7)

The phase locked loop according to any one of (1) to (6), further including an offset adjustment unit that monitors an output code of the time-to-digital conversion unit and adds a correction value at any point within a loop such that a time difference between the selected clock signal and the reference clock signal falls inside a range of detection of the time-to-digital conversion unit.

(8)

The phase locked loop according to (7), in which the offset adjustment unit adds the correction value to output of the phase comparison unit.

(9)

The phase locked loop according to (7), in which the offset adjustment unit adds the correction value to the reference phase when generating a control signal for the clock selection unit.

(10)

The phase locked loop according to any one of (1) to (9), in which the time-to-digital conversion unit measures a time difference between any two clock signals out of the clock signals with multiple phases, and an output value of the time-to-digital conversion unit becomes a value obtained according to a measurement result for the measured time difference.

(11)

The phase locked loop according to any one of (1) to (9), further including a second time-to-digital conversion unit that measures a time difference between any two clock signals out of the clock signals with multiple phases, in which an output value of the time-to-digital conversion unit becomes a value obtained according to a measurement result for the time difference measured by the second time-to-digital conversion unit.

(12)

The phase locked loop according to (10) or (11), in which the time-to-digital conversion unit or the second time-to-digital conversion unit repeatedly measures a time difference between the two clock signals a plurality of times according to a combination of the clock signals with multiple phases, and an output value of the time-to-digital conversion unit becomes a value obtained according to measurement results for a plurality of time differences.

(13)

The phase locked loop according to (12), in which by performing an arithmetic operation on measurement results for a plurality of time differences obtained by a plurality of times of time difference measurement, a longer time difference is obtained than a time difference indicated by a measurement result for a time difference obtained by a single time of time difference measurement.

(14)

The phase locked loop according to any one of (1) to (13), in which the time-to-digital conversion unit measures a time difference between the two clock signals at a time different from a time in which a time difference between the selected clock signal and the reference clock signal is detected.

(15)

A control method for a phase locked loop including a digitally controlled oscillation unit, a multiphase clock generation unit, a clock selection unit, a time-to-digital conversion unit, a counter unit, a reference phase generation unit, a phase comparison unit, and a digital loop filter unit, the control method including:

a step of controlling, by the digitally controlled oscillation unit, an oscillation frequency by a control signal in a digital format;

a step of generating, by the multiphase clock generation unit, clock signals with multiple phases synchronized with the digitally controlled oscillation unit;

a step of selecting, by the clock selection unit, any one clock signal out of the clock signals with multiple phases as a selected clock signal;

detecting, by the time-to-digital conversion unit, a time difference between the selected clock signal and a reference clock signal which is a clock signal serving as a reference;

a step of driving the counter unit by any one clock signal out of the clock signals with multiple phases;

a step of generating, by the reference phase generation unit, a reference phase;

a step of comparing, by the phase comparison unit, feedback phase information obtained from an output value of the counter unit and an output value of the time-to-digital conversion unit with the reference phase; and a step of smoothing, by the digital loop filter unit, output of the phase comparison unit and generating the control signal for the digitally controlled oscillation unit.

REFERENCE SIGNS LIST 10, 20, 30, 40, 50 Phase locked loop
101 Digitally controlled oscillator (DCO)
102 Frequency divider
103 Multiplexer
104, 104-1, 104-2 Time-to-digital converter (TDC)
105 Retiming circuit
106 Counter
107 Reference phase generation unit
108 Phase comparator
109 Digital loop filter
121 Delay element
122 Flip-flop
123 Decoder
141 Coarse TDC
142 Remainder generation unit
143 Fine TDC
144 Coarse-Fine connection processing unit
145 Time amplifier
201 Digitally controlled oscillator
221 Differential amplifier
222 Oscillation ring
301 Offset adjustment unit
302 Adder
401 Offset adjustment unit
407 Reference phase generation unit
421 Adder
422 Flip-flop
423 Adder
424 Control signal generation unit
501, 601, 701, 801 Phase detection/period measurement unit 521 Retiming circuit
522, 522-1, 522-2 Multiplexer
523 Decoder
524 Demultiplexer
525 Average value arithmetic unit

The invention claimed is:

1. A phase locked loop, comprising:
a digitally controlled oscillation unit configured to control an oscillation frequency by a control signal in a digital format;
a multiphase clock generation unit configured to generate clock signals with multiple phases synchronized with the digitally controlled oscillation unit;
a clock selection unit configured to select any one clock signal out of the clock signals with multiple phases as a selected clock signal;
a time-to-digital conversion unit configured to detect a time difference between the selected clock signal and a reference clock signal which serves as a reference;
a counter unit configured to be driven by any one clock signal out of the clock signals with multiple phases;
a reference phase generation unit configured to generate a reference phase;
a phase comparison unit configured to compare feedback phase information obtained from an output value of the counter unit and an output value of the time-to-digital conversion unit with the reference phase; and
a digital loop filter unit configured to:
smooth output of the phase comparison unit; and
generate the control signal for the digitally controlled oscillation unit.

2. The phase locked loop according to claim 1, wherein the multiphase clock generation unit is constituted by a frequency divider.

3. The phase locked loop according to claim 2, wherein an oscillation period of the digitally controlled oscillation unit is longer than a value obtained based on a division of a range of detection of time by a frequency division ratio of the frequency divider.

4. The phase locked loop according to claim 1, wherein the time-to-digital conversion unit has a finer resolution than a propagation delay of a logic gate.

5. The phase locked loop according to claim 1, further comprising an offset adjustment unit configured to:
monitor an output code of the time-to-digital conversion unit; and
add a correction value at any point within a loop such that the time difference between the selected clock signal and the reference clock signal falls inside a range of detection of the time-to-digital conversion unit.

6. The phase locked loop according to claim 5, wherein the offset adjustment unit is further configured to add the correction value to output of the phase comparison unit.

7. The phase locked loop according to claim 5, wherein the offset adjustment unit is further configured to add the correction value to the reference phase when the control signal for the clock selection unit is generated.

8. The phase locked loop according to claim 1, wherein the time-to-digital conversion unit is further configured to measure a time difference between any two clock signals out of the clock signals with multiple phases, and the output value of the time-to-digital conversion unit becomes a value obtained based on a measurement result for the measured time difference between any two clock signals out of the clock signals with multiple phases.

9. The phase locked loop according to claim 1, further comprising a second time-to-digital conversion unit configured to measure a time difference between any two clock signals out of the clock signals with multiple phases,
wherein the output value of the time-to-digital conversion unit becomes a value obtained based on a measurement result for the time difference between any two clock signals out of the clock signals with multiple phases measured by the second time-to-digital conversion unit.

10. The phase locked loop according to claim 8, wherein the time-to-digital conversion unit is further configured to measure a time difference between the two clock signals a plurality of times based on a combination of the clock signals with multiple phases, and
the output value of the time-to-digital conversion unit becomes a value obtained based on measurement results for a plurality of time differences.

11. The phase locked loop according to claim 10, wherein based on an arithmetic operation on the measurement results for the plurality of time differences obtained by a plurality of times of time difference measurement, a longer time difference is obtained than a time difference indicated by a measurement result for a time difference obtained by a single time of time difference measurement.

12. The phase locked loop according to claim 8, wherein the time-to-digital conversion unit is further configured to measure the time difference between the two clock signals at a time different from a time in which the time difference between the selected clock signal and the reference clock signal is detected.

13. A control method for a phase locked loop, the control method comprising:
controlling, by a digitally controlled oscillation unit, an oscillation frequency by a control signal in a digital format;
generating, by a multiphase clock generation unit, clock signals with multiple phases synchronized with the digitally controlled oscillation unit;
selecting, by a clock selection unit, any one clock signal out of the clock signals with multiple phases as a selected clock signal;
detecting, by a time-to-digital conversion unit, a time difference between the selected clock signal and a reference clock signal that serves as a reference;
driving a counter unit by any one clock signal out of the clock signals with multiple phases;
generating, by a reference phase generation unit, a reference phase;
comparing, by a phase comparison unit, feedback phase information obtained from an output value of the counter unit and an output value of the time-to-digital conversion unit with the reference phase;
smoothing, by a digital loop filter unit, output of the phase comparison unit; and
generating, by the digital loop filter unit, the control signal for the digitally controlled oscillation unit.

* * * * *